US011903206B2

(12) United States Patent
Ahn et al.

(10) Patent No.: US 11,903,206 B2
(45) Date of Patent: Feb. 13, 2024

(54) THREE-DIMENSIONAL SEMICONDUCTOR DEVICE

(71) Applicant: SAMSUNG ELECTRONICS CO., LTD., Suwon-si (KR)

(72) Inventors: Jong Seon Ahn, Seongnam-si (KR); Ji Sung Cheon, Ansan-si (KR); Young Jin Kwon, Suwon-si (KR); Seok Cheon Baek, Hwaseong-si (KR); Woong Seop Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 4 days.

(21) Appl. No.: 17/747,174

(22) Filed: May 18, 2022

(65) Prior Publication Data

US 2022/0278125 A1 Sep. 1, 2022

Related U.S. Application Data

(63) Continuation of application No. 16/257,357, filed on Jan. 25, 2019, now Pat. No. 11,342,351, which is a (Continued)

(30) Foreign Application Priority Data

Jan. 10, 2018 (KR) .................. 10-2018-0003256
Dec. 18, 2018 (KR) .................. 10-2018-0164356

(51) Int. Cl.
*H01L 29/66* (2006.01)
*H10B 43/27* (2023.01)
(Continued)

(52) U.S. Cl.
CPC ........ *H10B 43/27* (2023.02); *H01L 29/40117* (2019.08); *H01L 29/4234* (2013.01);
(Continued)

(58) Field of Classification Search
None
See application file for complete search history.

(56) References Cited

U.S. PATENT DOCUMENTS 8,338,882 B2 12/2012 Tanaka et al.
8,652,921 B2 2/2014 Lee et al.
(Continued)

FOREIGN PATENT DOCUMENTS

CN 106571369 A 8/2021
CN 106952926 A 2/2022

OTHER PUBLICATIONS

Office Action dated Dec. 1, 2023 by the China Intellectual Property Office for corresponding Chinese Patent Application CN 201811632198. X.

*Primary Examiner* — Joseph C. Nicely
*Assistant Examiner* — Lamont B Koo
(74) *Attorney, Agent, or Firm* — Muir Patent Law, PLLC

(57) ABSTRACT

A three-dimensional semiconductor device includes an upper substrate, a gate-stacked structure on the upper substrate, the gate-stacked structure including gate electrodes stacked within a memory cell array region, while being spaced apart from each other in a direction perpendicular to a surface of the upper substrate, and extending into an extension region adjacent to the memory cell array region to be arranged within the extension region to have a staircase shape, and at least one through region passing through the gate-stacked structure within the memory cell array region or the extension region, the at least one through region including a lower region and an upper region wider than the lower region.

20 Claims, 47 Drawing Sheets

Related U.S. Application Data continuation-in-part of application No. 16/121,911, filed on Sep. 5, 2018, now abandoned.

(51) Int. Cl.
    *H01L 21/28*     (2006.01)
    *H01L 29/423*     (2006.01)
    *H10B 43/10*     (2023.01)
    *H10B 43/35*     (2023.01)
    *H10B 43/40*     (2023.01)

(52) U.S. Cl.
    CPC ............. *H10B 43/10* (2023.02); *H10B 43/35* (2023.02); *H10B 43/40* (2023.02)

(56) References Cited

U.S. PATENT DOCUMENTS

| | | |
|---|---|---|
| 9,368,216 B2 | 6/2016 | Tanzawa |
| 9,659,950 B2 | 5/2017 | Yip et al. |
| 9,698,152 B2 | 7/2017 | Peri et al. |
| 9,698,223 B2 | 7/2017 | Sharangpani et al. |
| 2011/0121403 A1 | 5/2011 | Lee et al. |
| 2012/0068255 A1 | 3/2012 | Lee et al. |
| 2016/0163686 A1 | 6/2016 | Lee et al. |
| 2016/0163732 A1 | 6/2016 | Lim et al. |
| 2016/0163386 A1 | 8/2016 | Hwang et al. |
| 2017/0103994 A1 | 4/2017 | Fukuzumi et al. |
| 2017/0133398 A1 | 5/2017 | Son et al. |
| 2017/0179026 A1 | 6/2017 | Toyama et al. |
| 2017/0179027 A1 | 6/2017 | Kim et al. |
| 2017/0338238 A1 | 11/2017 | Zhang |

THREE-DIMENSIONAL SEMICONDUCTOR DEVICE

CROSS-REFERENCE TO RELATED APPLICATION

This application is a continuation of U.S. patent application Ser. No. 16/257,357 filed Jan. 25, 2019, which is a continuation-in-part of U.S. patent application Ser. No. 16/121,911, filed Sep. 5, 2018, abandoned, the entire contents of each of which are hereby incorporated by reference.

Korean Patent Applications No. 10-2018-0003256, filed on Jan. 10, 2018 and No. 10-2018-0164356, filed on Dec. 18, 2018, in the Korean Intellectual Property Office, and entitled: "Three-Dimensional Semiconductor Device," is incorporated by reference herein in its entirety.

BACKGROUND

1. Field

The present disclosure relates to a semiconductor device, and more particularly, to a three-dimensional semiconductor device including a through region passing through a gate-stacked structure.

2. Description of the Related Art

Semiconductor devices, having gate electrodes stacked in a direction perpendicular to the surface of a semiconductor substrate, have been developed. To implement a high degree of integration in semiconductor devices, the number of the stacked gate electrodes has been increased. However, as the number of the stacked gate electrodes gradually increases, the level of difficulty to electrically connect such gate electrodes to a peripheral circuit increase, thereby causing defects.

SUMMARY

According to an aspect of embodiments, a three-dimensional semiconductor device may include an upper substrate, a gate-stacked structure on the upper substrate, the gate-stacked structure including gate electrodes stacked within a memory cell array region, while being spaced apart from each other in a direction perpendicular to a surface of the upper substrate, and extending into an extension region adjacent to the memory cell array region to be arranged within the extension region to have a staircase shape, and at least one through region passing through the gate-stacked structure within the memory cell array region or the extension region, the at least one through region including a lower region and an upper region wider than the lower region.

According to an aspect of embodiments, a three-dimensional semiconductor device may include a lower substrate, a lower structure disposed on the lower substrate, and including a peripheral circuit, an upper substrate disposed on the lower structure, a gap-fill layer disposed within a substrate hole within the upper substrate, a gate-stacked structure disposed on the upper substrate, and including gate electrodes, and a through region passing through the gate-stacked structure, in which the through region has a side including a stepped portion.

According to an aspect of embodiments, a three-dimensional semiconductor device may include a memory cell array region, extension regions disposed on both sides of the memory cell array region, main separation structures traversing the memory cell array region and the extension regions, a gate-stacked structure disposed within the memory cell array region, and extending into the extension regions, vertical channel structures disposed between the main separation structures, and passing through the gate-stacked structure within the memory cell array region, and at least one through region disposed within the memory cell array region or the extension regions, and passing through the gate-stacked structure, in which the at least one through region has a side including at least one step portion.

BRIEF DESCRIPTION OF THE DRAWINGS

Features will become apparent to those of skill in the art by describing in detail exemplary embodiments with reference to the attached drawings, in which.

DETAILED DESCRIPTION

An example of a three-dimensional semiconductor device, according to an example embodiment, will be described with reference to FIG. 1.

Figure 1:
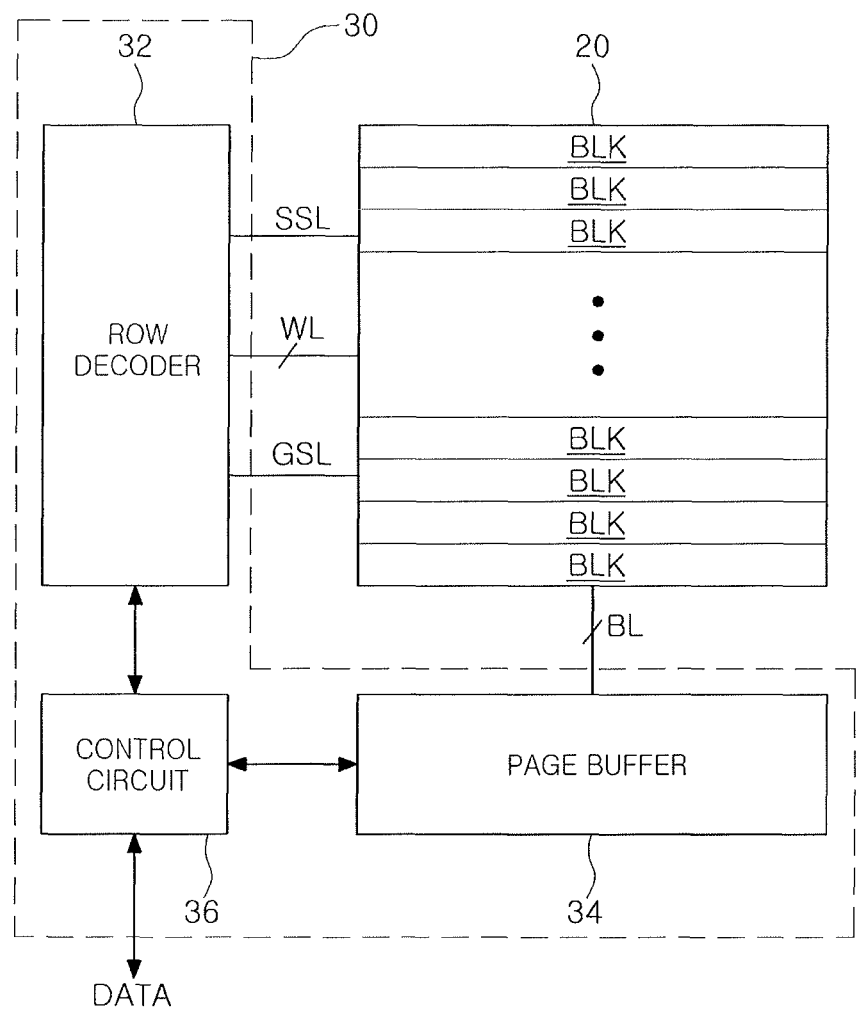
FIG. 1 illustrates a schematic block diagram of a semiconductor device, according to an example embodiment.

FIG. 1 is a schematic block diagram of a semiconductor device, according to an example embodiment.

Referring to FIG. 1, a semiconductor device 10, according to an example embodiment, may include a memory cell array region 20 and a control logic region 30. The memory cell array region 20 may include a plurality of memory blocks BLK, and each of the memory blocks BLK may include a plurality of memory cells. The control logic region 30 may include a row decoder 32, a page buffer 34, and a control circuit 36.

The memory cells of each memory block BLK may be connected to the row decoder 32 via a string select line SSL, a plurality of word lines WL, and a ground select line GSL, and may be connected to the page buffer 34 via a plurality of bit lines BL. In example embodiments, a plurality of memory cells arranged on the same row may be connected to a common word line WL, and a plurality of memory cells arranged in the same column may be connected to an identical common bit line BL.

The row decoder 32 may decode an input address to generate and transmit driving signals for the word lines WL. The row decoder 32 may provide a word line voltage, generated by a voltage generating circuit of the control circuit 36, to a selected word line WL and unselected word lines WL of the word lines WL, in response to controlling by the control circuit 36.

The page buffer 34 may be connected to the memory cell array region 20 via the bit lines BL to read information stored in the memory cells. The page buffer 34 may temporarily store data to be stored in the memory cells, or may sense data stored in the memory cells, according to an operating mode.

The page buffer 34 may include a column decoder and a sense amplifier. The column decoder may selectively activate the bit lines BL of the memory cell array region 20, and the sense amplifier may sense a voltage of a bit line BL selected by the column decoder during a reading operation to read data stored in a selected memory cell.

The control circuit 36 may control operations of the row decoder 32 and the page buffer 34. The control circuit 36 may receive an external control signal and an external voltage, and may operate in response to the received control signal.

The control circuit 36 may include the voltage generating circuit that may generate voltages required for internal operations, e.g., a programming voltage, a reading voltage, an erasing voltage, and the like, using the external voltage. The control circuit 36 may control reading, writing, and/or erasing operations, in response to the control signals.

Further, the control circuit 36 may include an input/output (I/O) circuit. The I/O circuit may receive data DATA and transmit DATA to the page buffer 34 in a program operation, and may externally output DATA received from the page buffer 34 in a reading operation.

Figure 2:
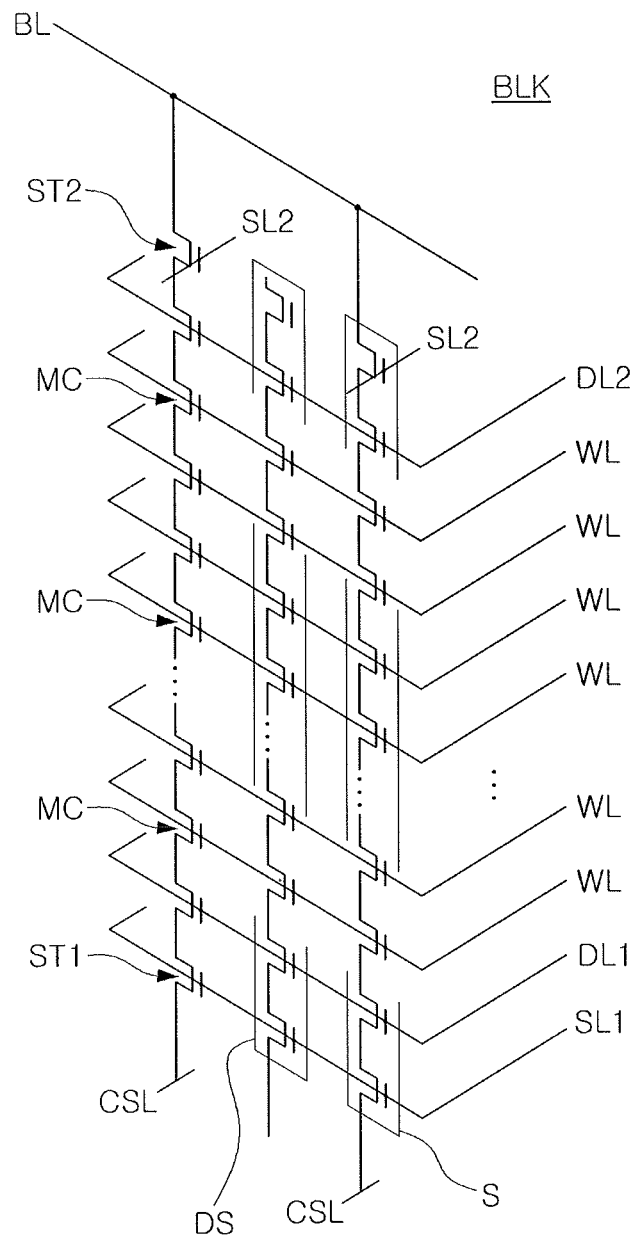
FIG. 2 illustrates a schematic circuit diagram of an example of a memory cell array region of a semiconductor device, according to an example embodiment.

An example of a circuit of each memory block BLK of the memory cell array region 20 (FIG. 1), included in the three-dimensional semiconductor device 10 (FIG. 1) according to an example embodiment described above with reference to FIG. 1, will be described with reference to FIG. 2. FIG. 2 is an example of a circuit diagram in the memory block BLK of the memory cell array region 20.

Referring to FIG. 2, each memory block BLK of the memory cell array region 20 (FIG. 1) may include memory cells MCs connected to each other in series, and a first select transistor ST1 and a second select transistor ST2 connected to both ends of the memory cells MC in series. The first and second select transistors ST1 and ST2, and the memory cells MC between the first and second select transistors ST1 and ST2 may constitute memory strings S.

The memory cells MC connected to each other in series may be respectively connected to word lines WL for selecting the memory cells MC. A gate terminal of the first select transistor ST1 may be connected to a first select line SL1, and a source terminal of the first select transistor ST1 may be connected to a common source line CSL. A gate terminal of the second select transistor ST2 may be connected to a second select line SL2, and a source terminal of the second select transistor ST2 may be connected to a drain terminal of the memory cells MC. In an example, the first select transistor ST1 may be a ground select transistor, and the second select transistor ST2 may be a string select transistor. In an example, the first select line SL1 may be the ground select line GSL of FIG. 1, and the second select line SL2 may be the string select line SSL of FIG. 1.

FIG. 2 illustrates a structure in which a single first select transistor ST1 and a single second select transistor ST2 are connected to the memory cells MC connected to each other in series. In a different manner, a plurality of first select transistors ST1 or a plurality of second select transistors ST2 may also be connected to the memory cells MC.

In an example, a first dummy line DL1 may be disposed between a lowermost word line WL of the word lines WL and the first select line SL1, and a second dummy line DL2 may be disposed between an uppermost word line WL of the word lines WL and the second select line SL2. The first dummy line DL1 may be provided as a single or a plurality of first dummy lines DL1, and the second dummy line DL2 may be provided as a single or a plurality of second dummy lines DL2.

A drain terminal of the second select transistor ST2 may be connected to a bit line BL. When a signal is applied to the gate terminal of the second select transistor ST2 through the second select line SL2, a signal applied through the bit line BL may be transmitted to the memory cells MC connected to each other in series, and a data reading or writing operation may thus be performed. Further, a data erasing operation of erasing data stored in the memory cells MC may be performed by applying a data erasing voltage having a certain level to the memory cells MC through a substrate.

The semiconductor device 10, according to an example embodiment, may include at least one dummy string DS. The at least one dummy string DS may include a string having a dummy channel electrically isolated from the bit line BL.

Figure 3A:
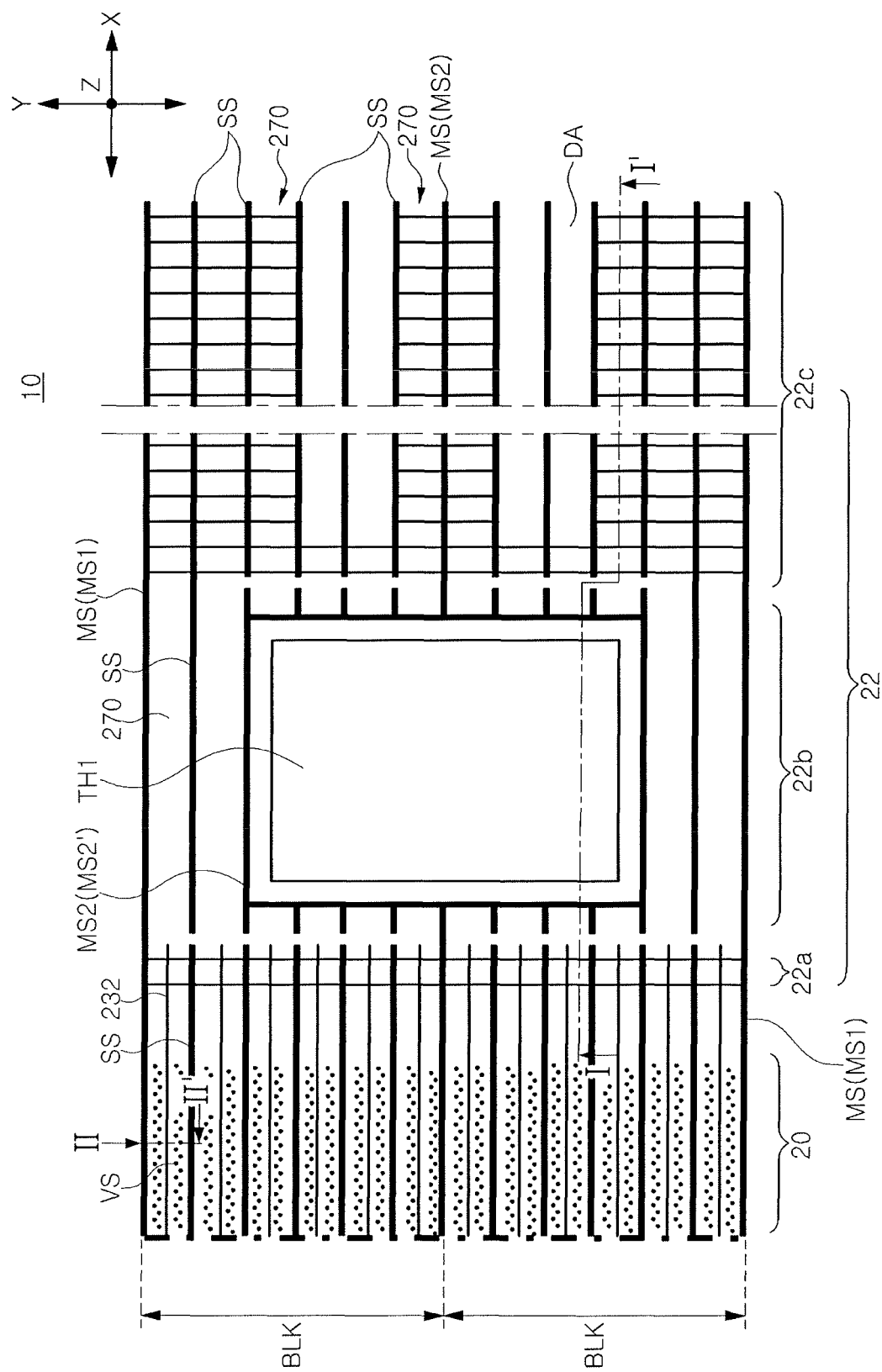
FIG. 3A illustrates a schematic plan view of an example of a three-dimensional semiconductor device, according to an example embodiment.
Figure 3B:
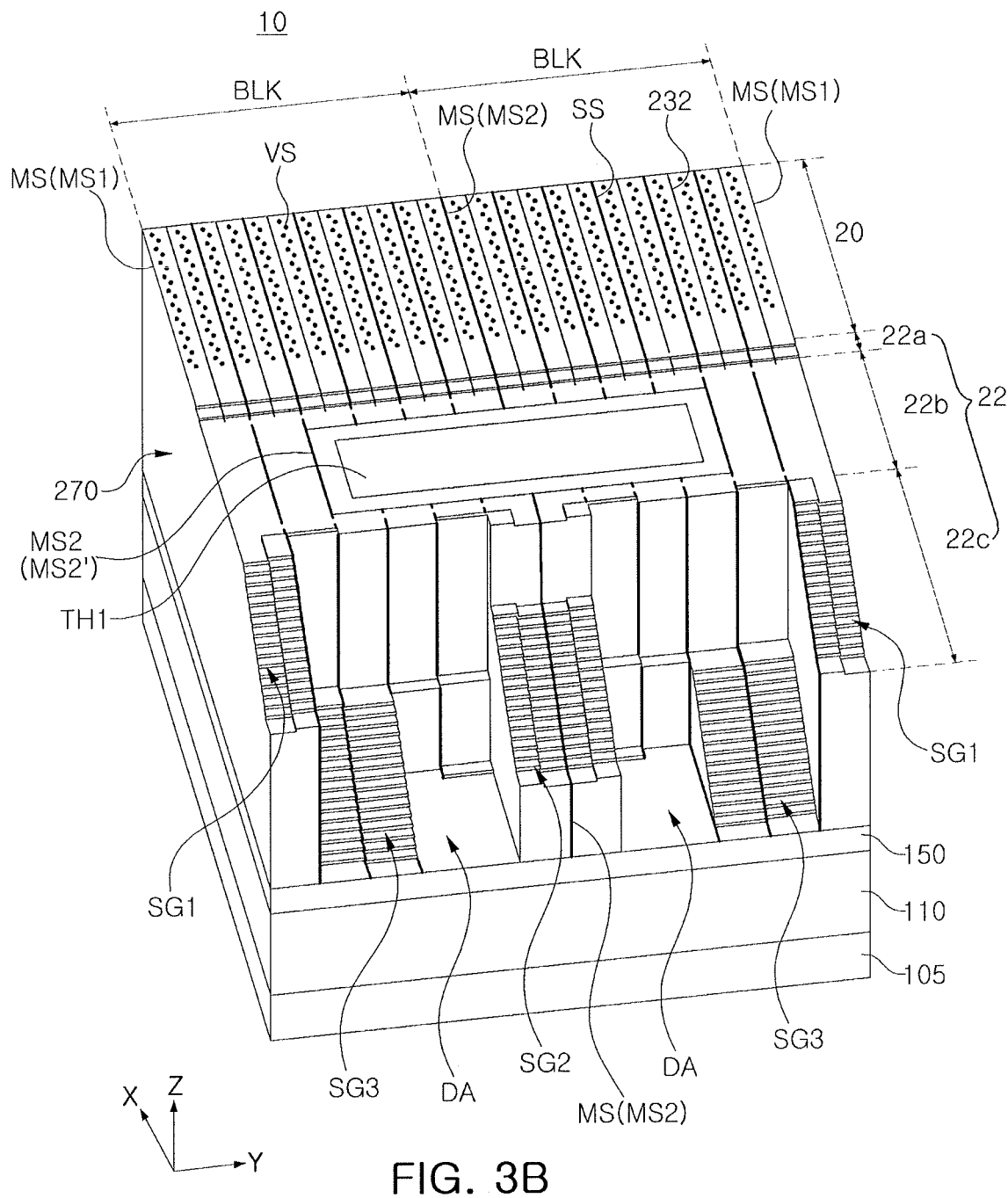
FIG. 3B illustrates a schematic perspective view of the example of the three-dimensional semiconductor device of FIG. 3A.
Figure 4:
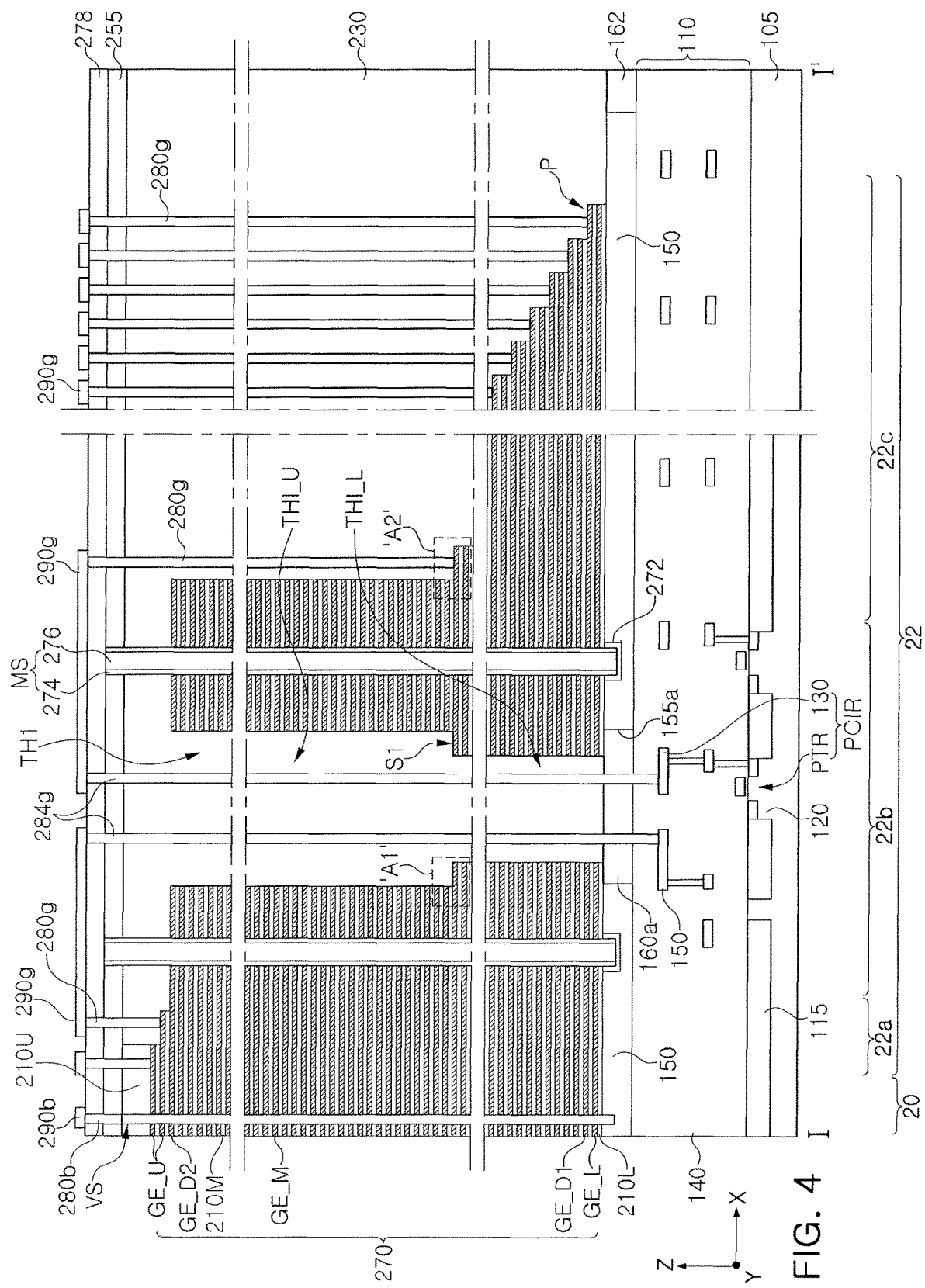
FIGS. 4 and 5 illustrate schematic cross-sectional views of an example of the three-dimensional semiconductor device of FIG. 3A.
Figure 5:
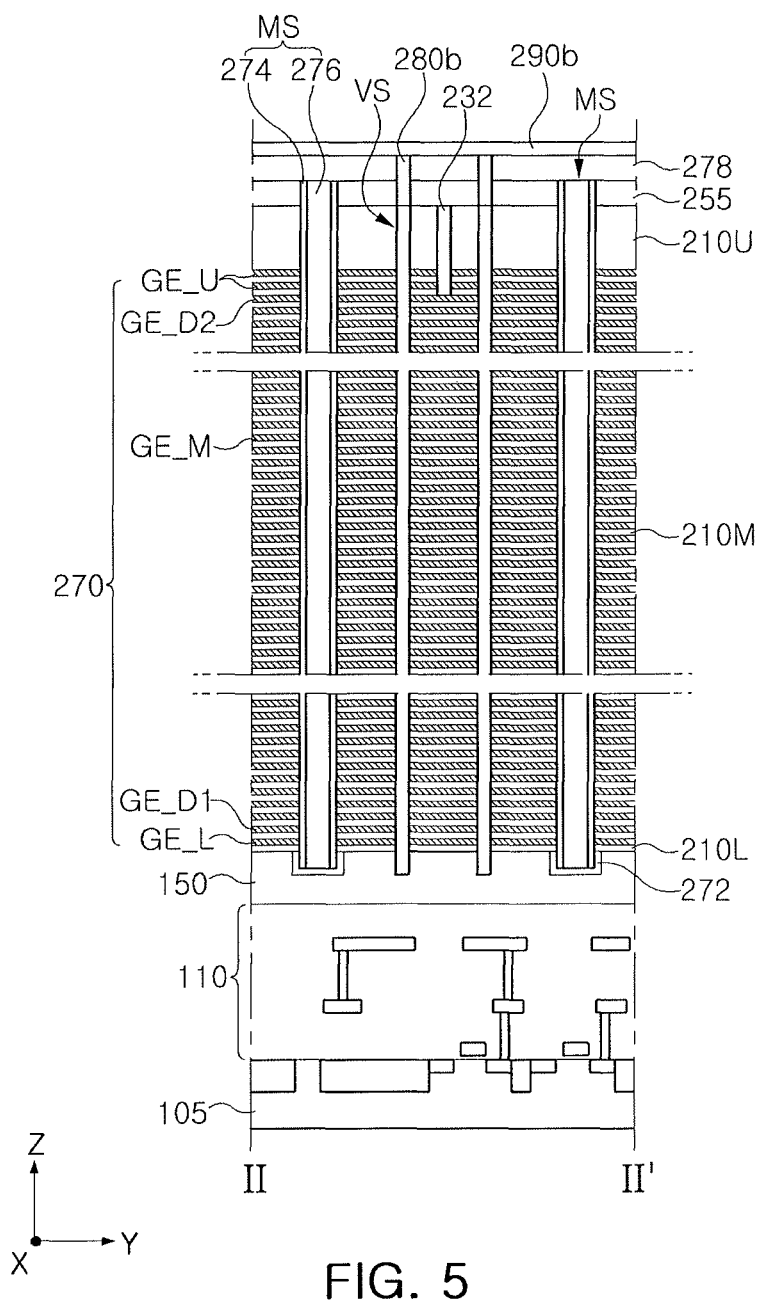

FIG. 3A is a plan view schematically illustrating an example of the three-dimensional semiconductor device 10 according to an example embodiment. FIG. 3B is a perspective view schematically illustrating an example of the three-dimensional semiconductor device 10a according to an example embodiment. FIG. 4 is a cross-sectional view taken along line I-I' of FIG. 3A, and FIG. 5 is a cross-sectional view taken along line II-II' of FIG. 3A.

Referring to FIGS. 3A, 3B, 4, and 5, the three-dimensional semiconductor device 10 may include a lower substrate 105, a lower structure 110 disposed on the lower substrate 105, an upper substrate 150 disposed on the lower structure 110, and a gate-stacked structure 270 disposed on the upper substrate 150. The lower substrate 105 may be a semiconductor substrate formed of a semiconductor material, e.g., single crystalline silicon or the like, and the upper substrate 150 may be a semiconductor substrate formed of a semiconductor material, e.g., polycrystalline silicon or the like.

The lower structure 110 may include a peripheral circuit PCIR disposed within an active region 120 defined by an isolation region 115, and a lower insulating layer 140 covering the peripheral circuit PCIR. The peripheral circuit PCIR may include a peripheral transistor PTR, and peripheral wirings 130 electrically connected to the peripheral transistor PTR. The lower insulating layer 140 may be formed of a silicon oxide.

The three-dimensional semiconductor device 10 may include a first gap-fill layer 160a disposed within a first substrate hole 155a passing through the upper substrate 150, and an intermediate insulating layer 162 disposed on a lateral surface of the upper substrate 150. The first gap-fill layer 160a and the intermediate insulating layer 162 may be formed of the same insulating material, e.g., a silicon oxide.

The gate-stacked structure 270 may include gate electrodes stacked while being spaced apart from each other in a direction perpendicular to a surface of the upper substrate 150, e.g., along the Z direction. The gate electrodes of the gate-stacked structure 270 may be formed of a conductive material including at least one of doped silicon, a metal nitride (e.g., TiN), a metal silicide (e.g., WSi, TiSi, TaSi, or the like), or a metal (e.g., W). The doped silicon may be polysilicon including n-type impurities (e.g., P, As, or the like), or p-type impurities (e.g., B or the like).

The three-dimensional semiconductor device 10 may include a lower interlayer insulating layer 210L disposed between a lowermost gate electrode of the gate-stacked structure 270 and the upper substrate 150, an upper interlayer insulating layer 210U disposed on an uppermost gate electrode of the gate-stacked structure 270, and intermediate interlayer insulating layers 210M disposed between the gate electrodes of the gate-stacked structure 270. The gate electrodes of the gate-stacked structure 270 may be stacked within the memory cell array region 20 on the upper substrate 150, while being spaced apart from each other, and may extend into an extension region 22 on the upper substrate 150 to have pad regions P within the extension region 22.

Among the gate electrodes of the gate-stacked structure 270, each of the gate electrodes positioned below the uppermost gate electrode may include an overlap region, i.e., a region in which the gate electrode overlaps a gate electrode immediately thereabove, and a non-overlap region, i.e., a region in which the gate electrode does not overlap the gate electrode immediately thereabove. The non-overlap regions may be the pad regions P, e.g., as each of the gate electrodes positioned below the uppermost gate electrode has an exposed surface in the non-overlap region.

The memory cell array region 20 may be a region in which the memory blocks BLK, including the memory cells MC of FIG. 2, as described above with reference to FIGS. 1 and 2, may be formed, and the extension region 22 may be a region in which the pad regions P, formed by extension of the gate electrodes of the gate-stacked structure 270 formed within the memory cell array region 20, may be disposed. Here, the pad regions P may be regions of gate electrodes that may contact gate contact plugs 280g electrically connected to the row decoder 32 of FIG. 1, e.g., the gate contact plugs 280g may extend vertically from the pad regions P toward the top of the gate-stacked structure 270.

In example embodiments, in the plan view, a direction from the memory cell array region 20 to the extension region 22 may be referred to as a first direction X, a direction perpendicular to the first direction X may be referred to as a second direction Y, and in the cross-sectional view, a direction perpendicular to the surface of the upper substrate 150 may be referred to as a third direction Z.

In an example embodiment, the gate electrodes of the gate-stacked structure 270 may include a lower gate electrode GE_L, intermediate gate electrodes GE_M disposed, e.g., stacked, on the lower gate electrode GE_L, and upper gate electrodes GE_U disposed, e.g., stacked, on the intermediate gate electrodes GE_M. In an example embodiment, the gate electrodes of the gate-stacked structure 270 may include a dummy gate electrode GE_D1 between the lower gate electrode GE_L and the intermediate gate electrodes GE_M, and a buffer gate electrode GE_D2 between the intermediate gate electrodes GE_M and the upper gate electrodes GE_U. Here, the buffer gate electrode GE_D2 may also be referred to as a dummy gate electrode.

In an example embodiment, the lower gate electrode GE_L may be the first select line SL1 of FIG. 2 described above and/or the ground select line GSL of FIG. 1 described above. The dummy gate electrode GE_D1 may be the first dummy line DL1 described above in FIG. 2, the intermediate gate electrodes GE_M may be the word lines WL of FIGS. 1 and 2 described above, the buffer gate electrode GE_D2 may be the second dummy line DL2 of FIG. 2 described above, and the upper gate electrodes GE_U may be the second select line SL2 of FIG. 2 described above and the string select line SSL of FIG. 1 described above.

The extension region 22 may include a first step region 22a, a second step region 22c, and a buffer region 22b between the first and second step regions 22a and 22c. The first step region 22a may be a region in which pad regions P of the upper gate electrodes GE_U may be disposed in a staircase shape, and the second step region 22c may be a region in which pad regions P of the intermediate gate electrodes GE_M, pad regions P of the dummy gate electrode GE_D1, and a pad region P of the lower gate electrode GE_L may be disposed in a staircase shape.

The three-dimensional semiconductor device 10 may include a first pad through region TH1 passing through the gate-stacked structure 270. The first pad through region TH1 may overlap the first gap-fill layer 160a, e.g., a bottom of the first pad through region TH1 may be centered on the top of the first gap-fill layer 160a. In an example embodiment, the first pad through region TH1 may pass through gate electrodes of the gate-stacked structure 270 within the buffer region 22b between the first and second step regions 22a and 22c, and may pass through the intermediate interlayer insulating layers 210M between the gate electrodes, e.g., the first pad through region TH1 is the white portion penetrating through the gate-stacked structure 270 in FIG. 4. Further, the first pad through region TH1 may pass through the lower interlayer insulating layer 210L.

In an example embodiment, the first pad through region TH1 may include a lower through region TH1_L, and an upper through region TH1_U on the lower through region TH1_L. The upper through region TH1_U may have a width wider than the lower through region TH1_L along the X direction. For example, lateral surfaces of the upper through region TH1_U may not be vertically aligned with those of the lower through region TH1_L, e.g., the lower through region TH1_L may be centered with respect to the upper through region TH1_U. In an example embodiment, a length of the upper through region TH1_U in a vertical direction thereof, e.g., along the Z direction, may be greater than that of the lower through region TH1_L in a vertical direction thereof, e.g., along the Z direction.

In an example embodiment, the first pad through region TH1 may have sides including a stepped portion S1. The stepped portion S1 may be closer to a lower surface of the gate-stacked structure 270 than to an upper surface of the gate-stacked structure 270, e.g., along the Z direction. The stepped portion S1 will be described in more detail below with reference to FIG. 8A.

The three-dimensional semiconductor device 10 may include an upper insulating layer 230 covering a portion of the gate-stacked structure 270. The upper insulating layer 230 may cover a portion of the gate electrodes of the gate-stacked structure 270 positioned below the uppermost gate electrode GE_U and within the extension region 22. Thus, the upper insulating layer 230 may be disposed within the extension region 22.

In an example embodiment, the upper insulating layer 230 may cover an upper portion of the first pad through region TH1, and may be integrally formed with the first pad through region TH1. The first pad through region TH1 and the upper insulating layer 230 may be formed of, e.g., a silicon oxide.

The three-dimensional semiconductor device 10 may include vertical channel structures VS passing through the upper interlayer insulating layer 210U, the intermediate interlayer insulating layers 210M, and the lower interlayer insulating layer 210L while passing through the gate-stacked structure 270. The vertical channel structures VS may connect to the upper substrate 150. The vertical channel structures VS may be disposed within the memory cell array region 20.

In the gate-stacked structure 270, the pad regions P disposed within the second step region 22c may be disposed in a staircase shape, as illustrated in FIG. 3B. Here, the staircase shape of the second step region 22c, defined by a pair of first main separation structures MS1 (adjacent to each other along the Y direction) and a second main separation structure MS2 disposed between the pair of first main separation structures MS1, will be described with reference to FIG. 3B. Such a staircase shape may be a staircase shape of a pair of memory blocks BLK adjacent to each other.

Referring to FIG. 3B, the pad regions P of the gate electrodes, disposed in the staircase shape, will hereinafter be referred to as "step portions." The pad regions P may include first step groups SG1 adjacent to the first main separation structures MS1, second step groups SG2 disposed in a center between the first step groups SG1, and third step groups SG3 disposed between the first step groups SG1 and the second step groups SG2. For example, as illustrated in FIG. 3B, first step groups SG1 may be immediately adjacent to each of the first main separation structures MS1 along the Y direction (e.g., two first step groups SG1 corresponding to each of the two first main separation structures MS1 are illustrated in FIG. 3B). For example, as further illustrated in FIG. 3B, the second step groups SG2 may be between, e.g., in a center between, the two first main separation structures MS1, and the third step groups SG3 may be between the second step groups SG2 and a corresponding one of the two first main separation structures MS1. The third step groups SG3 may be adjacent to the first step groups SG1. The second step groups SG2 may be divided by the second main separation structure MS2.

In an example embodiment, the second step groups SG2 and the third step groups SG3 may have dummy regions DA disposed therebetween. The dummy regions DA may be regions in which step portions are not formed.

Respective step portions of the first step groups SG1 may be raised by a first level in a direction away from the first main separation structures MS1. Here, the first level may be a difference in level between two adjacent gate electrodes of the gate electrodes spaced in the direction perpendicular to the surface of the upper substrate 150.

The step portions of the first step groups SG1 may be lowered by a second level higher than the first level in a direction away from the memory cell array region 20. For example, the second level may be a difference in level between first and third gate electrodes of the first gate electrode, a second gate electrode, and the third gate electrode sequentially arranged in a vertical direction.

At least a portion of step portions of the second step groups SG2 may be adjacent to the upper substrate 150, compared to the step portions of the first step groups SG1, e.g., a vertical distance between the second step groups SG2 and the upper substrate 150 may be smaller than a vertical distance between the first step groups SG1 and the upper substrate 150. At least a portion of step portions of the third step groups SG3 may be adjacent to the upper substrate 150, compared to the step portions of the second step groups SG2 e.g., a vertical distance between the second step groups SG2 and the upper substrate 150 may be larger than a vertical distance between the third step groups SG3 and the upper substrate 150. The step portions of the third step groups SG3 may be adjacent to the upper substrate 150, compared to the step portions of the first step groups SG1.

Figure 6A:
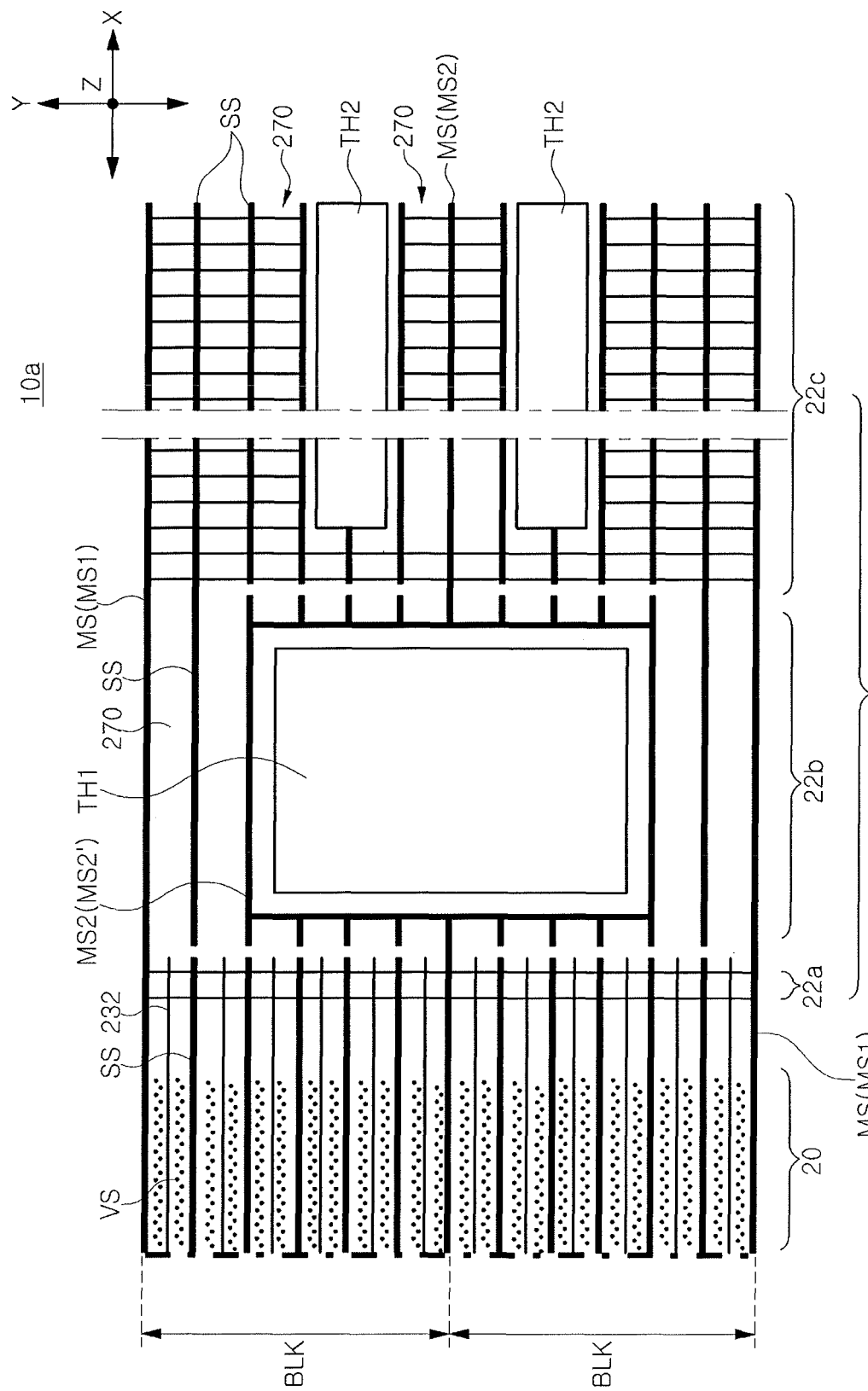
FIG. 6A illustrates a schematic plan view of a modified example of the three-dimensional semiconductor device of FIG. 3A.
Figure 6B:
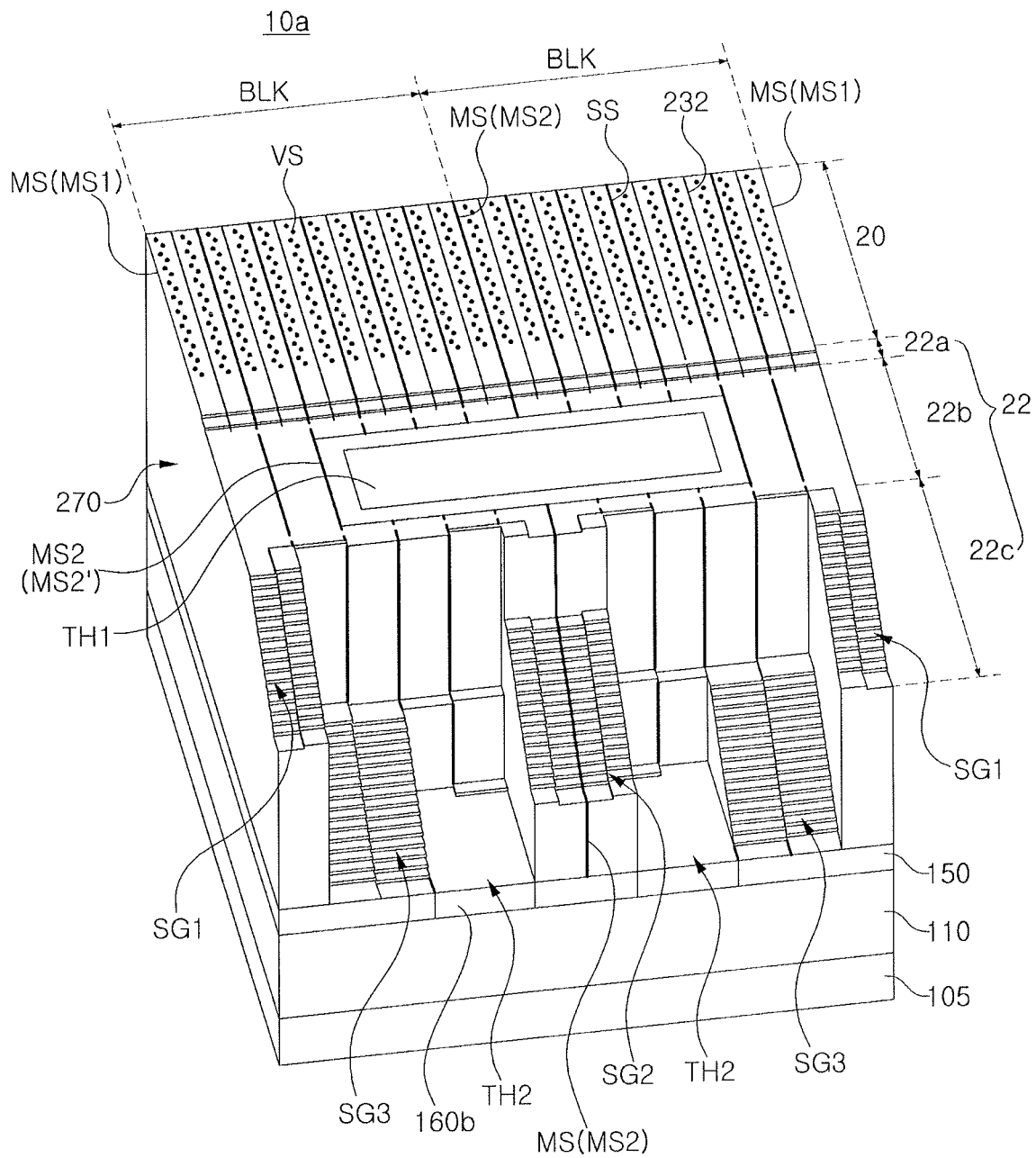
FIG. 6B illustrates a schematic perspective view of a modified example of the three-dimensional semiconductor device of FIG. 3B.

In a modified example, the dummy regions DA, disposed between the second step groups SG2 and the third step groups SG3, as mentioned above, may be replaced with second pad through regions TH2 of FIGS. 6A and 6B. Such a modified example will be described with reference to FIGS. 6A and 6B.

FIG. 6A is a plan view schematically illustrating a modified example of the three-dimensional semiconductor device 10, according to an example embodiment. FIG. 6B is a perspective view schematically illustrating a modified example of the three-dimensional semiconductor device 10, according to an example embodiment.

Referring to FIGS. 6A and 6B, in a three-dimensional semiconductor device 10a, the dummy regions DA of FIGS. 3A and 3B may be replaced with the second pad through regions TH2. Accordingly, the upper substrate 150 may include second gap-fill layers 160b disposed in regions in which the upper substrate 150 overlaps the second pad through regions TH2.

Figure 7A:
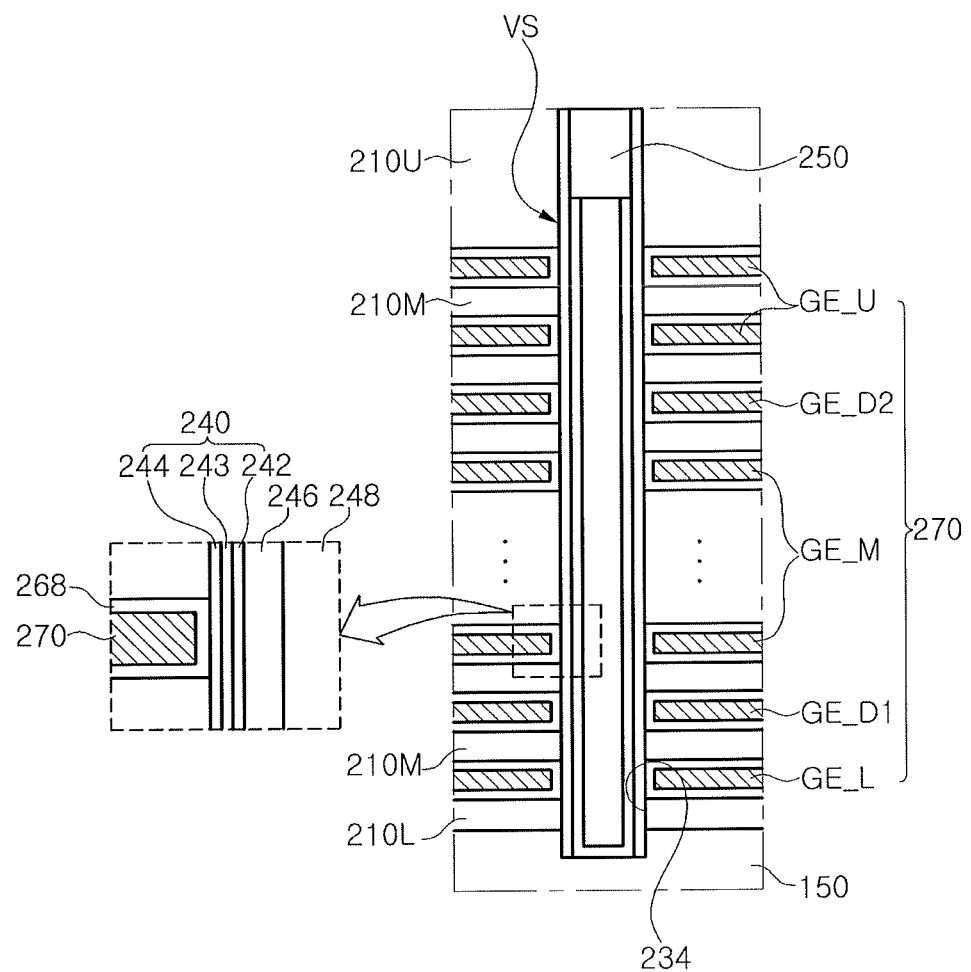
FIG. 7A illustrates a schematic cross-sectional view of a portion of a three-dimensional semiconductor device, according to an example embodiment.

An example of the above-mentioned vertical channel structures VS described above will be described with reference to FIG. 7A. FIG. 7A is a cross-sectional view schematically illustrating the vertical channel structure VS together with a gate to illustrate an example of the vertical channel structure VS and the gate in a three-dimensional semiconductor device, according to an example embodiment.

Referring to FIG. 7A, the vertical channel structure VS may be disposed within a channel hole 234 passing through the gate-stacked structure 270, the lower interlayer insulating layer 210L, the intermediate interlayer insulating layers 210M, and the upper interlayer insulating layer 210U. In an example embodiment, the vertical channel structure VS may include an insulating core layer 248 extending in the direction perpendicular to the surface of the upper substrate 150, and passing through the gate-stacked structure 270, a channel semiconductor layer 246 covering a lateral surface and a bottom surface of the insulating core layer 248, a first gate dielectric 240 surrounding an external surface of the channel semiconductor layer 246, and a pad layer 250 disposed on the insulating core layer 248, and electrically connected to the channel semiconductor layer 246.

The channel semiconductor layer 246 may be electrically connected to the upper substrate 150. The channel semiconductor layer 246 may be formed of a semiconductor material, e.g., silicon or the like.

The pad layer 250 may be formed of, e.g., polysilicon having n-type conductivity. The insulating core layer 248 may be formed of an insulating material, e.g., silicon oxide or the like.

The three-dimensional semiconductor device 10 may include a second gate dielectric 268 interposed between the gate electrodes of the gate-stacked structure 270 and the vertical channel structures VS, and extending onto upper and lower surfaces of the gate electrodes. At least one of the first and second gate dielectrics 240 and 268 may include a layer for storing information. For example, the first gate dielectric 240 may include a layer for storing information. However, example embodiments are not limited thereto, e.g., the second gate dielectric 268 may also include a layer for storing information.

An example of the first gate dielectric 240, including the layer for storing information, will be described hereinafter. The first gate dielectric 240 may include a tunnel dielectric 242, an information storage layer 243, and a blocking dielectric 244.

The information storage layer 243 may be disposed between the tunnel dielectric 242 and the blocking dielectric 244. The tunnel dielectric layer 242 may be adjacent to the channel semiconductor layer 246, and the blocking dielectric 244 may be adjacent to the gate-stacked structure 270. The tunnel dielectric 242 may include, e.g., a silicon oxide and/or an impurity-doped silicon oxide. The blocking dielectric 244 may include a silicon oxide and/or a high-k dielectric.

The information storage layer 243 may be interposed between the channel semiconductor layer 246 and the intermediate gate electrodes GE_M, and may be a layer for storing information. For example, the information storage layer 243 may be formed of a material, e.g., a silicon nitride, that may trap and retain electrons injected from the channel semiconductor layer 246 through the tunnel dielectric 242, or that may remove electrons trapped within the information storage layer 243, according to operating conditions of a non-volatile memory device, e.g., a flash memory device or the like. The second gate dielectric 268 may include a high-k dielectric, e.g., AlO or the like.

The information storage layer 243 may store information in regions facing the intermediate gate electrodes GE_M of the gate-stacked structure 270 that may correspond to the word lines WL of FIGS. 1 and 2 described above in FIGS. 1 and 2. The regions, in which the information storage layer 243 of the vertical channel structure VS may store information, may be arranged in the direction perpendicular to the surface of the upper substrate 150, and may constitute the memory cells MC described above in FIG. 2. The channel semiconductor layer 246 may be directly connected to the upper substrate 150, but example embodiments are not limited thereto.

Figure 7B:
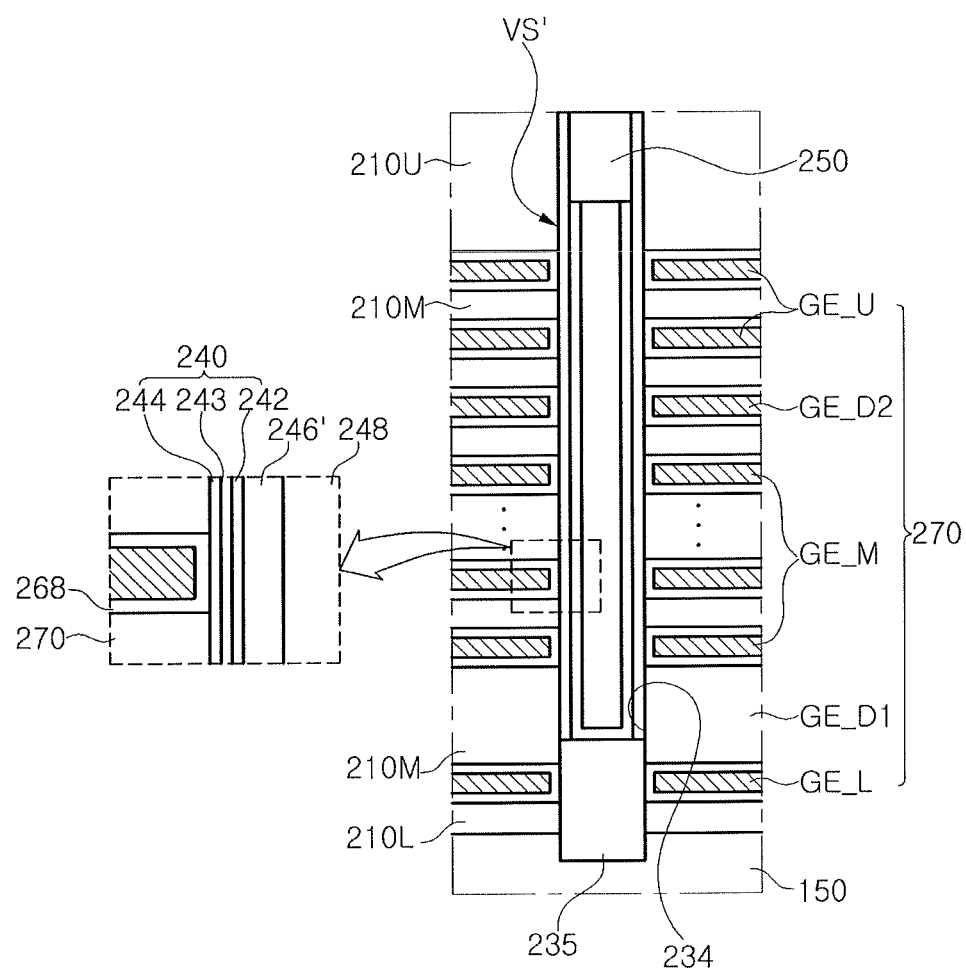
FIG. 7B illustrates a schematic cross-sectional view of a modified example of a portion of a three-dimensional semiconductor device according to an example embodiment.

A modified example of the vertical channel structure VS will be described with reference to FIG. 7B. FIG. 7B is a cross-sectional view schematically illustrating the modified example of the vertical channel structure VS in a three-dimensional semiconductor device, according to an example embodiment.

Referring to FIG. 7B, in the gate electrodes of the gate-stacked structure 270, a spacing between the lower gate electrode GE_L closest to the upper substrate 150, and the dummy gate electrode GE_D1 on the lower gate electrode GE_L, may be greater than that between the other gate electrodes. A vertical channel structure VS' may be disposed within the channel hole 234, as described above in FIG. 7A.

In an example embodiment, the vertical channel structure VS' may include a lower channel semiconductor layer 235 disposed below the channel hole 234, and facing the lower gate electrode GE_L, the insulating core layer 248 disposed on the lower channel semiconductor layer 235, an upper channel semiconductor layer 246' covering the lateral surface and the bottom surface of the insulating core layer 248, the first gate dielectric 240 surrounding an external surface of the upper channel semiconductor layer 246', and the pad layer 250 disposed on the insulating core layer 248, and electrically connected to the channel semiconductor layer 246. The lower channel semiconductor layer 235 may be directly connected to the upper substrate 150, and may be formed as an epitaxial semiconductor layer. The upper channel semiconductor layer 246' may be formed of a semiconductor material, e.g., silicon or the like.

The first gate dielectric 240 may be the same as described above in FIG. 7A. Further, the second gate dielectric 268, which may be interposed between the vertical channel structure VS' and the gate-stacked structure 270, and may extend onto the upper and lower surfaces of the gate electrodes of the gate-stacked structure 270, as described above in FIG. 7A, may be disposed.

Referring again to FIGS. 3A through 5, the three-dimensional semiconductor device 10 may include the upper interlayer insulating layer 210U, and a first capping insulating layer 255 disposed on the upper interlayer insulating layer 210U. The first capping insulating layer 255 may be formed of, e.g., a silicon oxide.

The three-dimensional semiconductor device 10 may include main separation structures MS traversing the memory cell array region 20 and the extension region 22. Each of the memory blocks BLK of FIG. 1 within the memory cell array region 20, as described above in FIG. 1, may be positioned between a pair of the main separation structures MS adjacent to each other.

The three-dimensional semiconductor device 10 may include auxiliary separation structures SS disposed between the main separation structures MS. In an example embodiment, the auxiliary separation structures SS may include auxiliary separation structures of a line shape traversing the memory cell array region 20 along the X direction and extending into a portion of the extension region 22, and auxiliary separation structures SS disposed within the extension region 22. In an example embodiment, the respective auxiliary separation structures SS have a shorter length than the main separation structures MS.

Thus, the auxiliary separation structures SS may have the line shape, and may be spaced within the portion of the extension region 22 in a length direction of the line shape. As a result, at least one intermediate gate electrode GE_M, positioned between the pair of main separation structures MS adjacent to each other and disposed on the same plane, may not be completely divided by the auxiliary separation structures SS to thus be used as a single word line. Between the pair of main separation structures MS adjacent to each other, the auxiliary separation structures SS may divide the upper gate electrode GE_U into a plurality of upper gate electrodes GE_U (FIG. 3B).

In an example embodiment, an insulating line 232 may be disposed between the pair of main separation structures MS adjacent to each other, and may be disposed between the auxiliary separation structures SS to divide the upper gate electrode GE_U into the upper gate electrodes GE_U (FIG. 5). The insulating line 232 may be disposed on a level higher than that of the intermediate gate electrodes GE_M.

The main separation structures MS and the auxiliary separation structures SS may be disposed on the upper substrate 150, and may pass through the gate-stacked structure 270. The main separation structures MS and the auxiliary separation structures SS may pass through the gate-stacked structure 270, the lower interlayer insulating layer 210L, the intermediate interlayer insulating layers 210M, the upper interlayer insulating layer 210U, and the upper insulating layer 230. Each of the main separation structures MS and the auxiliary separation structures SS may include a conductive pattern 276, and spacers 274 covering lateral surfaces of the conductive pattern 276.

The spacers 274 may be formed of an insulating material, e.g., a silicon oxide, a silicon nitride, or the like. The spacers 274 may space the conductive pattern 276 apart from the gate-stacked structure 270.

The conductive pattern 276 may be formed of a conductive material including at least one of doped polysilicon, a metal nitride, e.g., a titanium nitride or the like, or a metal, e.g., tungsten or the like. In an example embodiment, the conductive pattern 276 may also be referred to as a source contact plug.

The main separation structures MS may include the first main separation structures MS1, and the second main separation structure MS2 between the first main separation structures MS1. In an example embodiment, the second main separation structure MS2 may traverse the memory cell array region 20 in a single line shape, extend into the extension region 22, and include a portion MS2' in which a single line may be divided into two lines, so as to surround the first pad through region TH1 (FIGS. 3A-3B). The two lines of the divided portion MS2' of the second main separation structure MS2, as described above, may be combined into a single line to traverse a remaining portion of the extension region 22. In an example embodiment, the divided portion MS2' of the second main separation structure MS2 may include protrusion portions extending in a direction from a portion of the divided portion MS2' surrounding the first pad through region TH1 to the auxiliary separation structures SS. In an example embodiment, the divided portion MS2' of the second main separation structure MS2 may be disposed between at least some of the auxiliary separation structures SS.

The three-dimensional semiconductor device 10 may include impurity regions 272 within the upper substrate 150 below the main separation structures MS and the auxiliary separation structures SS. The impurity regions 272 may have n-type conductivity, and portions of the upper substrate 150, adjacent to the impurity regions 272, may have p-type conductivity. The impurity regions 272 may be the common source line CSL of FIGS. 1 and 2 described above.

The three-dimensional semiconductor device 10 may include a second capping insulating layer 278 disposed on the first capping insulating layer 255 to cover the main separation structures MS and the auxiliary separation structures SS. The second capping insulating layer 278 may be formed of, e.g., a silicon oxide.

The three-dimensional semiconductor device 10 may include bit line contact plugs 280b passing through the first and second capping insulating layers 255 and 278 and electrically connected to the vertical channel structures VS, and the gate contact plugs 280g extending onto the pad regions P of the gate electrodes of the gate-stacked structure 270, while passing through the first and second capping insulating layers 255 and 278, so as to be electrically connected to the pad regions P of the gate electrodes.

The three-dimensional semiconductor device 10a may include peripheral contact plugs passing through the first and second capping insulating layers 255 and 278, passing through the first pad through region TH1, and extending downwardly to be electrically connected to the peripheral wirings 130 of the peripheral circuit PCIR within the lower structure 110. The peripheral contact plugs may include gate peripheral contact plugs 284g. The gate peripheral contact plugs 284g may pass through the upper substrate 150. For example, the gate peripheral contact plugs 284g may sequentially pass through the gate-stacked structure 270 and the first gap-fill layer 160a, and may extend into the lower structure 110 to be electrically connected to the peripheral wirings 130.

The three-dimensional semiconductor device 10 may include upper wirings disposed on the second capping insulating layer 278. The upper wirings may include bit lines 290b electrically connected to the bit line contact plugs 280b, and gate connection wirings 290g electrically connected to the gate contact plugs 280g. In an example embodiment, at least a portion of the gate connection wirings 290g may be electrically connected to the gate peripheral contact plugs 284g. Thus, at least a portion of the gate electrodes of the gate-stacked structure 270 may be electrically connected to the peripheral circuit PCIR below the upper substrate 150 through the first pad through region TH1.

Alternatively, at least a portion of the gate electrodes of the gate-stacked structure 270 may be electrically connected to the peripheral circuit PCIR below the upper substrate 150 through the first pad through region TH1, and through the second pad through regions TH2 described above in FIGS. 6A and 6B.

Figure 8A:
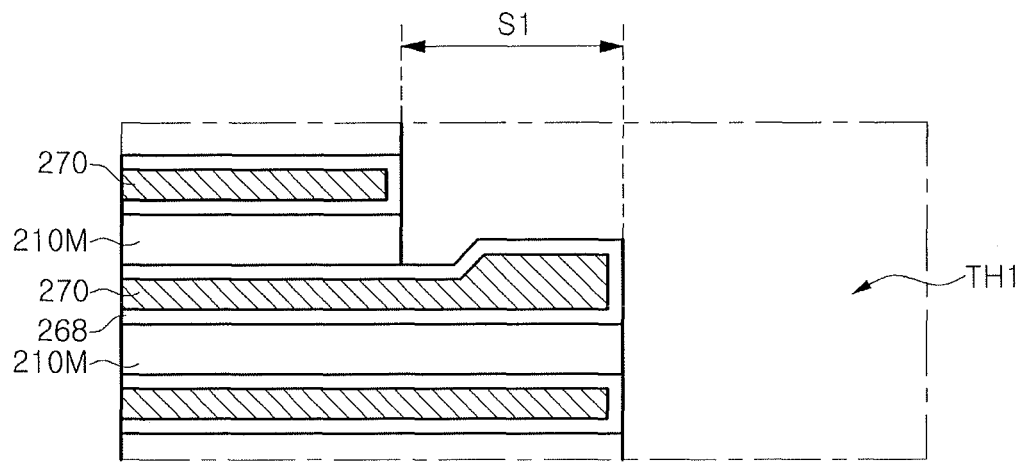
FIGS. 8A and 8B illustrate partially enlarged views of regions A1 and A2 of FIG. 4.
Figure 8A:
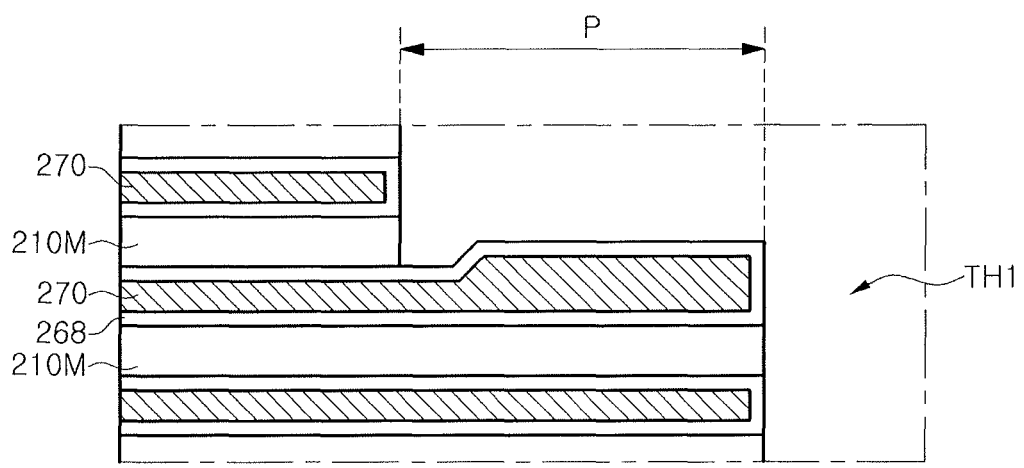
Figure 8B:
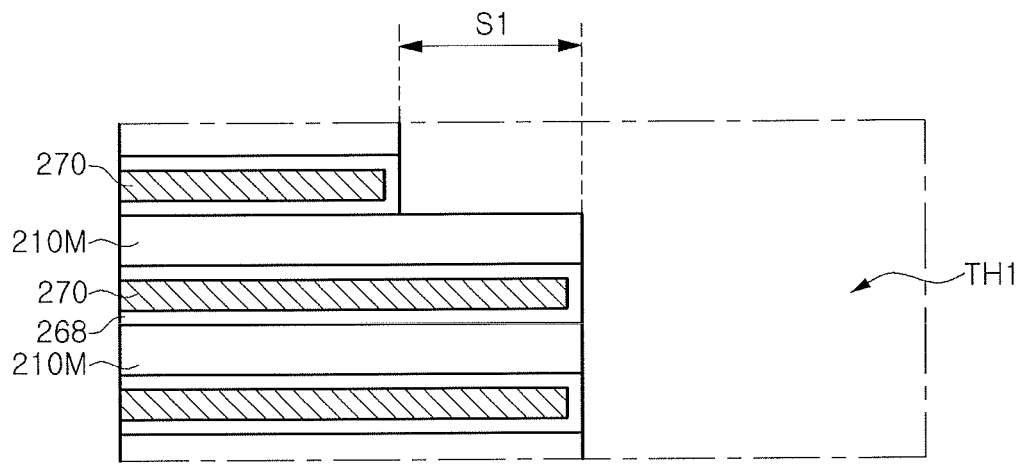
Figure 8B:
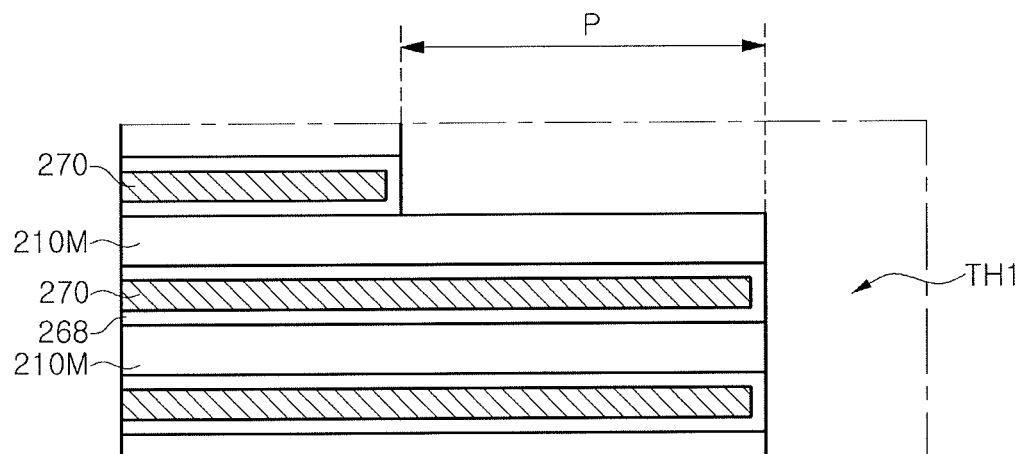

The sides of the first pad through region TH1, and the pad regions P of the gate electrodes of the gate-stacked structure 270, as described above, will be described with reference to FIGS. 8A and 8B. FIGS. 8A and 8B are partially enlarged views of regions "A1" and "A2" of FIG. 4. Here, region "A1" may represent the stepped portion S1 of each of the sides of the first pad through region TH1 described above, and region "A2" may represent the pad region P of the gate-stacked structure 270.

Referring first to FIGS. 4 and 8A, a width of the stepped portion S1 of the side of the first pad through region TH1 in a horizontal direction of the stepped portion S1 (in region A1 of FIG. 8A) may be narrower than that of the pad region P of the gate-stacked structure 270 in a horizontal direction of the pad region P (in region A2 of FIG. 8A). In an example, a portion of a gate electrode of the gate-stacked structure 270 positioned in the stepped portion S1 of the side of the first pad through region TH1 (e.g., a portion of the gate electrode defining the stepped portion S1 in region A1 of FIG. 8A) and in the pad region P of the gate-stacked structure 270 (e.g., a portion of the gate electrode defining the pad region P in region A2 of FIG. 8A) may have an increased thickness at a region immediately adjacent the first pad through region TH1.

For example, the gate electrode of the gate-stacked structure 270 may extend to have a first thickness, and may have a second thickness greater than the first thickness in the stepped portion S1 of the side of the first pad through region TH1, and in the pad region P of the gate-stacked structure 270. However, example embodiments are not limited thereto. For example, as illustrated in FIG. 8B, a portion of a gate electrode of the gate-stacked structure 270, positioned in the stepped portion S1 of the side of the first pad through region TH1, and the pad region P of the gate-stacked structure 270, may have the same thickness as another portion of the gate electrode.

In the foregoing, a first pad through region TH1 and a second main separation structure MS2, disposed between the pair of the first main separation structures MS1, have mainly been described with reference to FIGS. 3A through 5, but example embodiment are not limited thereto. For example, the first pad through region TH1 and the second main separation structure MS2 may be formed as a plurality of first pad through regions TH1 and a plurality of second main separation structures MS2, respectively.

As described above, an example of the three-dimensional semiconductor device, including the first pad through region TH1 that may be formed as the first pad through regions TH1, and the second main separation structure MS2 that may be formed as the second main separation structures MS2, will be described with reference to FIG. 9. Here, the three-dimensional semiconductor device 10 may include all of the constituent elements described above with reference to FIGS. 3A through 5. The constituent elements, as described above with reference to FIGS. 3A through 5, have been previously described, and detailed descriptions thereof will thus be omitted.

Figure 9:
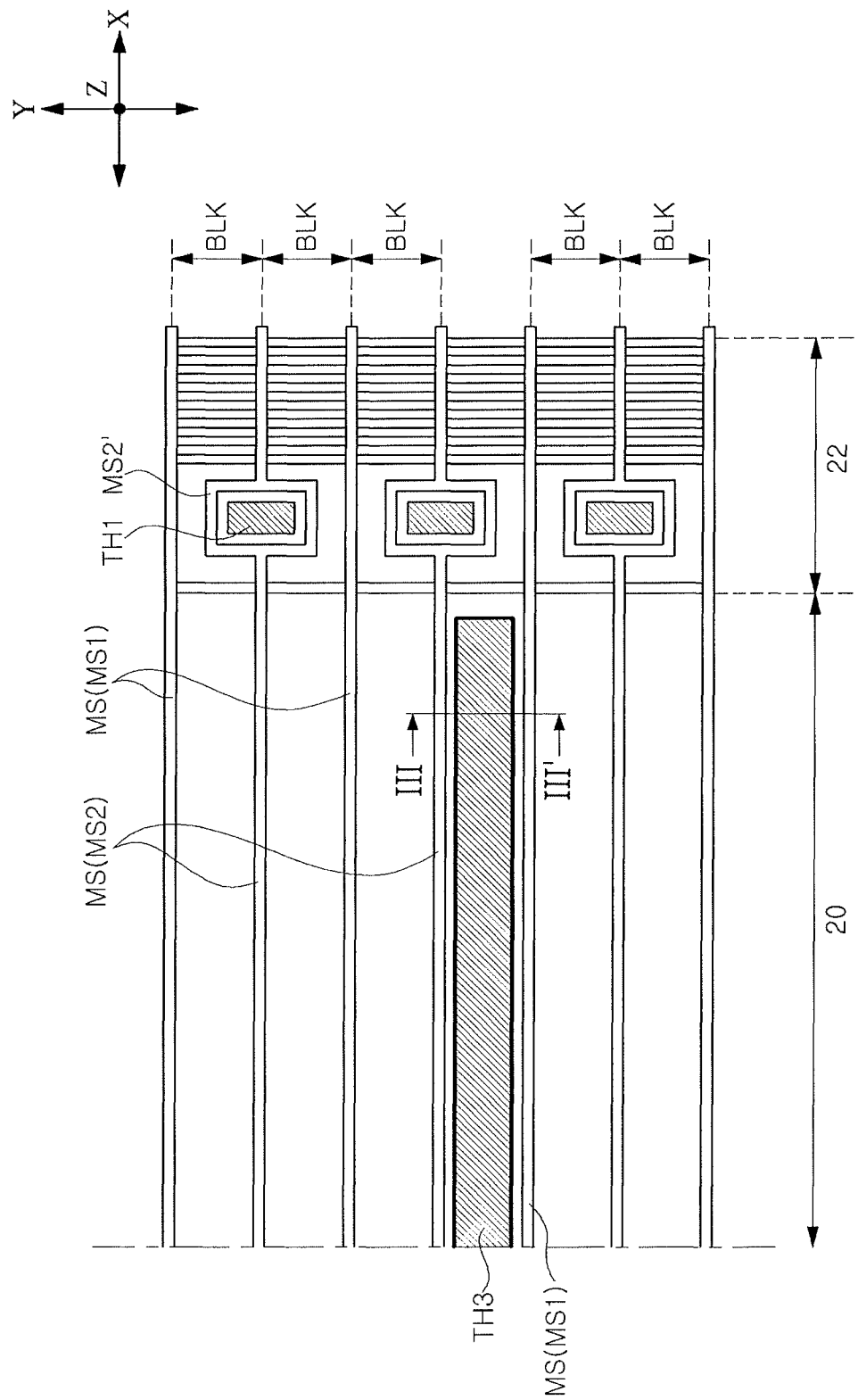
FIG. 9 illustrates a schematic plan view of a modified example of a semiconductor device, according to an example embodiment.

FIG. 9 is a plan view schematically illustrating a modified example of a semiconductor device, according to an example embodiment.

Referring to FIGS. 3A through 5 and 9, a first pad through region TH1 and a second main separation structure MS2, described above in FIGS. 3A through 5, may be repeatedly arranged in one direction. Thus, a plurality of first pad through regions TH1 may be disposed.

The first pad through regions TH1 may be repeatedly arranged on a plane illustrated in FIG. 9 in the second direction Y perpendicular to the first direction X from the memory cell array region 20 to the extension region 22. For example, as illustrate in FIG. 9, the first pad through regions TH1 may be spaced apart from each other along the second direction Y, e.g., each first pad through region TH1 may have a longitudinal direction along the second direction Y and may extend only along two memory blocks BLK.

Each of the first pad through regions TH1 may be, e.g., continuously, surrounded by the divided portion MS2' of the second main separation structure MS2, as described above in FIGS. 3A through 5. Thus, a plurality of second main separation structures MS2 may be disposed in proportion to the number of the first pad through regions TH1.

The main separation structures MS may include the first main separation structures MS1 and the second main separation structures MS2. Each of the second main separation structures MS2 may be disposed between a pair of first main separation structures MS1, adjacent to each other, of the first main separation structures MS1. Thus, the first main separation structures MS1 and the second main separation structure MS2 may be repeatedly arranged in the second direction Y. For example, as illustrated in FIG. 9, the first main separation structure MS1 may have a linear shape extending along the first direction X between two adjacent first pad through regions TH1, and the second main separation structure MS2 may extend along the first direction X and surround respective ones of the first pad through regions TH1, e.g., the first and second main separation structures MS1 and MS2 may alternate in the second direction Y.

Each of the first pad through regions TH1 may electrically connect the gate electrodes of the gate-stacked structure 270 to the peripheral circuit PCIR below the upper substrate 150, as described above in FIGS. 3A through 5. According to an example embodiment, a memory through region TH3 (FIGS. 9 and 10A), similar to the first pad through region TH1, may be used to electrically connect the bit lines 290b described above in FIGS. 3A through 5 to the peripheral circuit PCIR disposed below the upper substrate 150.

Figure 10A:
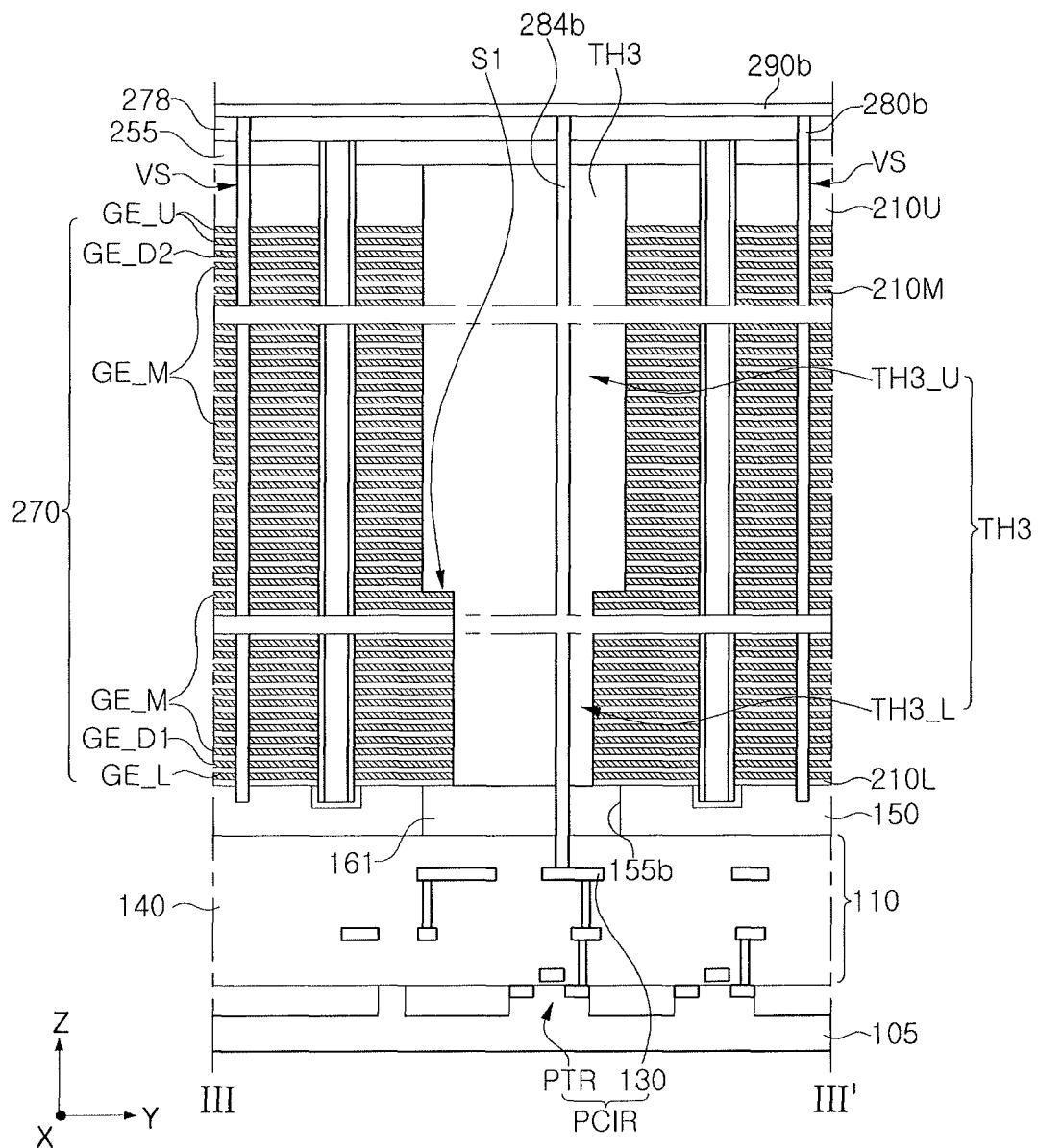
FIG. 10A illustrates a schematic cross-sectional view of a modified example of a semiconductor device, according to an example embodiment.

An example of a semiconductor device, including the memory through region TH3 (FIGS. 9 and 10A) as described above, will be described with reference to FIGS. 3A through 5, 9, and 10A. FIG. 10A is a schematic cross-sectional view along line of FIG. 9. Here, the constituent elements, as described above with reference to FIGS. 3A through 5, and 9, have been previously described, and detailed descriptions thereof will thus be omitted.

Referring to FIGS. 3A through 5, 9, and 10A, a three-dimensional semiconductor device according to embodiments may include the memory through region TH3 disposed between the first main separation structure MS1 and the second main separation structure MS2, adjacent to each other, of the main separation structures MS positioned within the memory cell array region 20. Thus, the memory blocks BLK may be repeatedly arranged in the second direction Y, as described above, and at least one of the memory blocks BLK, repeatedly arranged in such a manner, may be replaced with the memory through region TH3. Accordingly, at least one memory through region TH3 may be disposed between a pair of the memory blocks BLK, e.g., the at least one memory through region TH3 may have a longitudinal direction along the first direction X, in a plan view. As illustrated in FIG. 10A, the memory through region TH3 may pass through the gate-stacked structure 270, and may pass through the lower interlayer insulating layer 210L, the intermediate interlayer insulating layers 210M, and the upper interlayer insulating layer 210U in the Z direction.

As mentioned above with reference to FIGS. 3A through 5, the first pad through region TH1 may be disposed within the extension region 22. Further, the first pad through region TH1 may pass through the lower gate electrode GE_L, the dummy gate electrode GE_D1, the intermediate gate electrodes GE_M, and the buffer gate electrode GE_D2 of the gate-stacked structure 270 within the buffer region 22b between the first and second step regions 22a and 22c. The memory through region TH3 may be disposed within the memory cell array region 20, and may pass through the lower gate electrode GE_L, the dummy gate electrode GE_D1, the intermediate gate electrodes GE_M, the buffer gate electrode GE_D2, and the upper gate electrode GE_U of the gate-stacked structure 270. Thus, the first pad through region TH1 may be spaced apart from the upper gate electrode GE_U along the first direction X, and the memory through region TH3 may pass through the upper gate electrode GE_U further than the first pad through region TH1 does.

The memory through region TH3 may be formed of the same material as the first pad through region TH1, e.g., a silicon oxide. The memory through region TH3 may include a lower through region TH3_L, and an upper through region TH3_U on the lower through region TH3_L. In the memory through region TH3, the upper through region TH3_U may have a width wider than the lower through region TH3_L. The memory through region TH3 may have sides including a stepped portion S1, as in the first pad through region TH1. The memory through region TH3 may have a gap-fill layer 161 disposed therebelow to overlap the memory through region TH3.

The gap-fill layer 161 may be formed of an insulating material filling a substrate hole 155b passing through the upper substrate 150. The gap-fill layer 161 may be formed of the same insulating material as the first gap-fill layer 160a, for example, a silicon oxide.

A bit line peripheral contact plug 284b may pass through the memory through region TH3, may pass through the first and second capping insulating layers 255 and 278, and the second gap-fill layers 160b, and may extend into the lower structure 110 to be electrically connected to the peripheral wirings 130 of the peripheral circuit PCIR. Each of the bit lines 290b may be electrically connected to the bit line peripheral contact plug 284b. Thus, the bit line 290b may be electrically connected to the peripheral circuit PCIR through the bit line peripheral contact plug 284b passing through the memory through region TH3.

In an example embodiment, the memory through region TH3 may have a shape similar to that of the first pad through region TH1, and may also be modified to have various shapes. For example, the memory through region TH3 may pass through the upper gate electrode GE_U further than the first pad through region TH1 does to thus be modified to have a different shape from the first pad through region TH1.

For example, a plurality of upper gate electrodes GE_U may be stacked in the direction perpendicular to the surface of the upper substrate 150, and the upper gate electrodes GE_U may have the pad regions P arranged within the extension region 22 to have the staircase shape. A patterning process for forming the pad regions P of the staircase shape of the upper gate electrodes GE_U may pattern the upper gate electrode GE_U in a location in which the memory through region TH3 is to be formed, to expose the buffer gate electrode GE_D2. In such a state, the memory through region TH3 may be formed by the same process as that of forming the first pad through region TH1. A shape of the memory through region TH3 may be variously modified, depending on an exposed shape of the buffer gate electrode GE_D2 formed by patterning the upper gate electrode GE_U in the location in which the memory through region TH3 is to be formed.

Figure 10B:
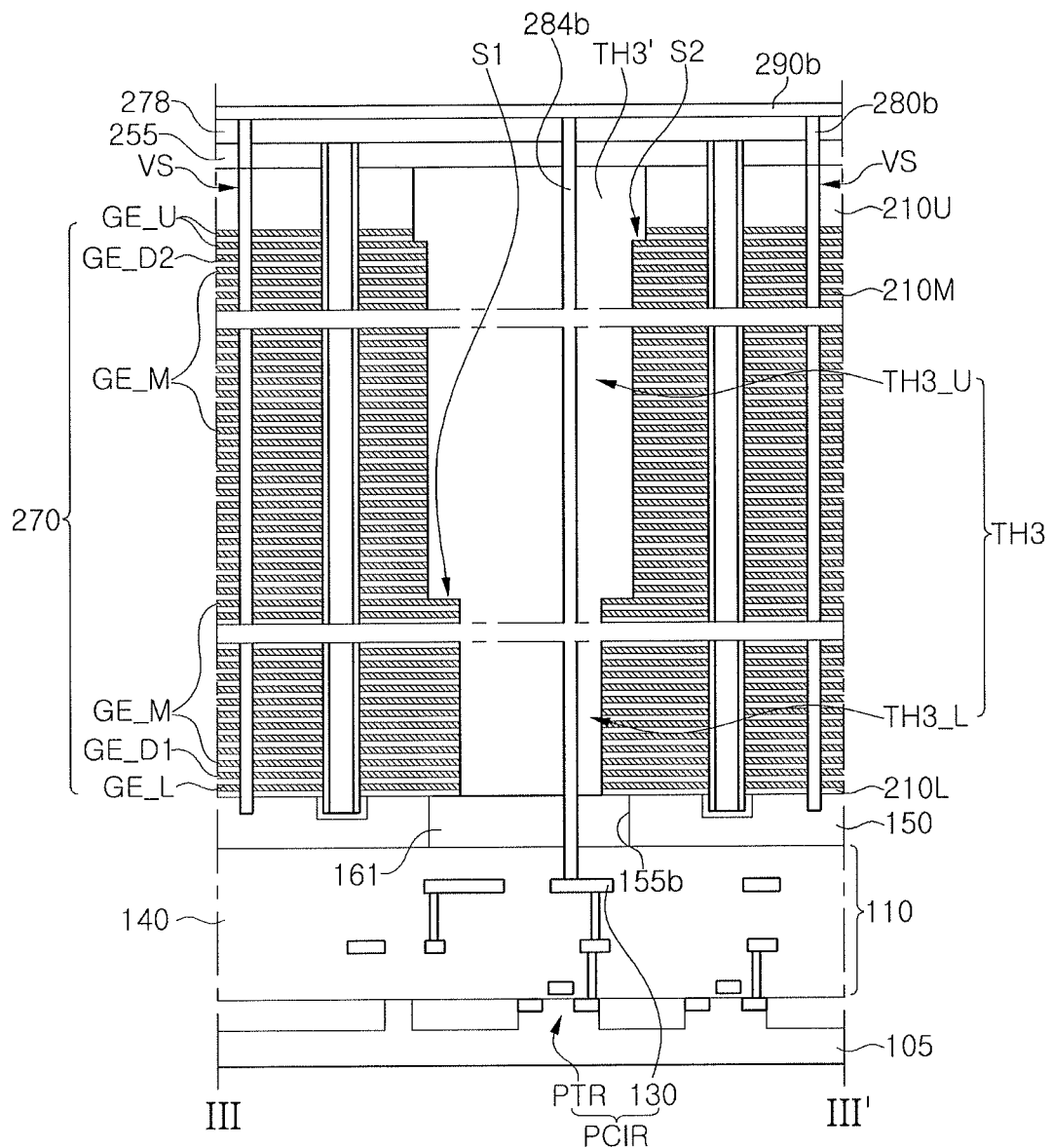
FIG. 10B illustrates a schematic cross-sectional view of a modified example of a semiconductor device, according to an example embodiment.
Figure 10C:
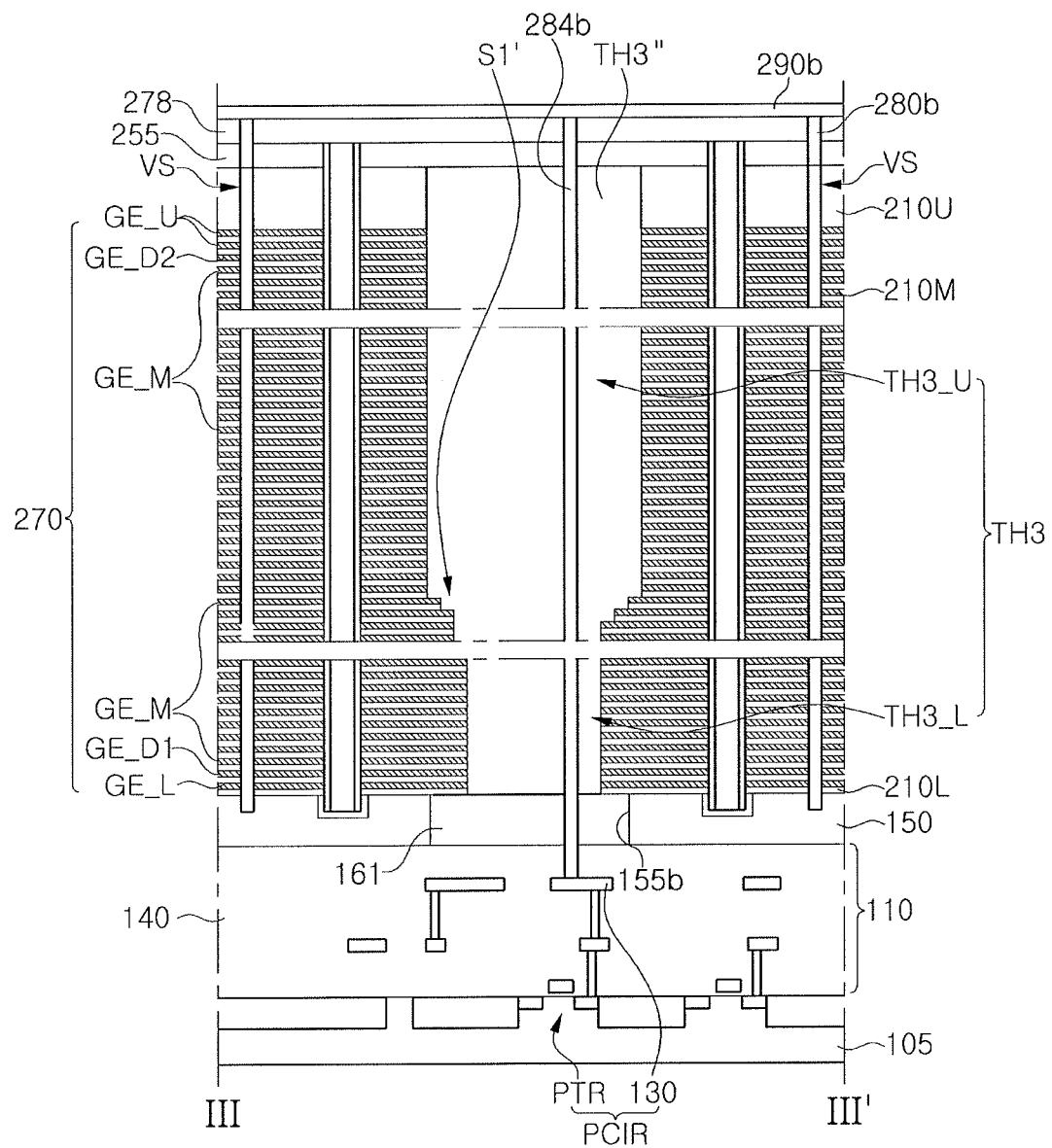
FIG. 10C illustrates a schematic cross-sectional view of a modified example of a semiconductor device, according to an example embodiment.

FIGS. 10B and 10C are cross-sectional views illustrating modified examples of the memory through region TH3 of FIG. 10A.

Referring first to FIG. 10B, a memory through region TH3' may include a stepped portion S2 on an upper portion thereof. For example, in the upper through region TH3_U of the memory through region TH3, a width of the upper through region TH3_U, defined by the uppermost gate electrode of the gate electrodes, may be greater than that of the upper through region TH3_U defined by the intermediate gate electrodes GE_M. For example, as illustrated in FIG. 10B, the memory through region TH3 may have three vertical portions with increasing widths on top of each other with the first and second stepped portions S1 and S2 separating the vertical portions.

Referring to FIG. 10C, a memory through region TH3" may have sides including a plurality of step portions S1'. The staircase shape, in which the pad regions P of the gate electrodes of the gate-stacked structure 270 may be arranged, and the first pad through region TH1, as described above, may be modified to have various forms without being limited to the foregoing example embodiments.

A modified example of the staircase shape and the first pad through region TH1, as described above, will be described with reference to FIGS. 11A and 11B.

Figure 11A:
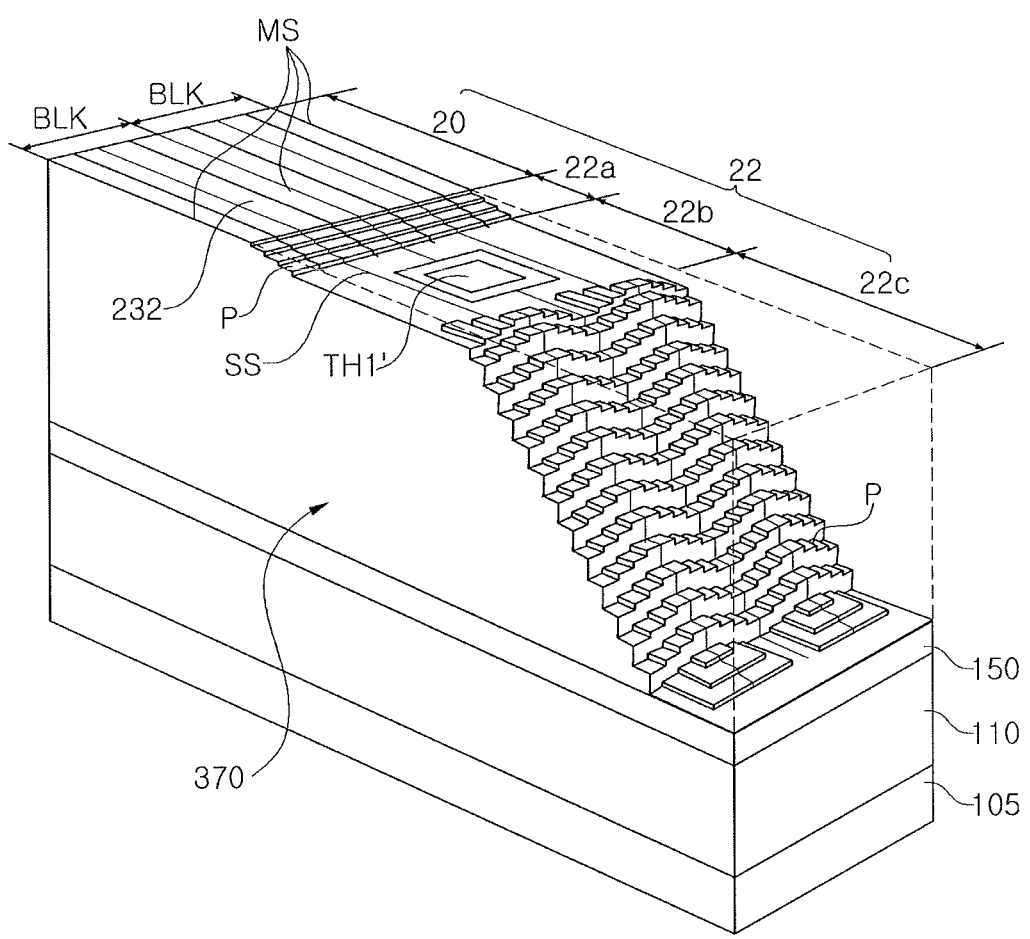
FIG. 11A illustrates a schematic perspective view of a modified example of a three-dimensional semiconductor device, according to an example embodiment.
Figure 11B:
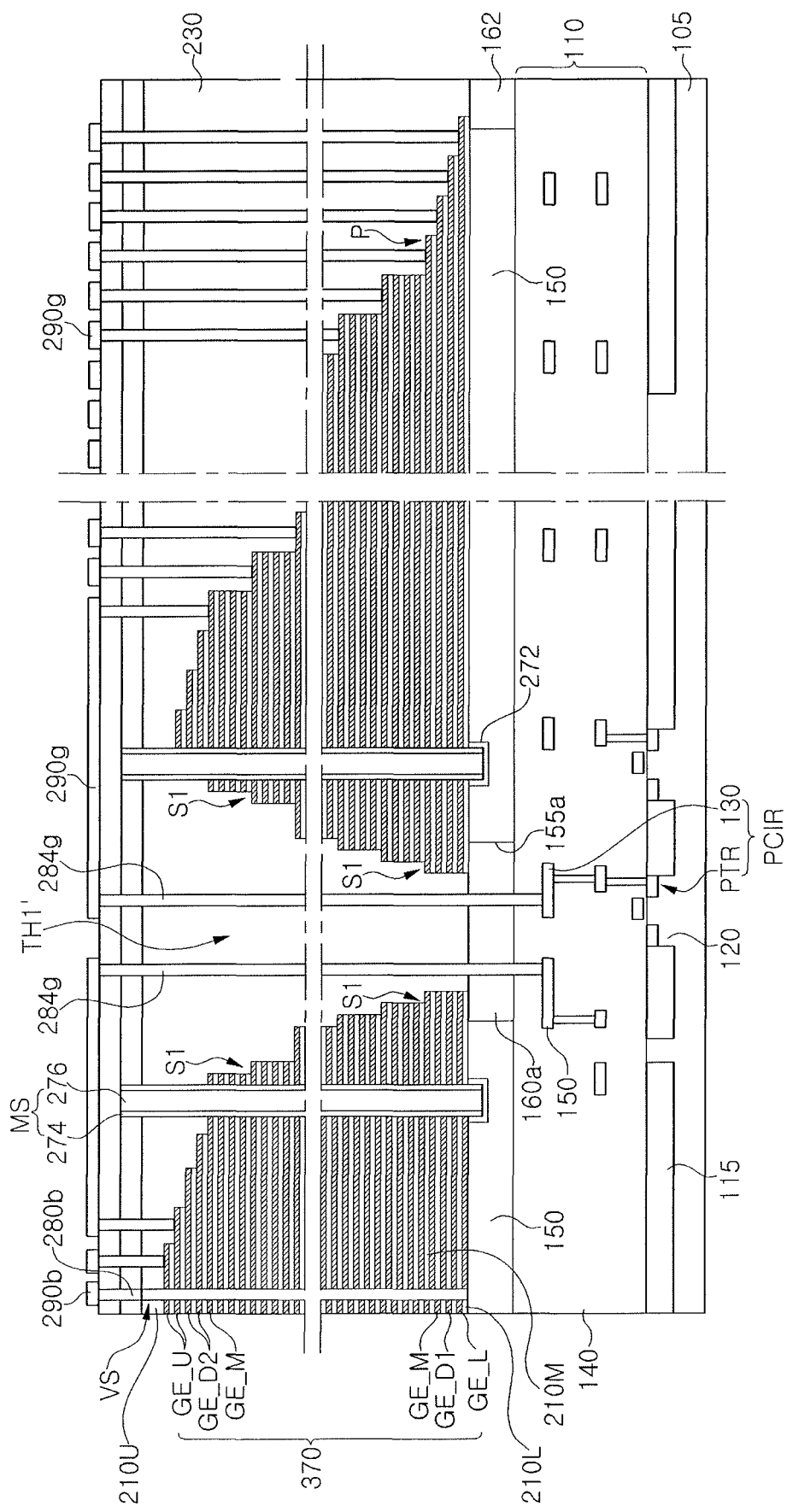
FIG. 11B illustrates a schematic cross-sectional view of a modified example of a three-dimensional semiconductor device, according to an example embodiment.

FIG. 11A is a perspective view schematically illustrating a modified example of a three-dimensional semiconductor device, according to an example embodiment, and FIG. 11B is a cross-sectional view schematically illustrating a portion of FIG. 11A, taken in the direction from the memory cell array region 20 to the extension region 22. Here, the modified example of the staircase shape and the first pad through region TH1 will mainly be described, and descriptions of the remaining constituent elements can be understood as being replaced with those described above. Thus, detailed descriptions thereof will be omitted.

Referring to FIGS. 11A and 11B, the lower substrate 105, the lower structure 110, and the upper substrate 150, as described above, may be disposed. A gate-stacked structure 370, disposed on the upper substrate 150, may include gate electrodes spaced apart from each other and stacked, e.g., in the third direction Z perpendicular to the surface of the upper substrate 150.

The gate electrodes of the gate-stacked structure 370 may be spaced apart from each other and stacked within the memory cell array region 20, as stated above, and may extend into the extension region 22 to have pad regions P within the extension region 22. The gate electrodes of the gate-stacked structure 370 may include a lower gate electrode GE_L, a dummy gate electrode GE_D1 on the lower gate electrode GE_L, intermediate gate electrodes GE_M on the dummy gate electrode GE_D1, a buffer gate electrode GE_D2 on the intermediate gate electrodes GE_M, and upper gate electrodes GE_U on the buffer gate electrode GE_D2.

The extension region 22 may include the first step region 22a, the second step region 22c, and the buffer region 22b between the first and second step regions 22a and 22c, as described above. The first step region 22a may be a region in which step portions may be formed of pad regions P of the upper gate electrodes GE_U sequentially lowered. The second step region 22c may be a region in which pad regions P may be positioned, and the pad regions P may be arranged to have a staircase shape lowering by the first level in the first direction from the memory cell array region 20 to the extension region 22, or a staircase shape rising or lowering by the second level lower than the first level in the second direction, perpendicular to the first direction.

A first pad through region TH1' may pass through the gate-stacked structure 370 of the buffer region 22b. A first gap-fill layer 160a may overlap the first pad through region TH1', and may pass through the upper substrate 150.

The first pad through region TH1' may have sides including stepped portions S1. Thus, the first pad through region TH1' may have the sides formed of a plurality of step portions. The pad through region TH1' may have a shape in which a width may increase toward an upper portion thereof in stages. A decreasing level difference between the step portions of the first pad through region TH1' may be substantially the same as a decreasing level difference between the pad regions P of the second step region 22c in the first direction from the memory cell array region 20 to the extension region 22.

A modified example of the staircase shape and the first pad through region TH1 will be described with reference to FIG. 12.

Figure 12:
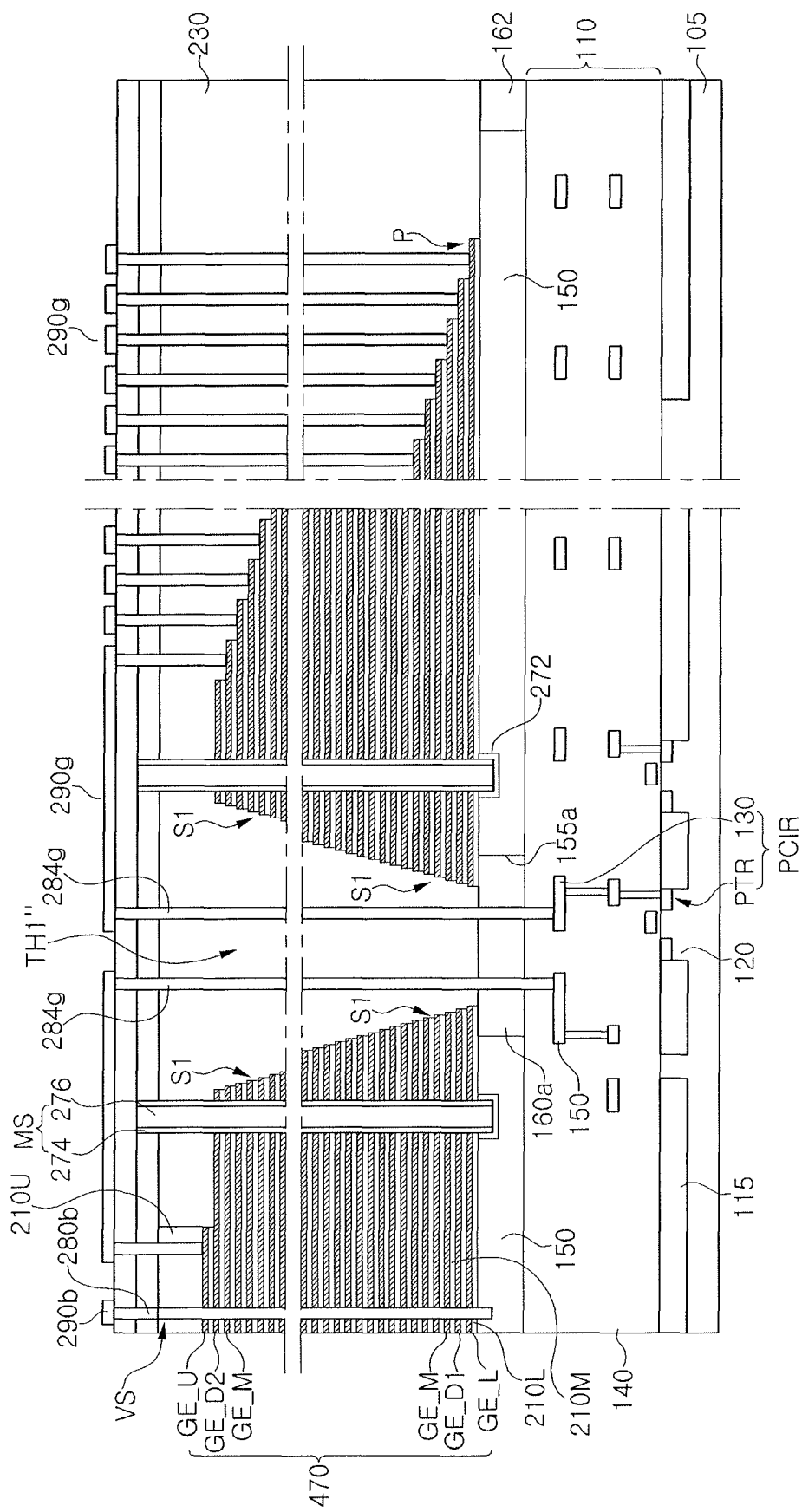
FIG. 12 illustrates a cross-sectional view of a modified example of a three-dimensional semiconductor device, according to an example embodiment.

FIG. 12 is a cross-sectional view illustrating a modified example of a three-dimensional semiconductor device, according to an example embodiment. Here, the modified example of the staircase shape and the first pad through region TH1 will mainly be described, and descriptions of the remaining constituent elements can be understood as being replaced with those described above. Thus, detailed descriptions thereof will be omitted.

Referring to FIG. 12, pad regions P of gate electrodes of a gate-stacked structure 470 may be arranged to have a staircase shape lowering by the first level in the direction away from the memory cell array region 20. The pad regions P, arranged to have such a staircase shape, may be step portions of the gate electrodes.

A first pad through region TH1", passing through the gate-stacked structure 470, may have a shape in which a width may increase toward an upper portion thereof. For example, sides of the first pad through region TH1" may include step portions S1 corresponding to the staircase shape of the gate electrodes of the gate-stacked structure 470. For example, when the step portions of the gate electrodes of the gate-stacked structure 470 gradually lower by the first level, the step portions S1 of the sides of the first pad through region TH1" may also gradually lower.

Figure 13A:
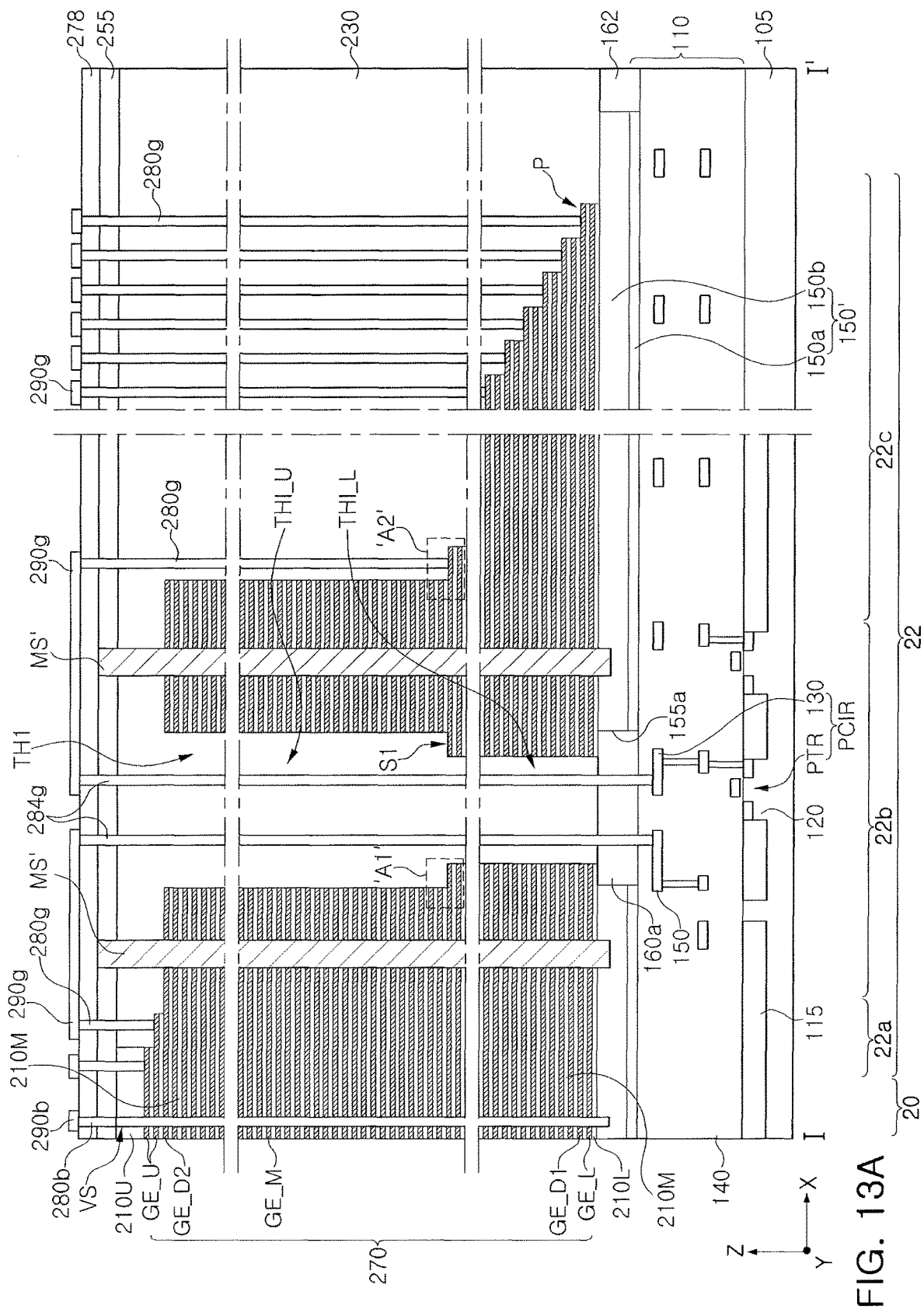
FIGS. 13A and 13B illustrate schematic cross-sectional views of a modified example of a semiconductor device, according to an example embodiment.
Figure 13B:
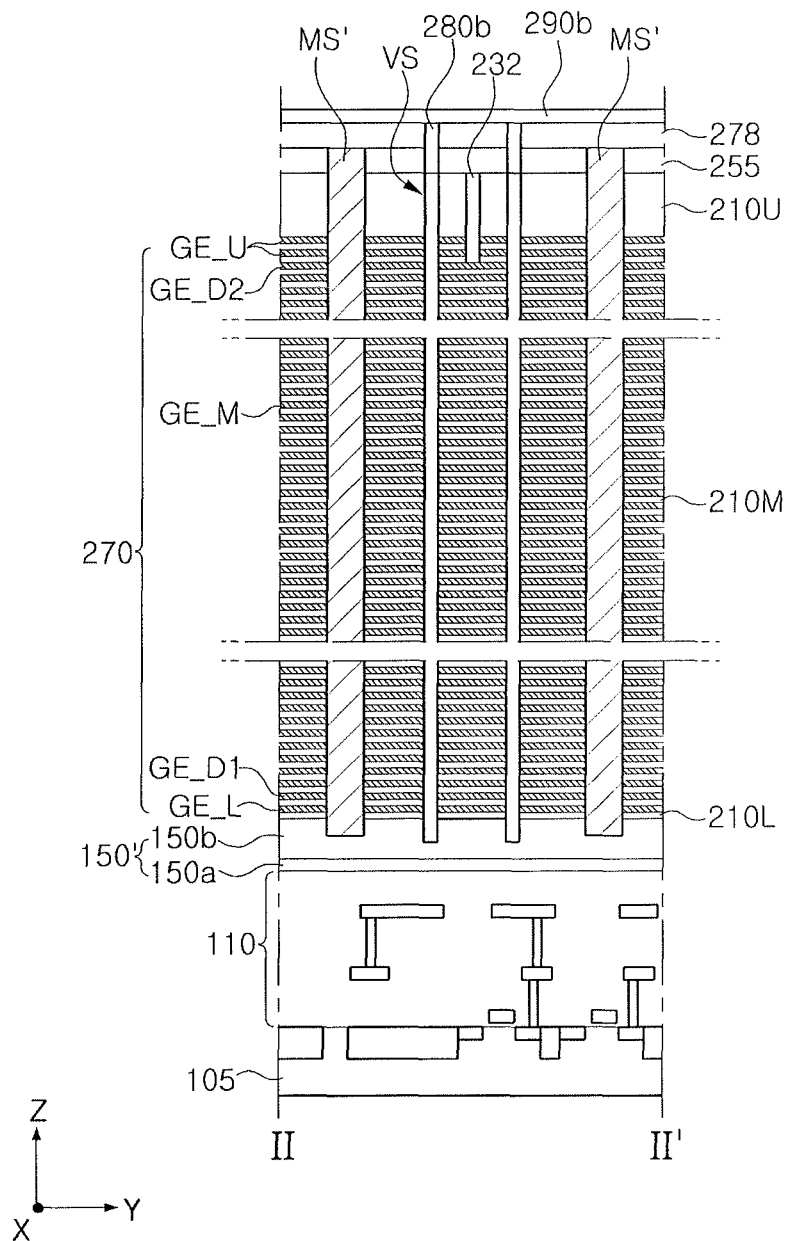

A modified example of the upper substrate 150 and/or the main separation structures MS, as described above, will be described with reference to FIGS. 13A and 13B. FIGS. 13A and 13B illustrate schematic cross-sectional views of a modified example of a semiconductor device, according to an example embodiment. FIG. 13A is a cross-sectional view taken along line I-I' of FIG. 3A, and FIG. 13B is a cross-sectional view taken along line II-II' of FIG. 3A. Here, the modified example of the upper substrate 150 and/or the main separation structures MS will mainly be described, and descriptions of the remaining constituent elements can be understood as being replaced with those described above. Thus, detailed descriptions thereof will be omitted.

Referring to FIGS. 13A and 13B, an upper substrate 150' may include a first region 150a and a second region 150b on the first region 150a. The first region 150a may formed of a conductive material. For example, the conductive material of the first region 150a may include a metal nitride (e.g., TiN, WN, or the like), a metal silicide (e.g., WSi, TiSi, TaSi, or the like), or a metal (e.g., W or the like). The second region 150b may be formed of polysilicon. For example, at least a portion of the second region 150b may be formed of polysilicon having n-type conductivity. The at least a portion of the second region 150b may be the common source line CSL of FIGS. 1 and 2 described above. The first region 150a may be spaced apart from the vertical channel structures VS. The second region 150b may contact a portion of each of the vertical channel structures VS.

In a modified example, a main separation structures MS' may formed of an insulating material. For example, the insulating material of the main separation structures MS' may be a silicon oxide, silicon oxynitride or silicon nitride.

As mentioned above with reference to FIGS. 3A through 13B, in an example embodiment, a plurality of first pad through regions TH1 may be disposed within the extension region 22 on one side of the memory cell array region 20. However, example embodiments are not limited thereto.

Figure 14:
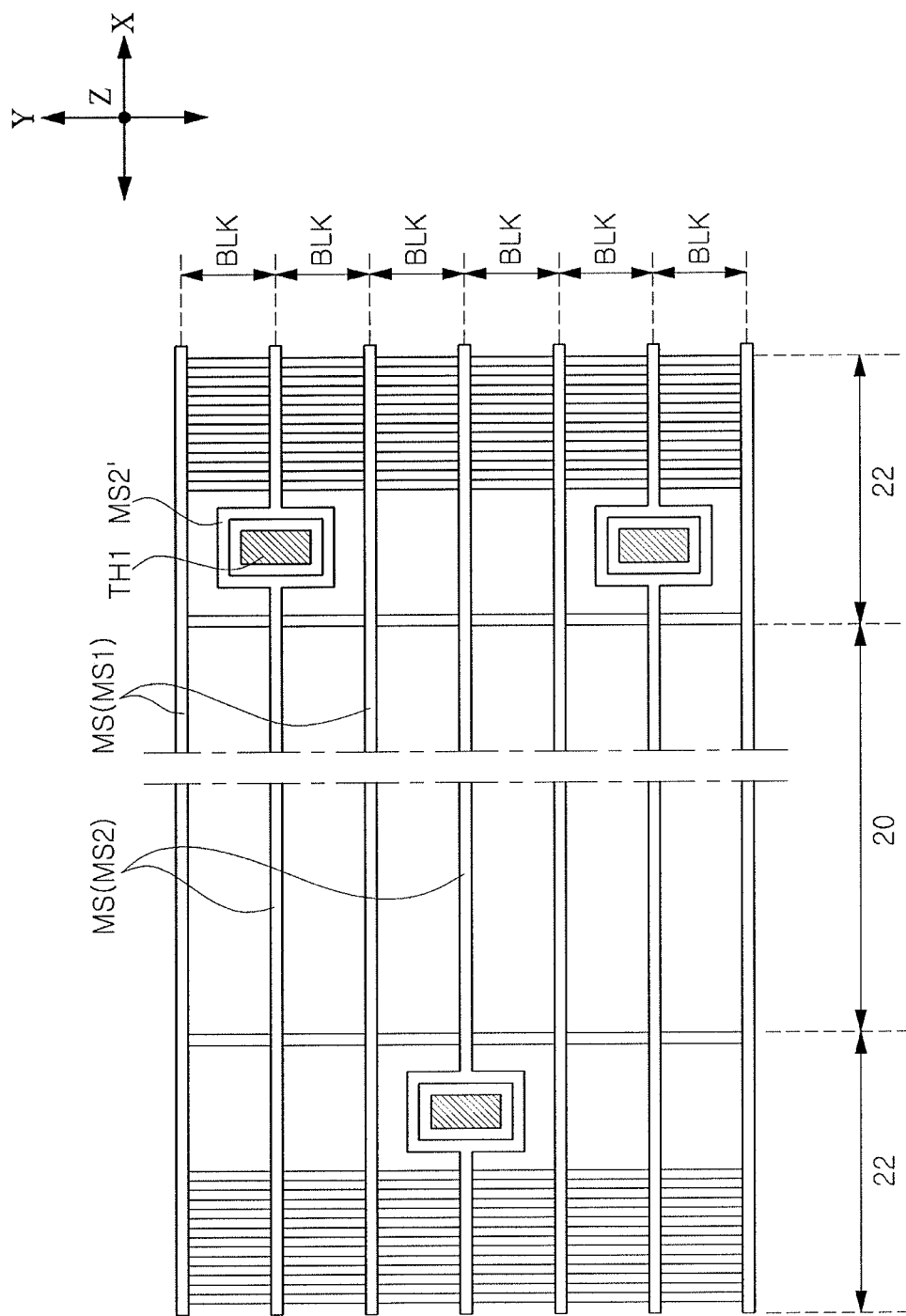
FIG. 14 illustrates a plan view of a modified example of a three-dimensional semiconductor device, according to an example embodiment.

A modified example of an arrangement of the first pad through regions TH1 will be described with reference to FIG. 14. FIG. 14 is a plan view illustrating a modified example of a three-dimensional semiconductor device, according to an example embodiment.

Referring to FIG. 14, extension regions 22 may be disposed on both sides of a memory cell array region 20. Thus, a single memory cell array region 20 may be disposed between a pair of extension regions 22.

The above-mentioned first pad through regions TH1 may be arranged in zigzag form within the pair of extension regions 22, with the memory cell array region 20 interposed between the first pad through regions TH1.

As previously described in FIGS. 3A through 14, each of the first pad through regions TH1 may be surrounded by the divided portion MS2' of the second main separation structure MS2. However, example embodiments are not limited thereto.

Figure 15:
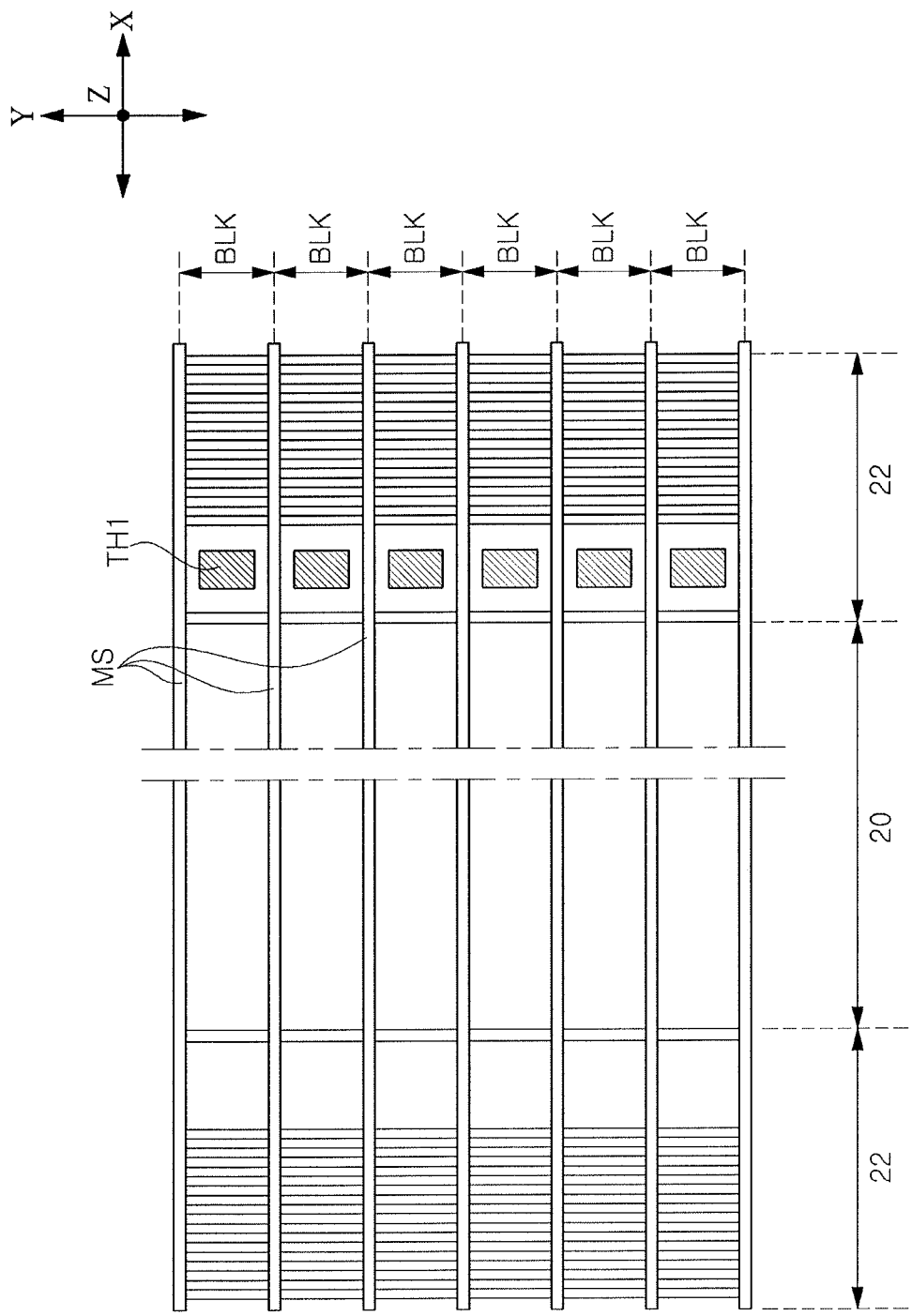
FIG. 15 illustrates a plan view of a modified example of a three-dimensional semiconductor device, according to an example embodiment.

Such a modified example will be described with reference to FIG. 15. FIG. 15 is a plan view illustrating a modified example of a three-dimensional semiconductor device, according to an example embodiment.

Referring to FIG. 15, extension regions 22 may be disposed on both sides of a memory cell array region 20. As described above, main separation structures MS may traverse the memory cell array region 20 and the extension regions 22. The main separation structures MS may have a line shape in which the main separation structures MS may be parallel to each other and spaced apart from each other.

First pad through regions TH1 may be disposed within an extension region 22 on one side of the memory cell array region 20. The first pad through regions TH1 may be disposed between the main separation structures MS having the line shape, within the extension region 22. The first pad through regions TH1 disposed between the main separation structures MS having the line shape, as described above, may be disposed within the extension region 22 on the one side of the memory cell array region 20. However, example embodiments are not limited thereto, and may be modified.

Figure 16:
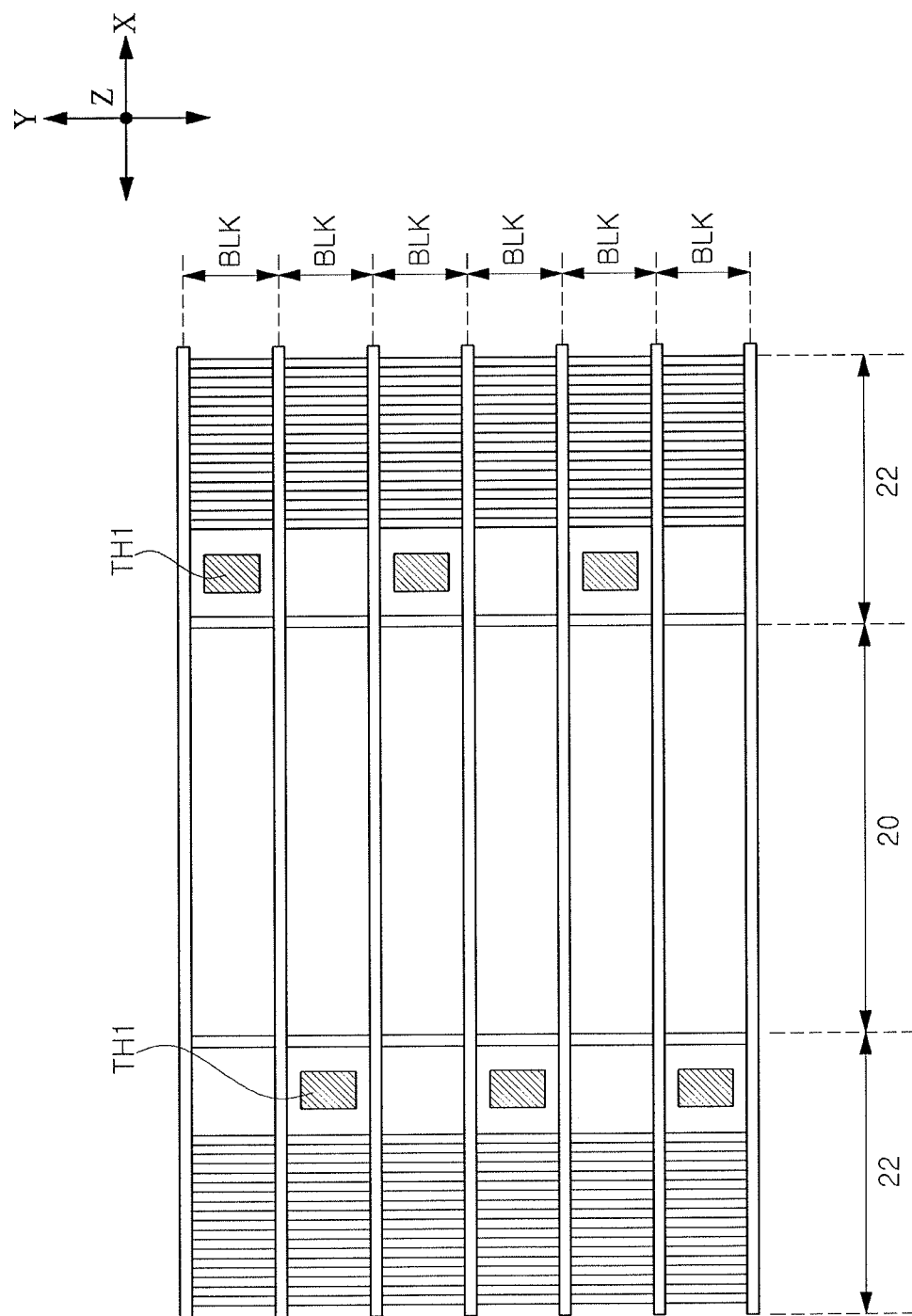
FIG. 16 illustrates a plan view of a modified example of a three-dimensional semiconductor device, according to an example embodiment.

A modified example of an arrangement of the first pad through regions TH1, as described above, will be described with reference to FIG. 16. FIG. 16 is a plan view illustrating a modified example of a three-dimensional semiconductor device, according to an example embodiment.

Referring to FIG. 16, first pad through regions TH1 may be disposed within main separation structures MS having a line shape, and may be arranged in zigzag form within extension regions 22 positioned on both sides of the memory cell array region 20. As described above with reference to FIGS. 15 and 16, the first pad through regions TH1 may be disposed between the main separation structures MS having the line shape, within the extension region 22.

Figure 17:
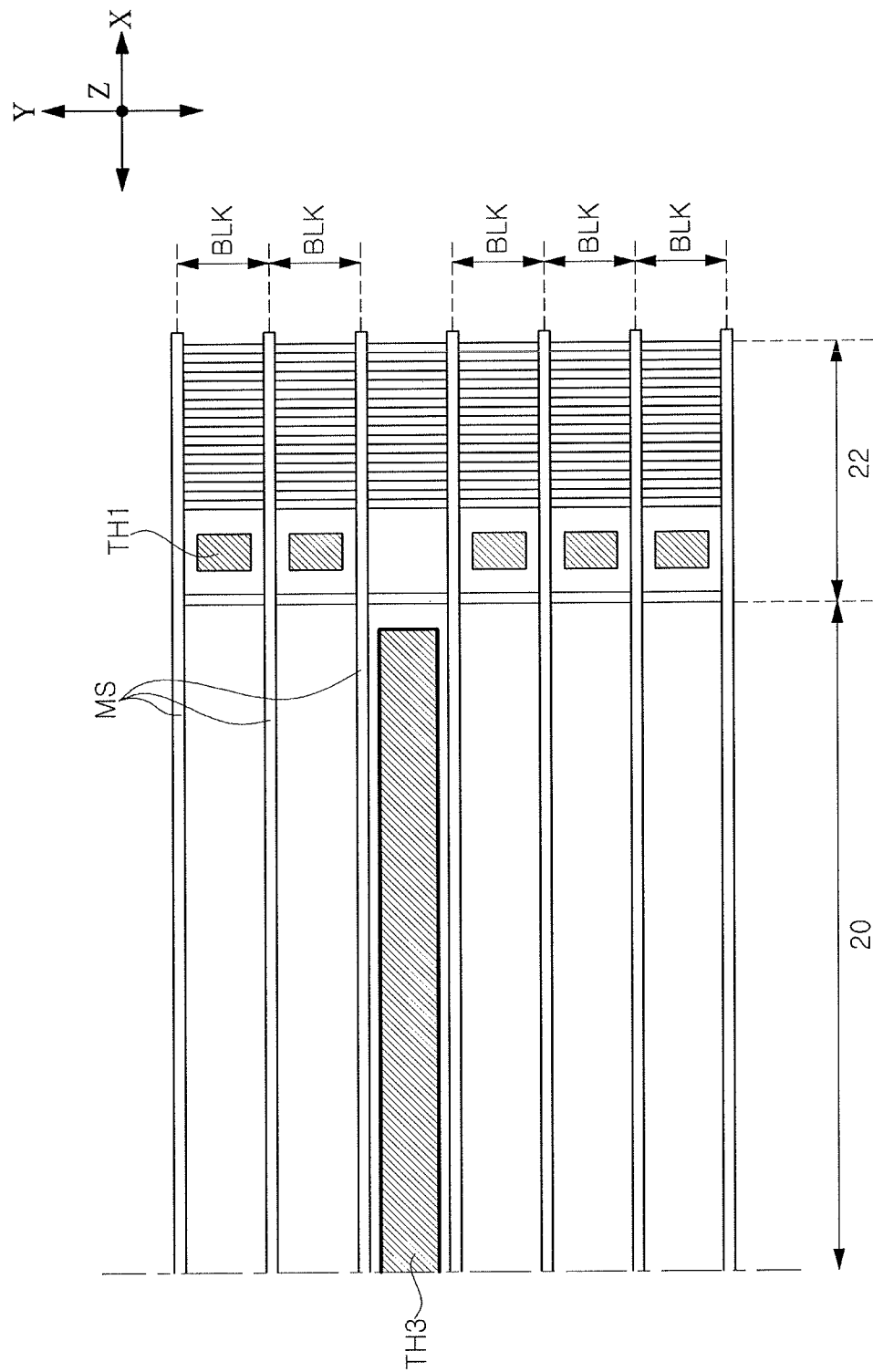
FIG. 17 illustrates a plan view of a modified example of a three-dimensional semiconductor device, according to an example embodiment.

An example of an extension region disposed between such main separation structures MS will be described with reference to FIG. 17. FIG. 17 is a plan view illustrating a modified example of a three-dimensional semiconductor device, according to an example embodiment.

Referring to FIG. 17, a memory through region TH3 as described above in FIG. 9 may be disposed between main separation structures MS having a line shape, within the memory cell array region 20. Thus, the memory through region TH3 may be disposed between the main separation structures MS, together with first pad through regions TH1, as described with reference to FIGS. 15 and 16.

Figure 18A:
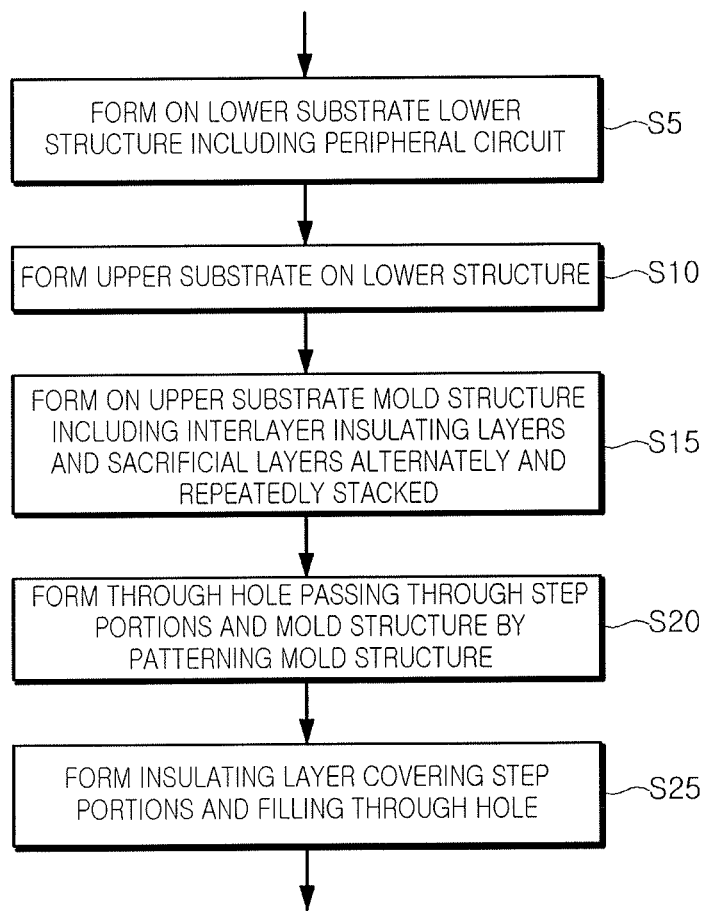
FIGS. 18A and 18B illustrate process flowcharts of a method of forming a three-dimensional semiconductor device, according to an example embodiment.
Figure 18B:
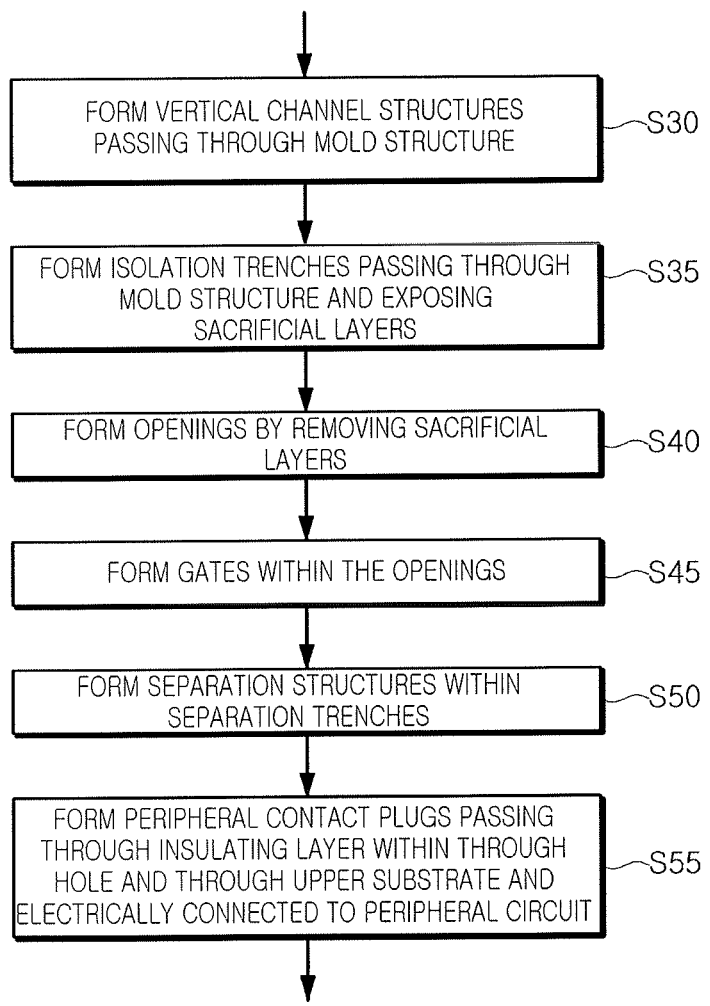
Figure 19:
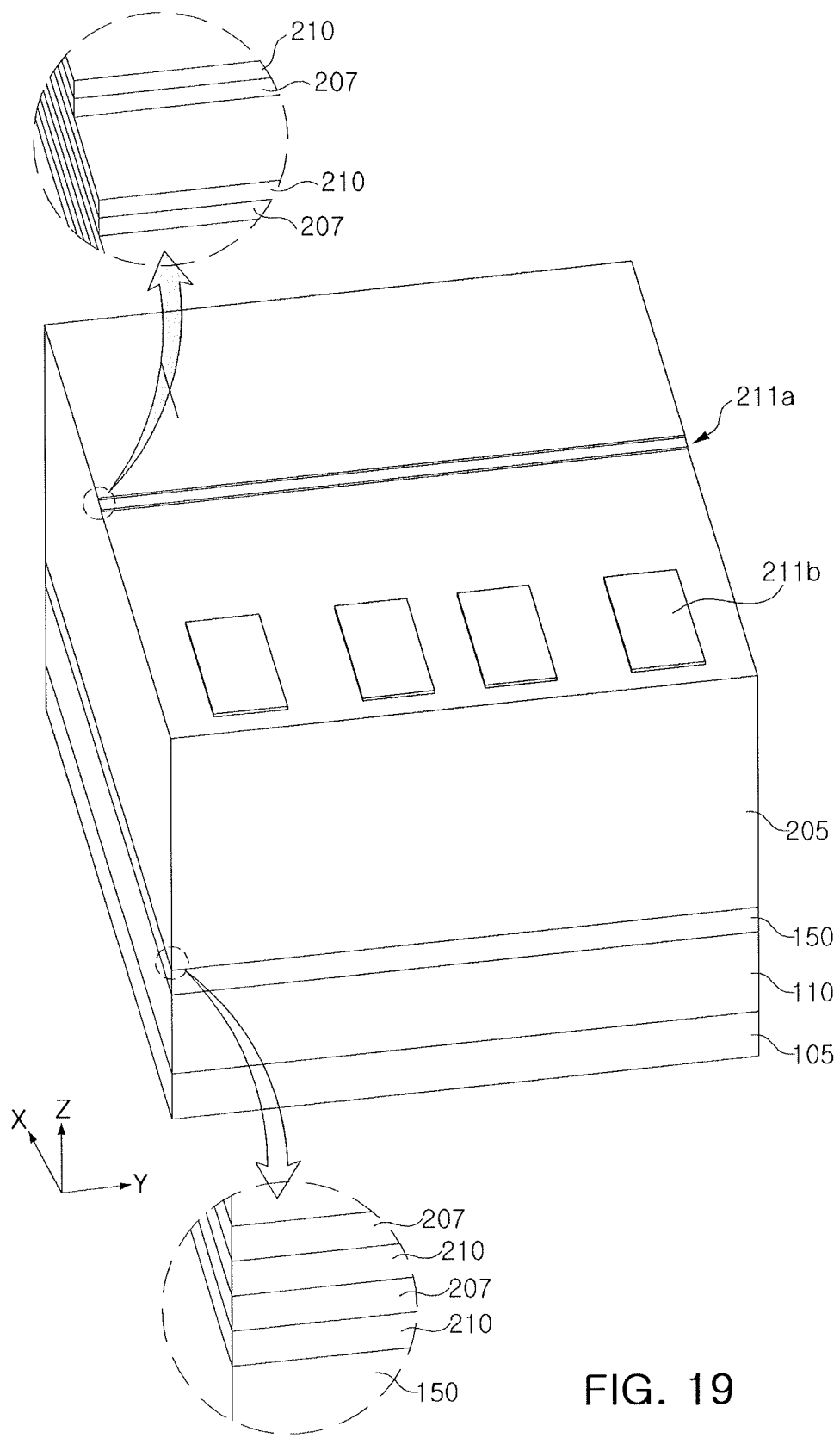
FIGS. 19, 20, 21, 22, 23, and 24 illustrate schematic perspective views of a method of forming a three-dimensional semiconductor device, according to an example embodiment.

An example of a method of forming a structure of the three-dimensional semiconductor device described above will be described with reference to FIGS. 18A, 18B, and 19 through 24. FIGS. 18A and 18B are process flowcharts illustrating the example of the method of forming the three-dimensional semiconductor device according to embodiments. FIGS. 19 and 24 are perspective views schematically illustrating stages in the method of forming the three-dimensional semiconductor device, according to an example embodiment.

Types or structures of materials of constituent elements mentioned below can be understood as those described above with reference to FIGS. 3A through 5, and detailed descriptions thereof will be omitted. Thus, detailed descriptions of primary constituent elements of the semiconductor device 10a described above with reference to FIGS. 3A through 5 will be omitted hereinafter, and a method of forming such primary constituent elements will mainly be described.

Referring to FIGS. 18A, 18B, and 19, the lower structure 110, including the peripheral circuit PCIR, may be formed on the lower substrate 105 (S5). An upper substrate 150 may be disposed on the lower structure 110 (S10).

Forming the upper substrate 150 may include forming a polysilicon substrate, forming substrate holes by patterning the polysilicon substrate, and forming an intermediate insulating layer 162 on a lateral surface of the patterned polysilicon substrate while forming a first gap-fill layer 160a and a second gap-fill layer 160b filling the substrate holes. Here, the patterned polysilicon substrate may be the upper substrate 150.

A mold structure 205, including interlayer insulating layers 210 and sacrificial layers 207 alternately and repeatedly stacked, may be formed on the upper substrate 150 (S15). An uppermost interlayer insulating layer of the interlayer insulating layers 210, and an uppermost sacrificial layer of the sacrificial layers 207 may be patterned to form a first step 211a. The first step 211a may have a shape corresponding to the staircase shape of the upper gate electrode GE_U of the gate-stacked structure 270 described above in FIGS. 3A through 5.

Subsequently, a second uppermost interlayer insulating layer of the interlayer insulating layers 210, and a second uppermost sacrificial layer of the sacrificial layers 207 may be patterned to form the first step 211a with an increased number of step portions, and uppermost mold patterns 211b. The uppermost mold patterns 211b may be formed within an extension region 22 on the upper substrate 150, and may be spaced apart from each other.

As described above in FIGS. 3A through 5, in the plan view, a direction from a memory cell array region 20 to the extension region 22 may be referred to as the first direction X, a direction perpendicular to the first direction X may be referred to as the second direction Y, and in the cross-sectional view, a direction perpendicular to a surface of the upper substrate 150 may be referred to as the third direction Z.

A level of a portion of the mold structure 205 in which the first step 211a and the uppermost mold patterns 211b may not be formed, may be low. In a modified example, in order to form the first step 211a and the uppermost mold patterns 211b, while a portion of the interlayer insulating layers 210 and a portion of the sacrificial layers 207 are etched, another portion of the interlayer insulating layers 210 and another portion of the sacrificial layers 207, of the mold structure 205, positioned within the memory cell array region 20 in which a memory through region, e.g., the memory through region TH3 of FIG. 9 described above in FIG. 9, is to be formed, may be etched.

Figure 20:
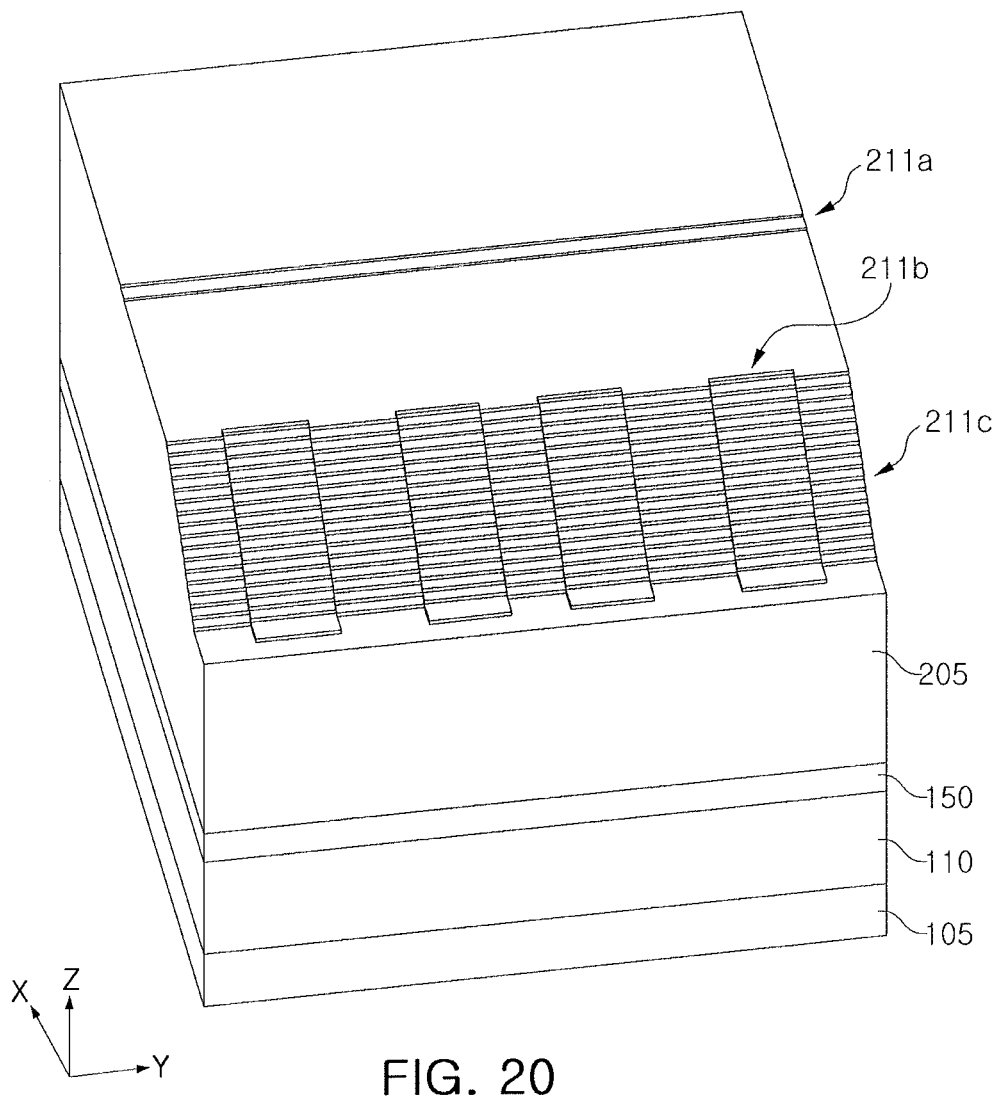

Referring to FIGS. 18A, 18B, and 20, the mold structure 205 may be patterned to form step portions 211c gradually lowering in the first direction X. The step portions 211c, as described above, may be formed from a portion of the uppermost mold patterns 211b adjacent to the memory cell array region 20 to another portion of the uppermost mold patterns 211b away from the memory cell array region 20. Here, the step portions 211c, gradually lowering in the first direction X, may be lowered by a thickness of two sacrificial layers 207 and two interlayer insulating layers 210.

Among the step portions 211c gradually lowering in the first direction X, some step portions positioned within a region overlapping the uppermost mold patterns 211b may be relatively higher than the remaining step portions. The step portions may be step portions of the sacrificial layers 207.

Figure 21:
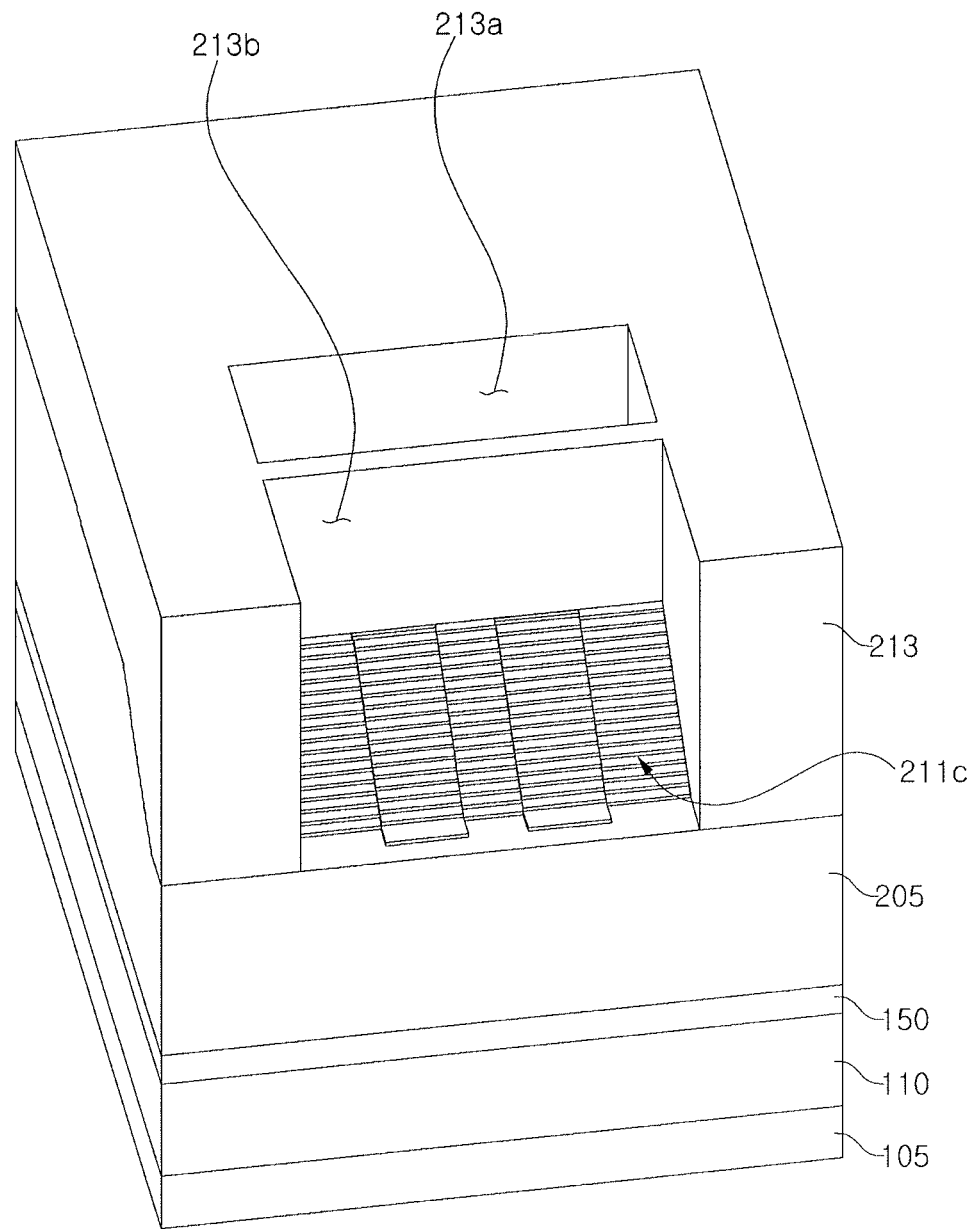

Referring to FIGS. 18A, 18B, and 21, a first photoresist pattern 213, having a first through opening portion 213a and a first step opening portion 213b, may be formed on the mold structure 205. The first through opening portion 213a may be disposed between the uppermost mold patterns 211b and the first step 211a. The first through opening portion 213a may be formed in a location in which the first pad through region TH1 described with reference to FIGS. 3A through 5 is to be formed.

In a modified example, the first through opening portion 213a may be formed as a plurality of first through opening portions 213a, and may be formed in a location in which the memory through region TH3 of FIG. 9 described above in FIG. 9, is to be formed.

Figure 22:
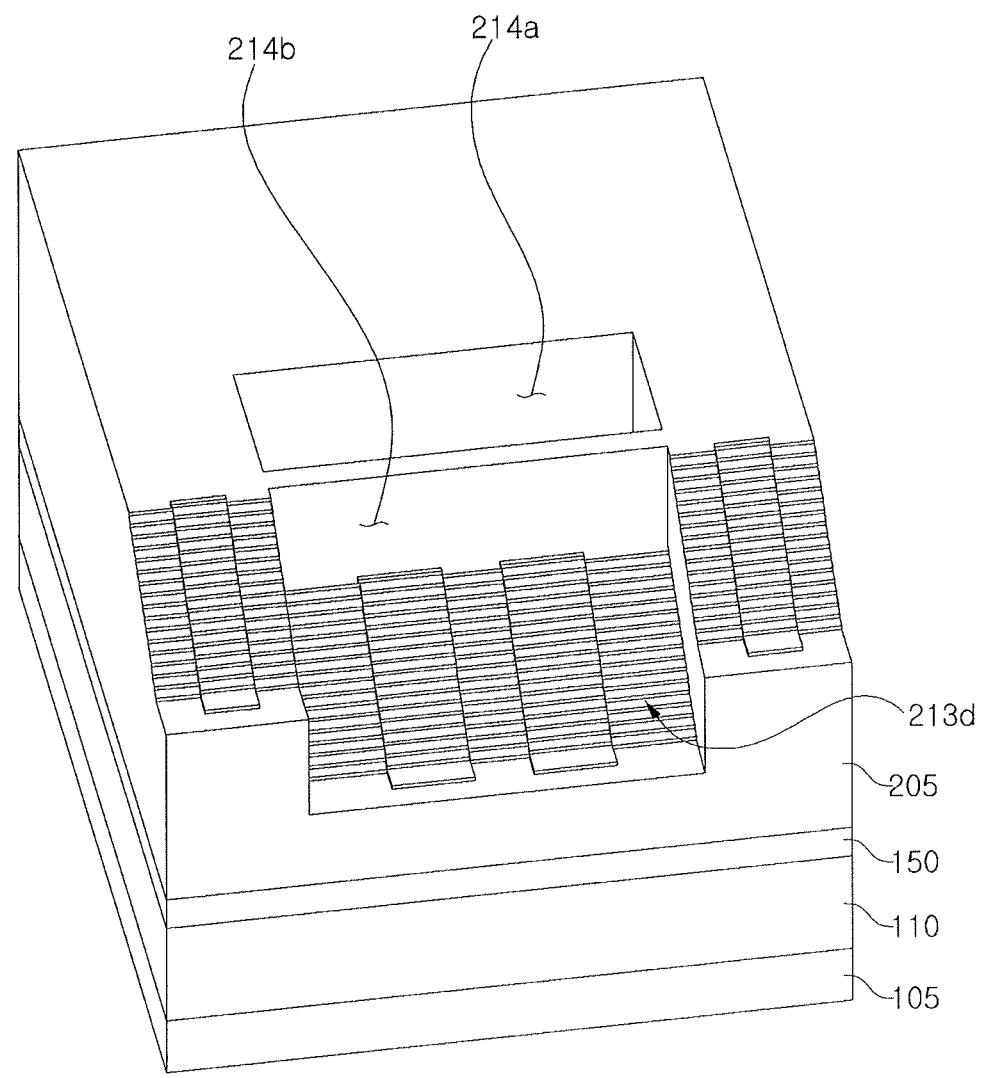

Referring to FIGS. 18A, 18B, and 22, a portion of the mold structure 205 may be etched using the first photoresist pattern 213 of FIG. 21 as an etching mask, to form a first through recess region 214a and a first step recess region 214b. The first through recess region 214a may be formed by etching a portion of the mold structure 205 positioned below the first through opening portion 213a of FIG. 21, and the first step recess region 214b may be formed by etching a portion of the mold structure 205 positioned below the first step opening portion 213b of FIG. 21.

Figure 23:
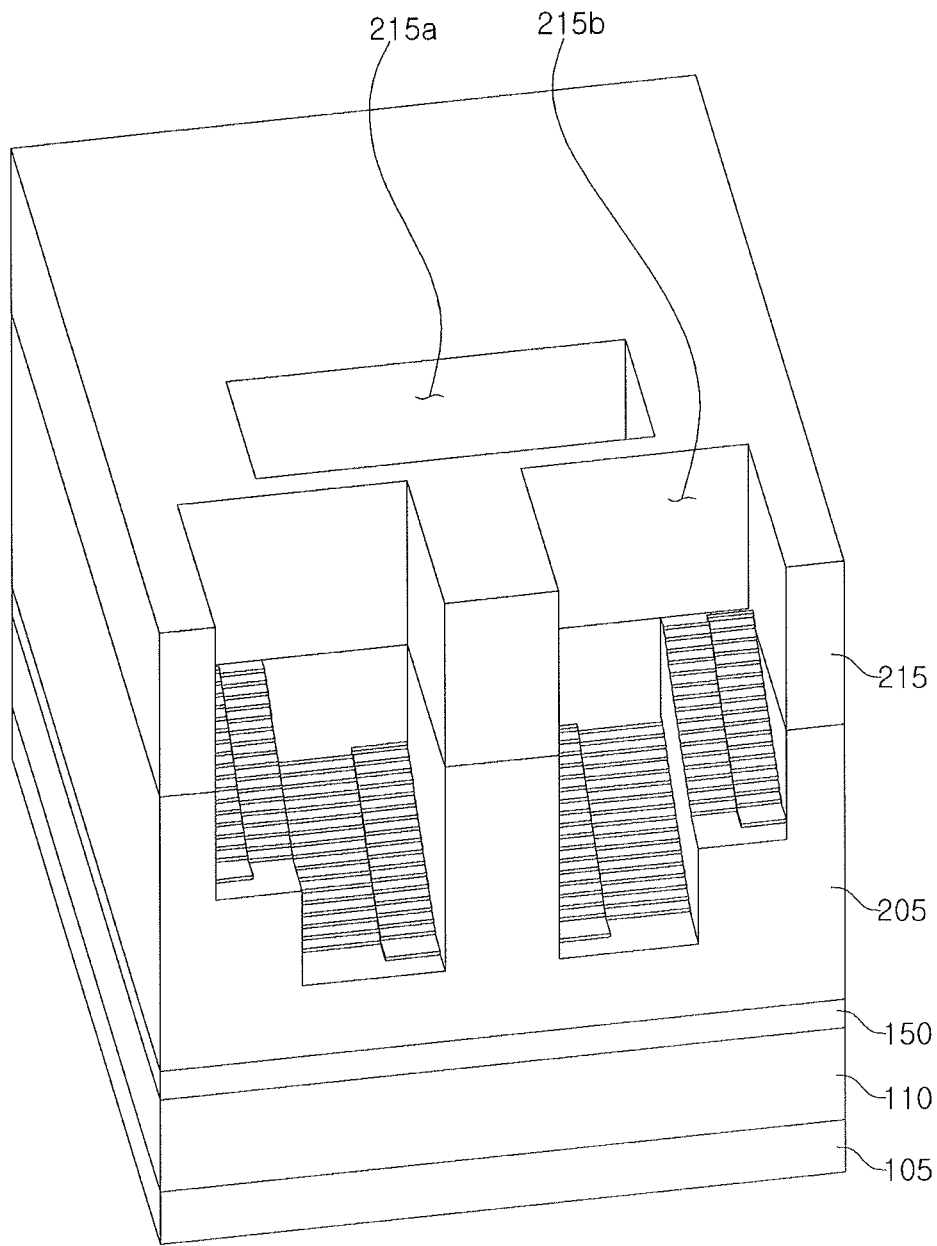
Figure 24:
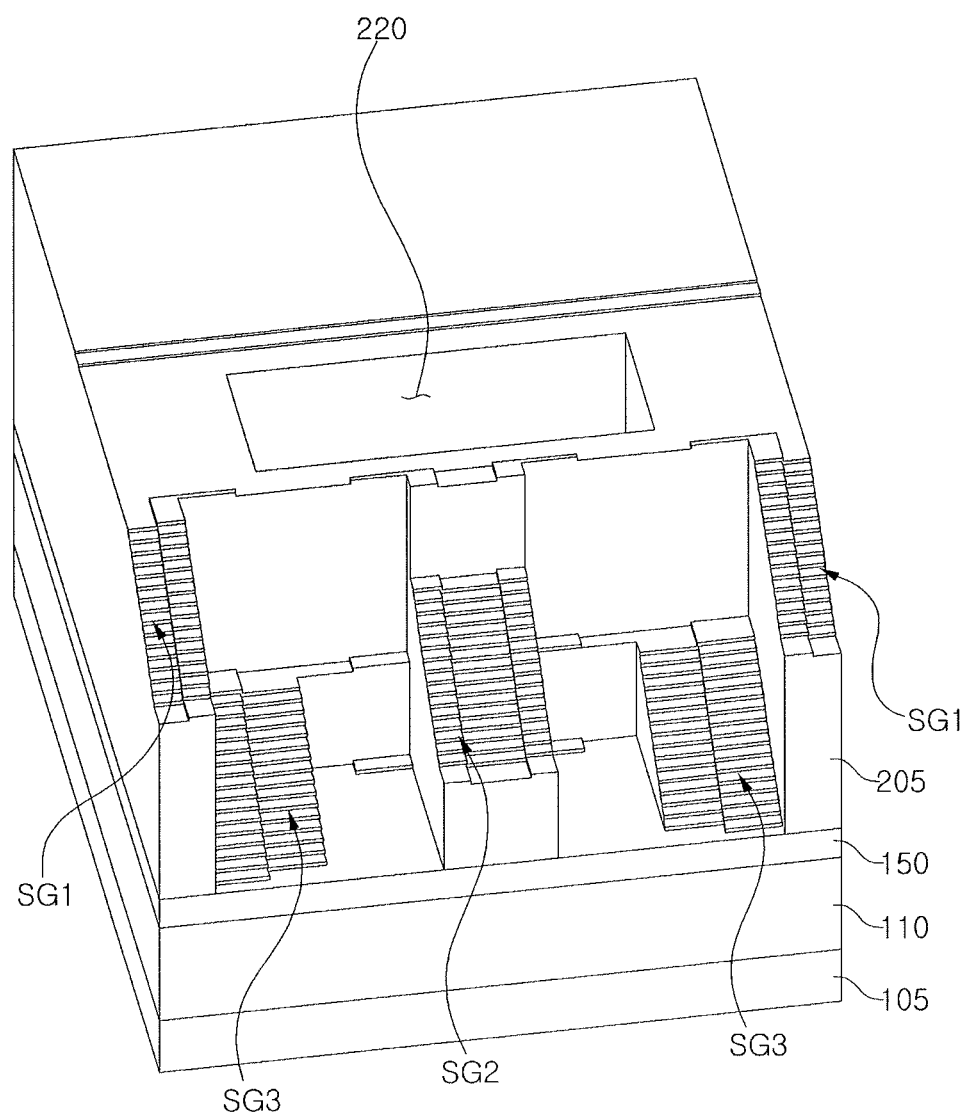

Referring to FIGS. 18A, 18B, and 23, a second photoresist pattern 215, having a second through opening portion 215a and second step opening portions 215b, may be formed on the mold structure 205. The second through opening portion 215a may be formed to have a width wider than the first through recess region 214a, while exposing an entirety of the first through recess region 214a. The second step opening portions 215b may be spaced apart from each other in the second direction Y. The second step opening portions 215b may be formed such that both lateral surfaces of the first step recess region 214b parallel to the first direction X may be positioned in central portions of the second step opening portions 215b.

Referring to FIGS. 18A, 18B, and 24, the mold structure 205 exposed by the second through opening portion 215a and the second step opening portions 215b may be etched using the second photoresist pattern 215 as an etching mask. The etching of the mold structure 205 may include etching the mold structure 205 until the upper substrate 150 may be exposed, and/or the first gap-fill layer 160a may be exposed, in a portion of the mold structure 205. The sacrificial layers 207 of the mold structure 205 formed in such a process may be formed to have step portions having a shape corresponding to the staircase shape of the pad regions P of the gate electrodes of the gate-stacked structure 270 described above with reference to FIGS. 3A through 5.

Further, a through hole 220 may be formed by etching the mold structure 205 exposed by the second through opening portion 215a. Such a through hole 220 may be formed as a plurality of through holes 220. Thus, as described above, the mold structure 205 may be patterned to form the through hole passing through the mold structure 205 and the step portions of the mold structure 205.

Referring again to FIGS. 18A, 18B, and 3A through 5, an insulating layer, filling the through hole while covering the step portions, may be formed (S25), and when the through hole is formed as a plurality of through holes, the insulating layer, filling the through holes, may form the upper insulating layer 230, while forming the first pad through region TH1 and/or the memory through region TH3, as described above with reference to FIGS. 3A through 5.

Vertical channel structures VS may be formed through the mold structure 205 (S30). The vertical channel structures VS may be the vertical channel structures VS, as described above with reference to FIGS. 3A through 5.

Subsequently, the first capping insulating layer 255, as described above with reference to FIGS. 3A through 5, may be formed, and separation trenches may be formed to pass through the first capping insulating layer 255 and the mold structure 205 and to expose the sacrificial layers 207 (S35). The sacrificial layers 207 may be removed to form openings (S40).

Gates may be formed within the openings (S45). The gates may be the gate electrodes of the gate-stacked structure 270 and the second gate dielectric 268, as described above with reference to FIGS. 6A through 13B.

The impurity regions 272, as described above with reference to FIGS. 3A through 5, may be formed below the separation trenches. Separation structures may be formed within the separation trenches (S50). The separation structures may be the main separation structures MS and the auxiliary separation structures SS described above with reference to FIGS. 3A through 13B. Subsequently, the second capping insulating layer 278, as described above with reference to FIGS. 3A through 5, may be formed.

Subsequently, peripheral contact plugs may be formed to pass through an insulating layer within the through hole, for example, the first pad through region TH1, and the upper substrate 150, and to be electrically connected to the peripheral circuit PCIR (S55). The peripheral contact plugs may be the gate peripheral contact plugs 284g and/or the bit line peripheral contact plug 284b.

Subsequently, the upper wirings, as described above with reference to FIGS. 3A through 5, may be formed. The upper wirings may be the gate connection wirings 290g and the bit lines 290b.

Subsequently, an example of a method of forming a step and a through region such that a width of the step in one direction and a width of a stepped portion of the through region in one direction, as described above in FIGS. 3 through 13, may be different from each other, will be described with reference to FIGS. 25A through 31B.

FIGS. 25A, 26A, 27A, 28A, 29A, 30A, and 31A are cross-sectional views schematically illustrating a portion of a step region STR to illustrate an example of a method of forming a portion of step portions, and FIGS. 25B, 26B, 27B, 28B, 29B, 30B, and 31B are cross-sectional views schematically illustrating a portion of a through region THR to illustrate an example of a method of forming a side of the through region THR. It can be understood that shapes and sizes of the gate electrodes and the through region may be determined, depending on a patterned shape of the sacrificial layers 207 of the mold structure 205 in the method of forming the three-dimensional semiconductor device described above with reference to FIGS. 18A through 24. Thus, a method of patterning the sacrificial layers 207 will mainly be described hereinafter, but shapes of the through region passing through the gate electrodes of the three-dimensional semiconductor device, and of the step portions of the gate electrodes, as described above, may be understood from such a method.

Referring to 25A and 25B, an upper substrate 150, having a first gap-fill layer 160a formed thereon, may be provided. A mold structure 205, including interlayer insulating layers 210 and sacrificial layers 207 alternately and repeatedly stacked, may be formed on the upper substrate 150.

A first photoresist pattern 415a may be formed on the mold structure 205. A portion of the mold structure 205 may be etched using the first photoresist pattern 415a as an etching mask.

Figure 25A:
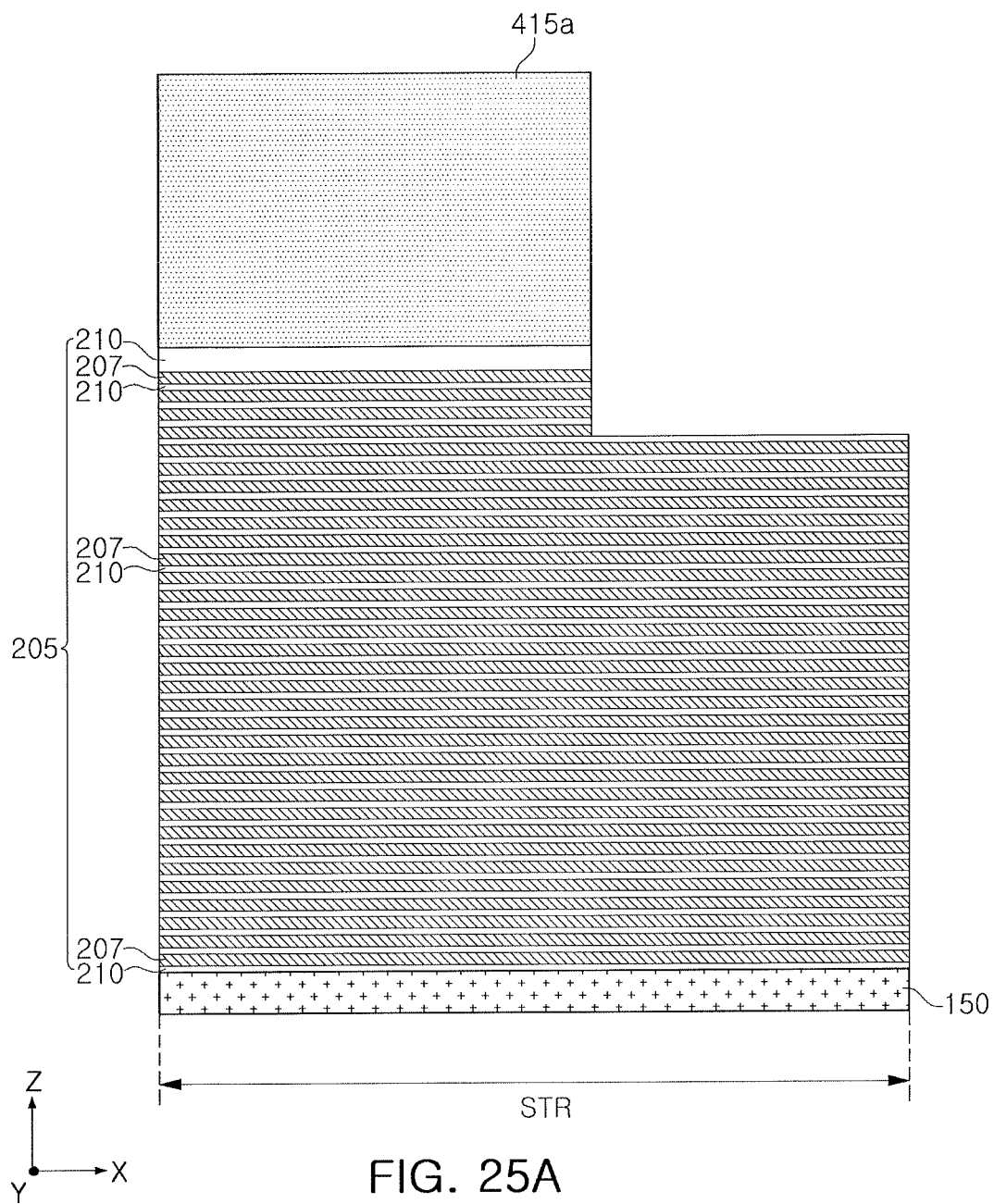
FIGS. 25A, 25B, 26A, 26B, 27A, 27B, 28A, 28B, 29A, 29B, 30A, 30B, 31A, and 31B illustrate schematic cross-sectional views of a method of forming a three-dimensional semiconductor device, according to an example embodiment.
Figure 25B:
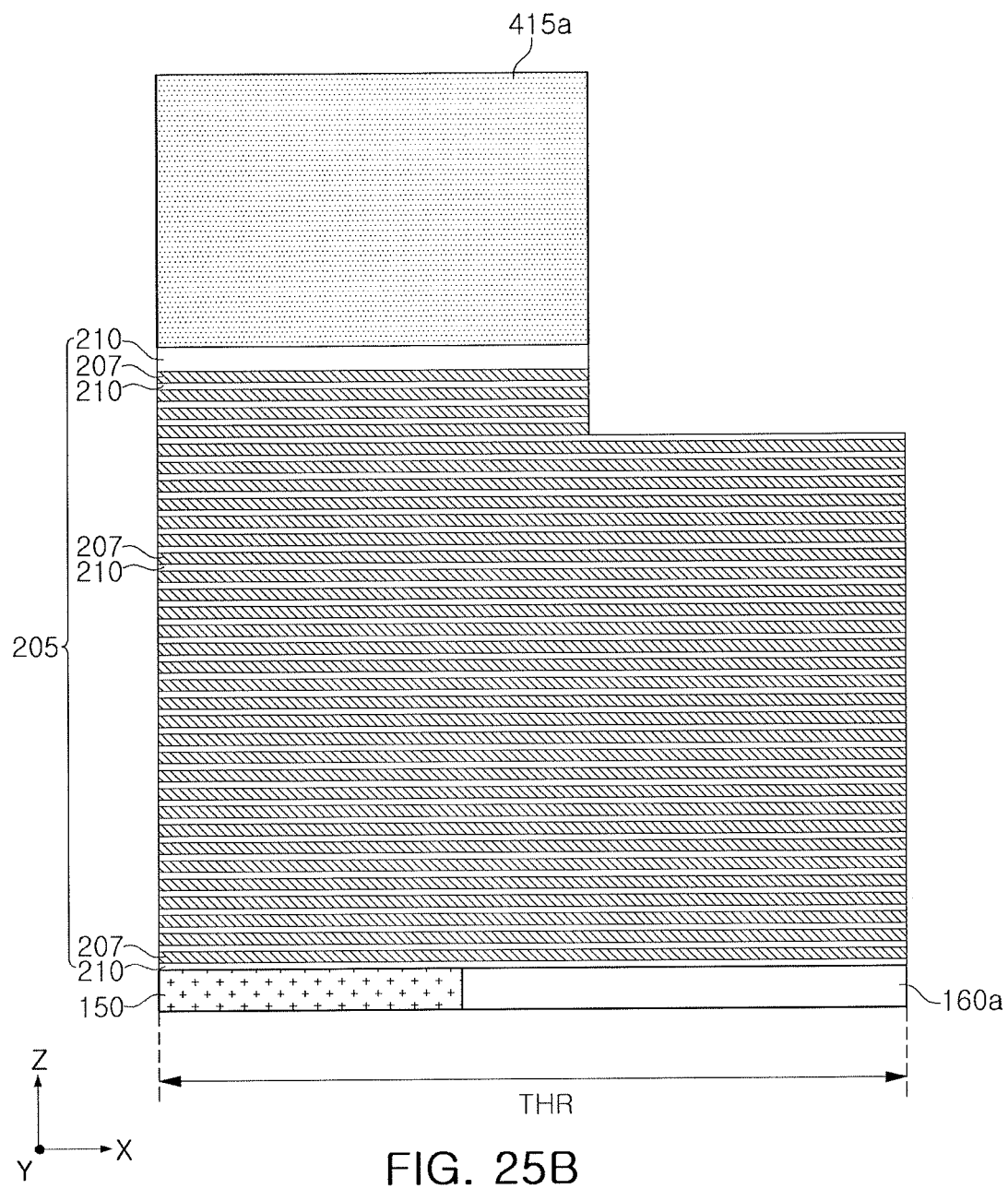

FIGS. 25A and 25B illustrate etching of four sacrificial layers 207 sequentially stacked, but example embodiments are not limited thereto. For example, depending on a staircase shape to be formed, a single sacrificial layer may be etched, or the different number of sacrificial layers may also be etched.

Figure 26A:
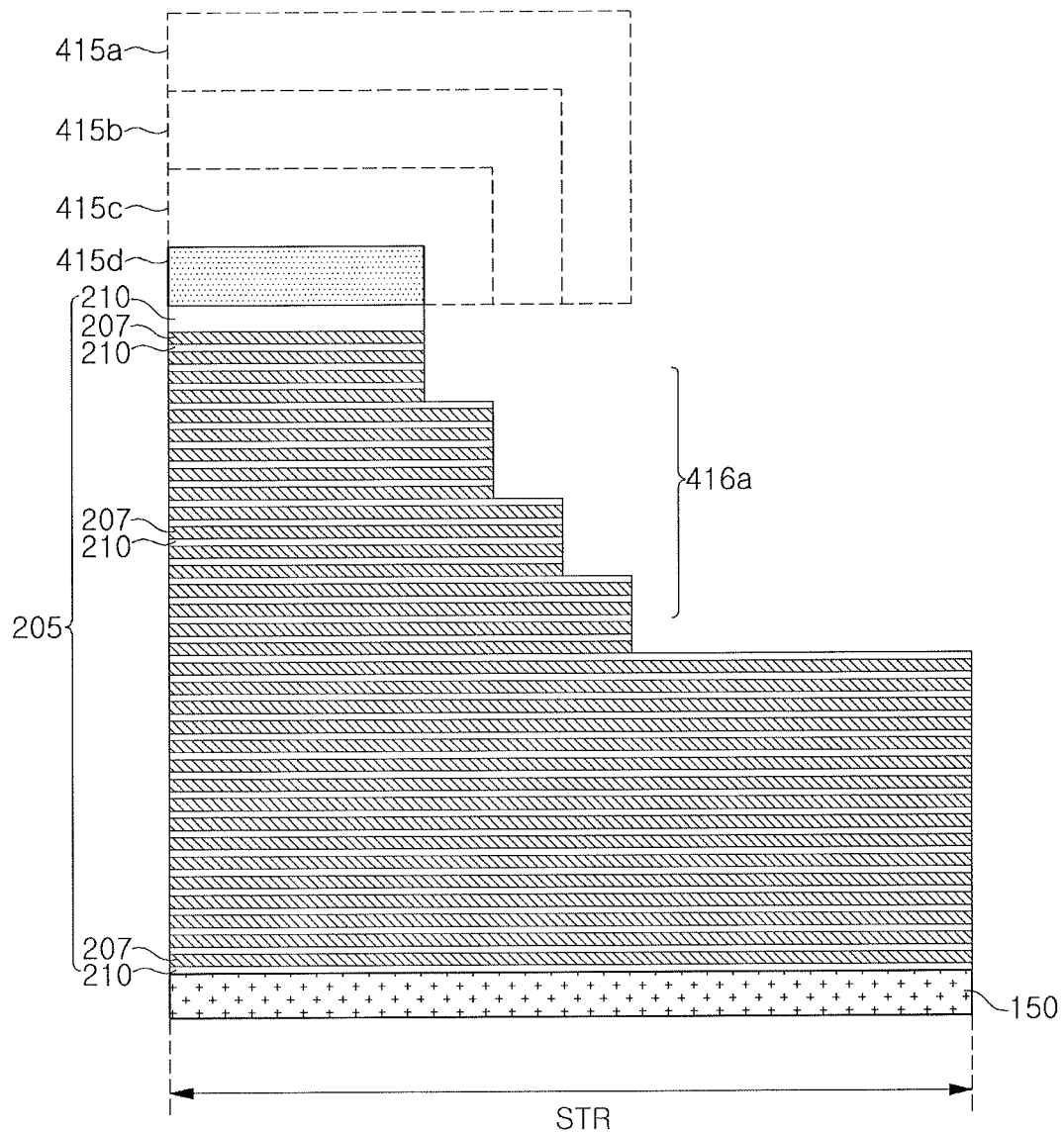
Figure 26B:
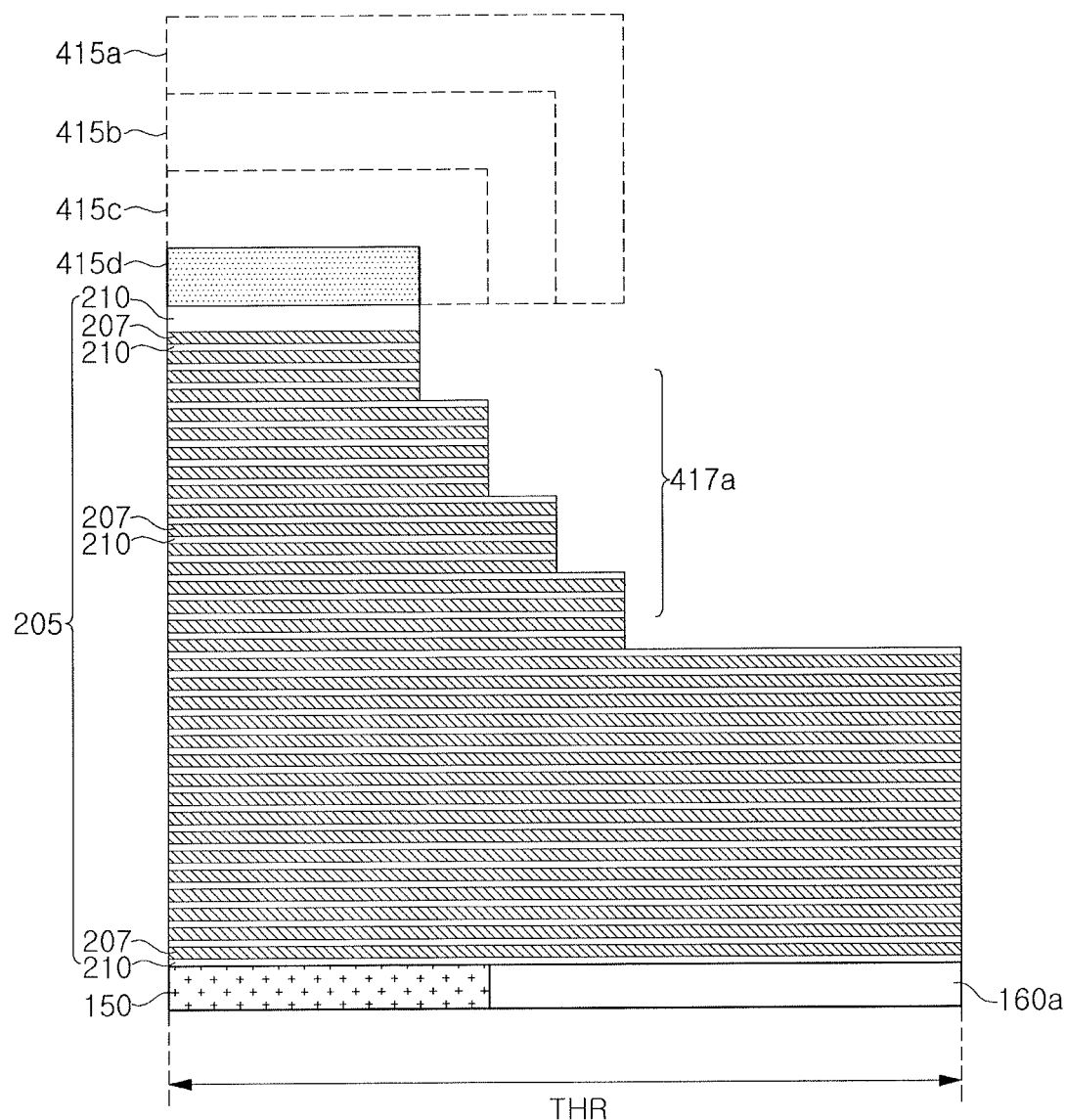
Figure 27A:
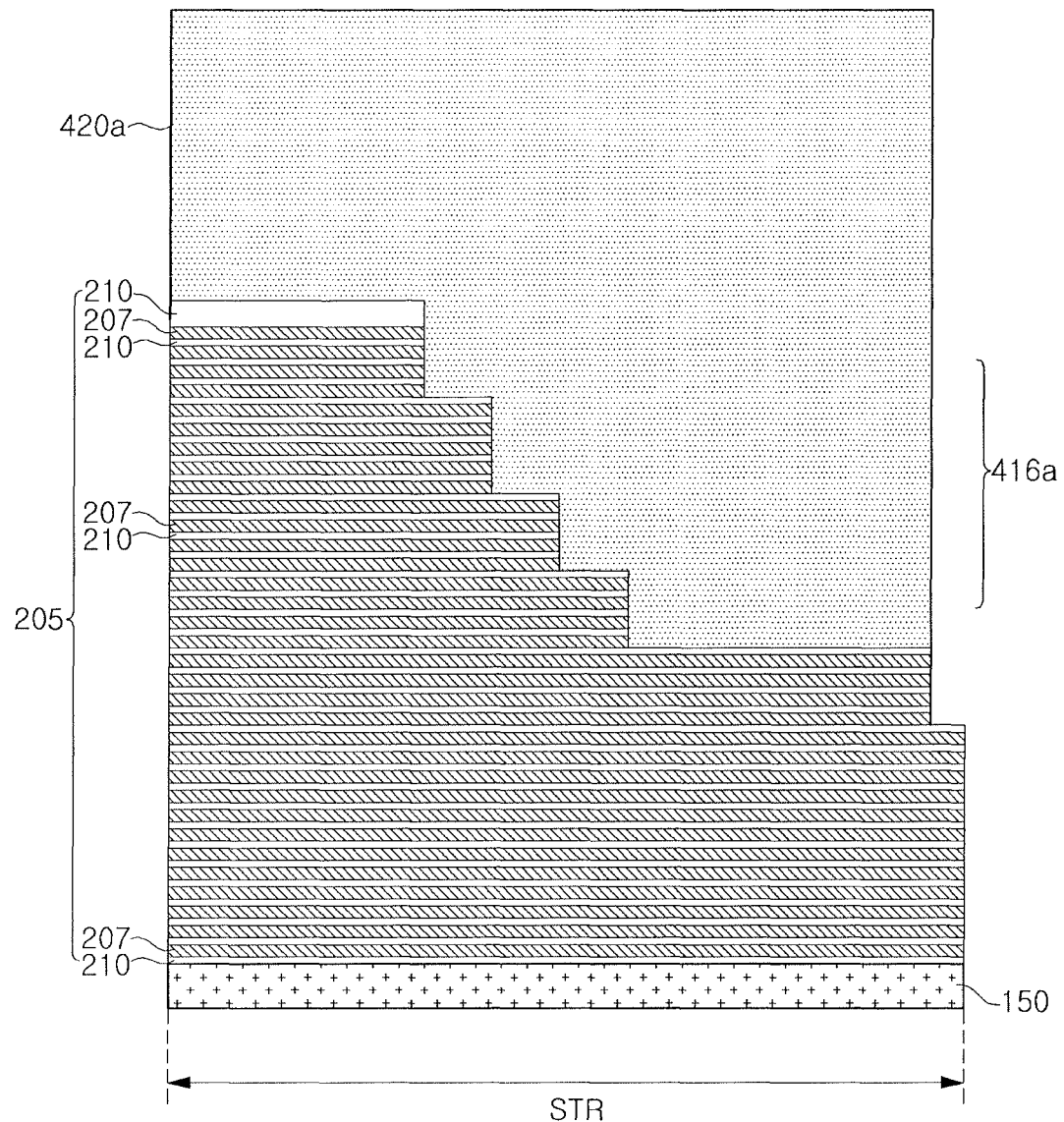
Figure 27B:
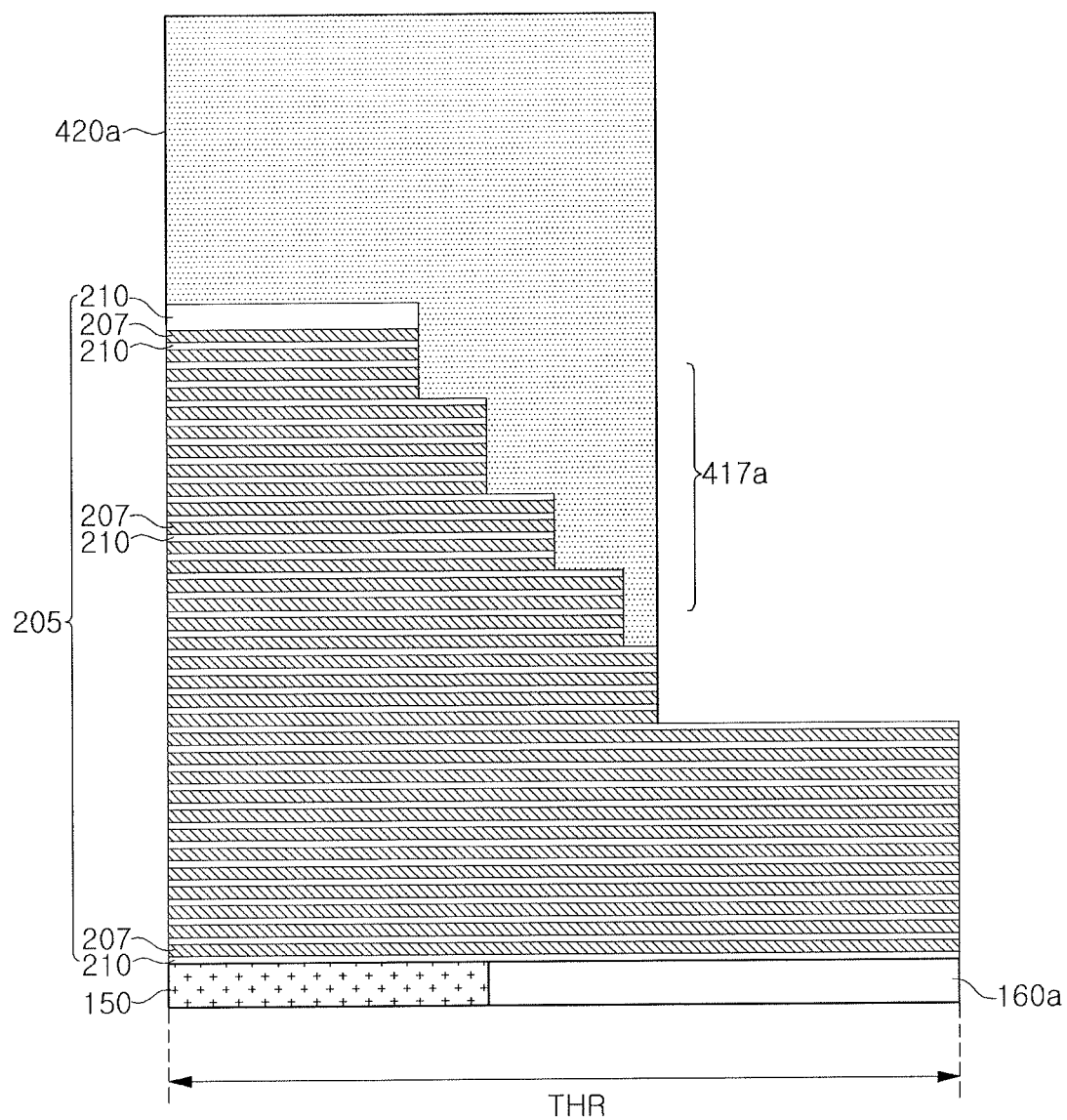
Figure 28A:
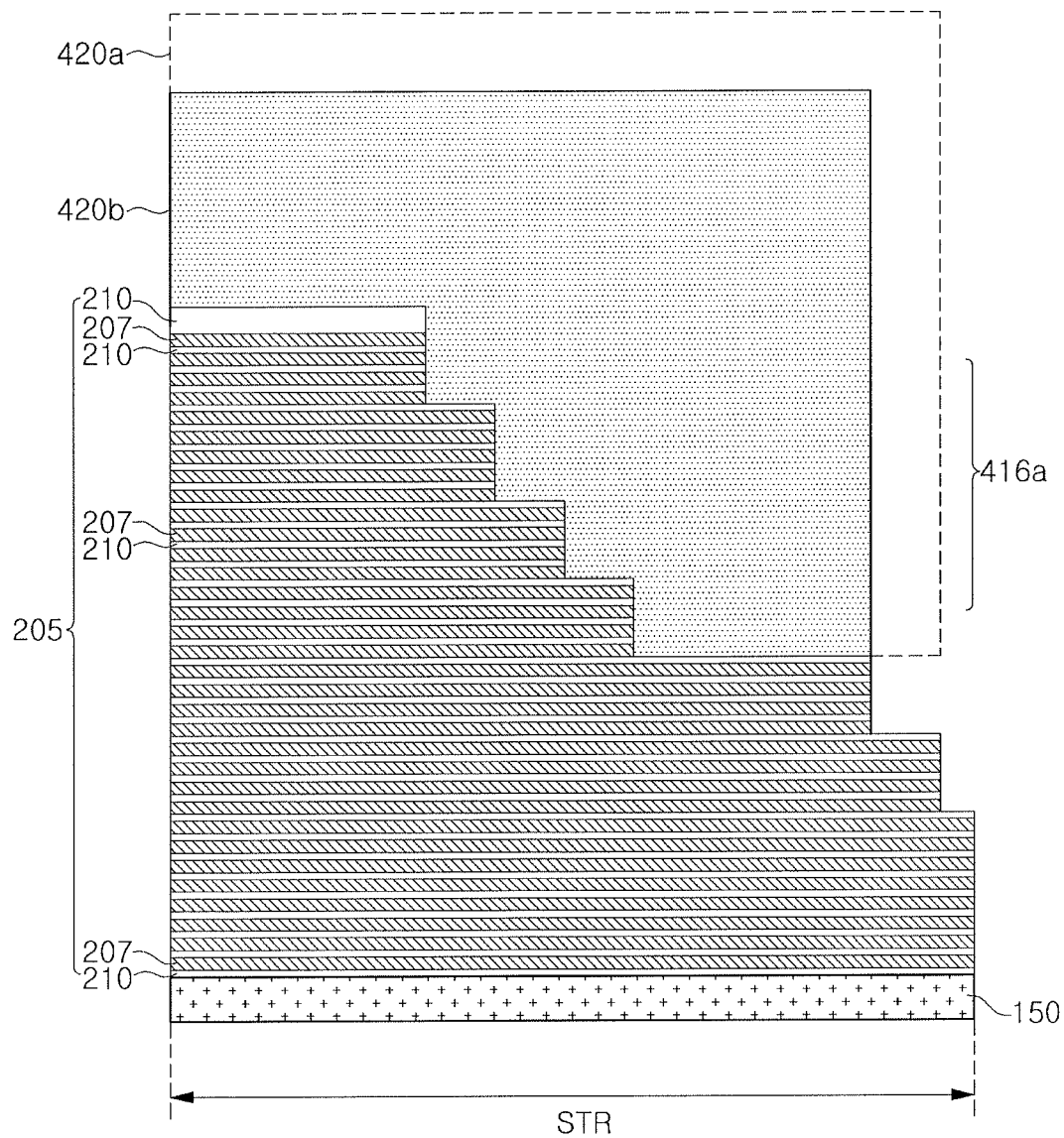
Figure 28B:
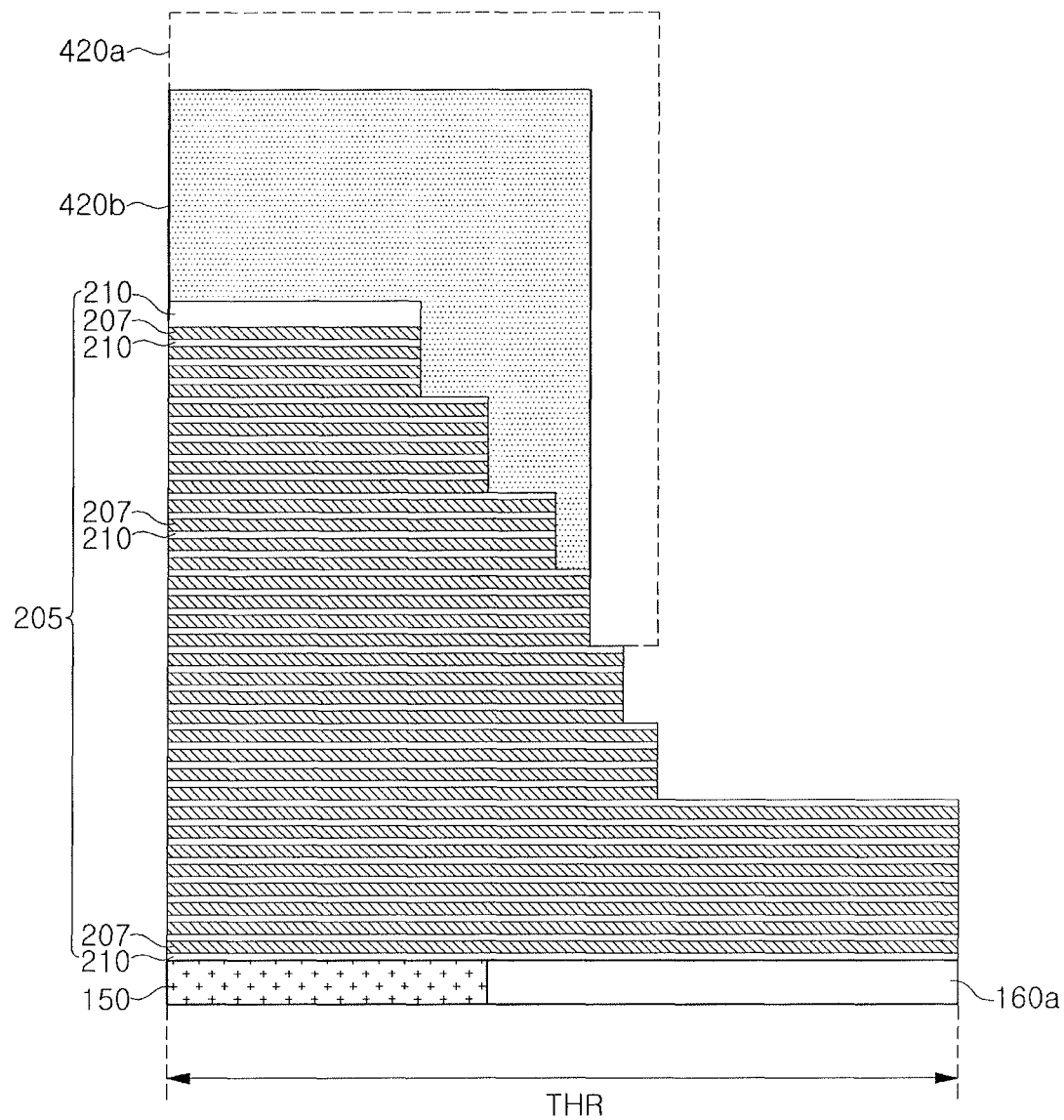
Figure 29A:
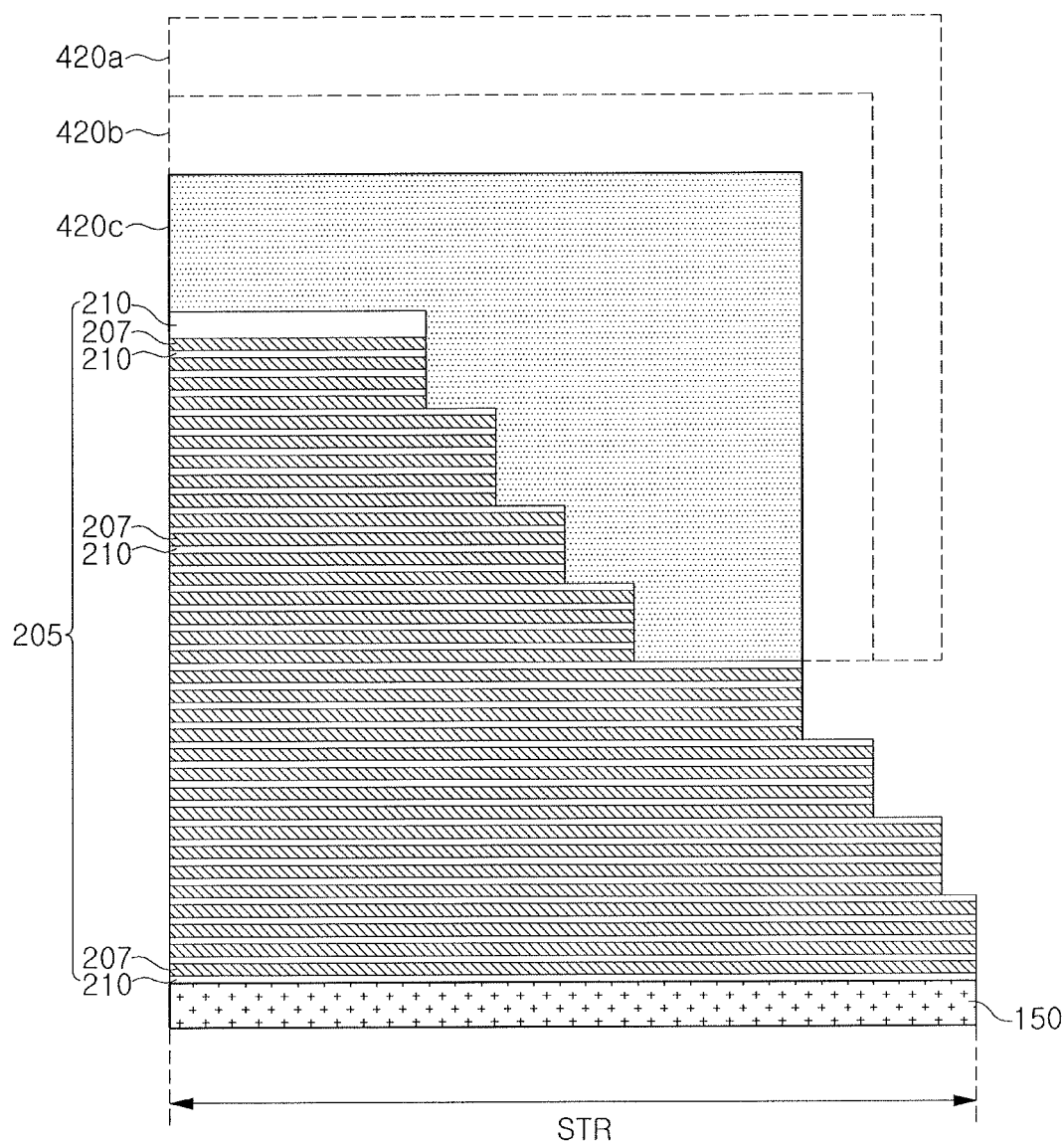
Figure 29B:
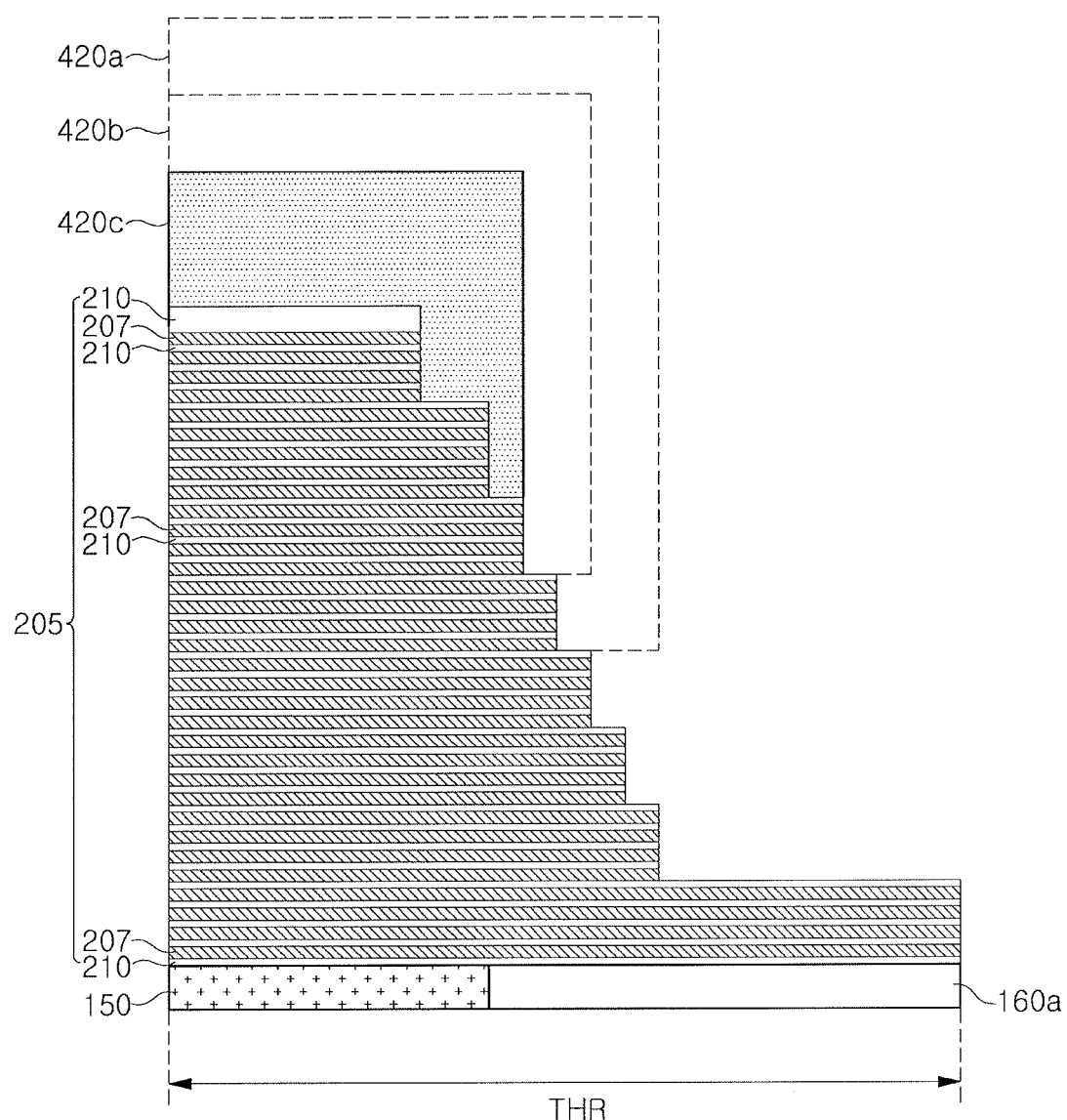
Figure 30A:
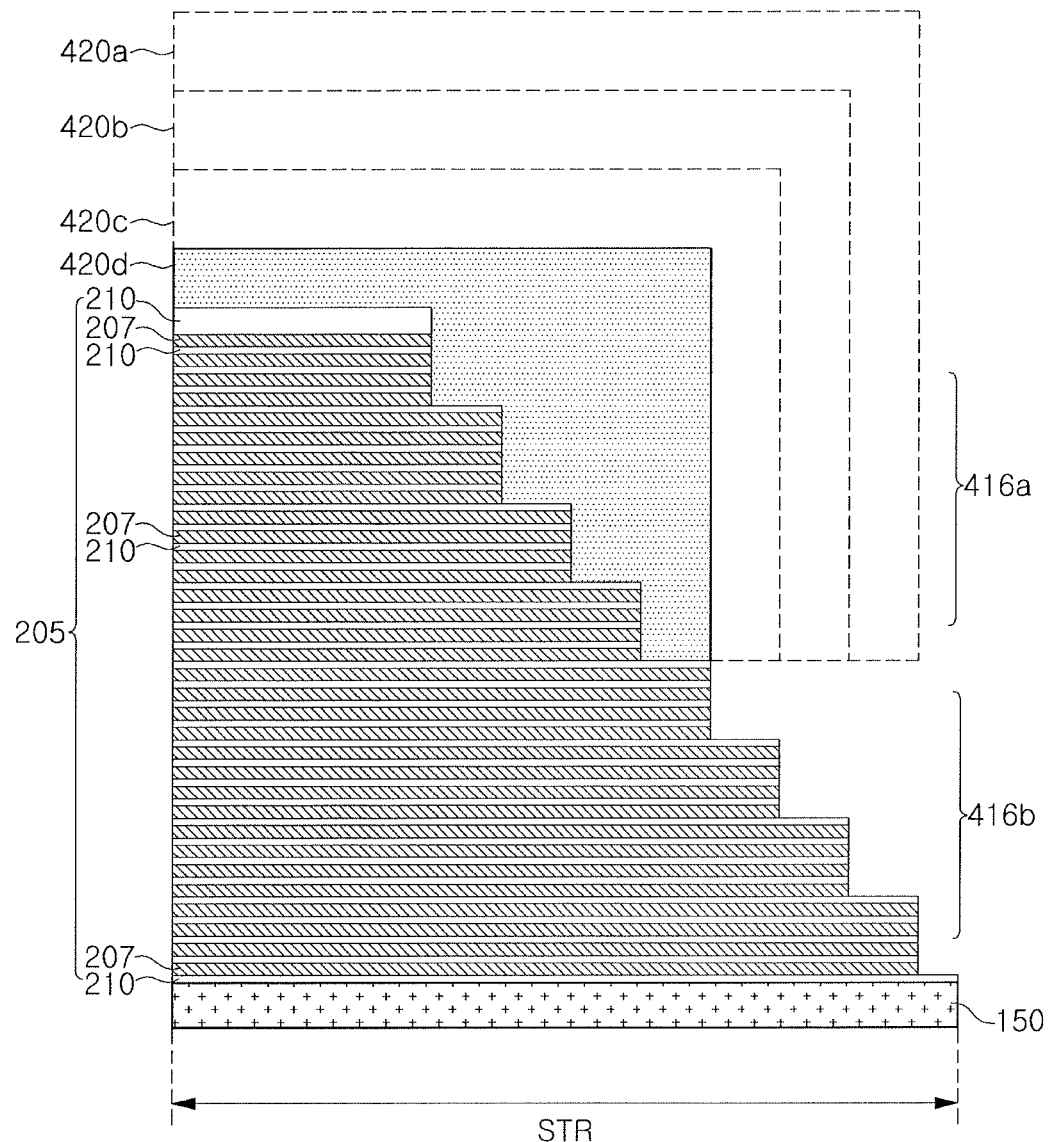
Figure 30B:
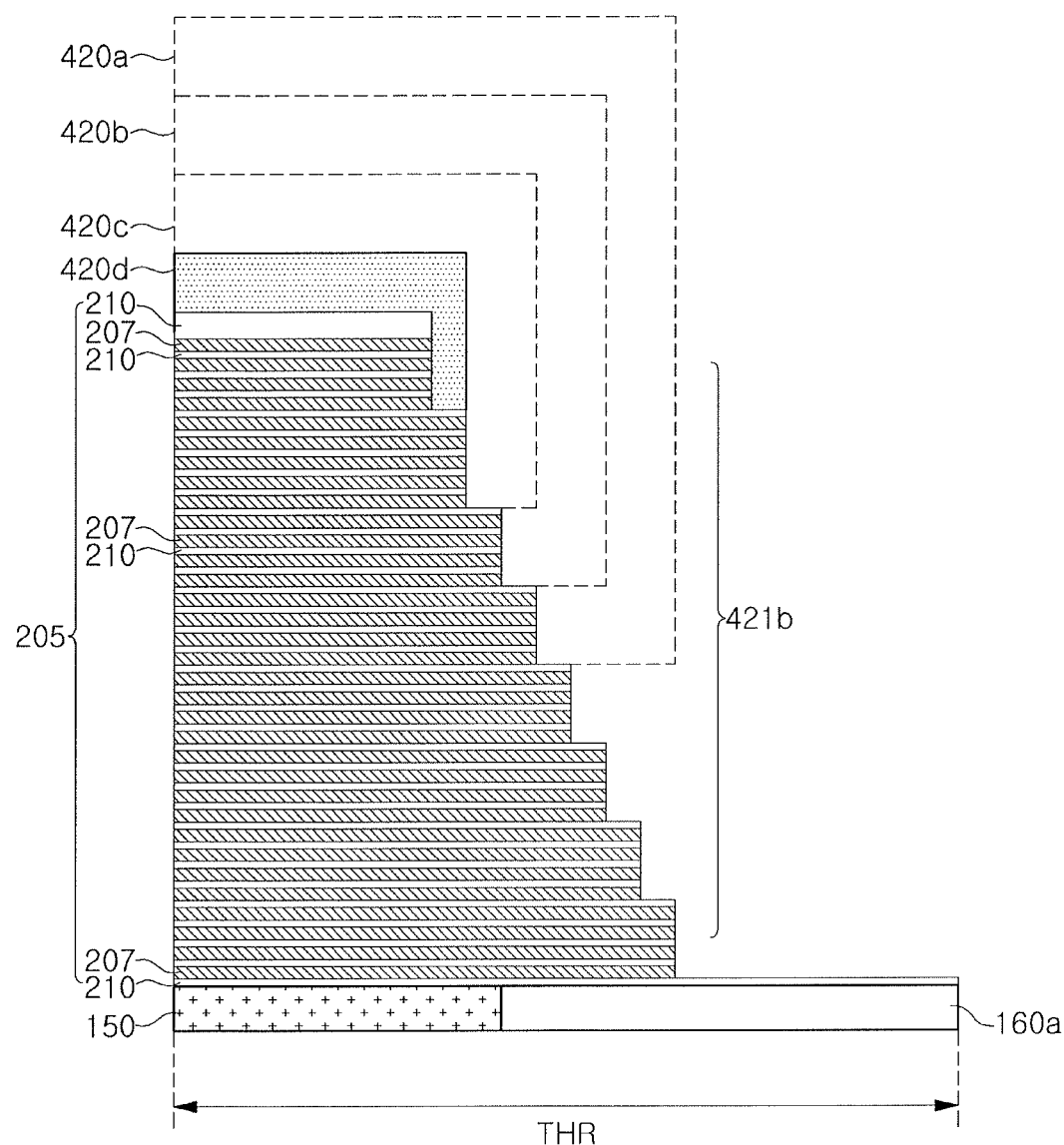

Referring to FIGS. 26A and 26B, portions of the mold structure 205 may be etched in stages, while a size of the first photoresist pattern 415a is reduced in stages, to form first pad step portions 416a and first through step portions 417a. The first photoresist pattern 415a, a first photoresist pattern 415b, a first photoresist pattern 415c, and a first photoresist pattern 415d may have sizes reduced in stages, and the sizes may be reduced according to a width of a step to be formed. The first photoresist patterns 415a to 415d, having the sizes reduced in stages, may be removed after the first pad step portions 416a and the first through step portions 417a are formed.

Referring to FIGS. 27A through 30B, a second photoresist pattern 420a may be formed on the mold structure 205 having the first pad step portions 416a and the first through step portions 417a formed therein, and a step formation process may be performed using substantially the same method as described above with reference to FIGS. 25A through 26B.

Similar to the first photoresist patterns 415a to 415d, having the sizes reduced in stages, described above in FIGS. 25A through 26B, the second photoresist pattern 420a, a second photoresist pattern 420b, a second photoresist pattern 420c, and a second photoresist pattern 420d, having sizes reduced in stages, may be formed sequentially, as illustrated in FIGS. 27A through 30B. An etching process, using the second photoresist patterns 420a to 420d as etching masks, respectively, may be performed to etch a portion of the mold structure 205 in stages.

The second photoresist patterns 420a to 420d, having the sizes reduced in stages, may be formed to overlap the first pad step portions 416a, and may be formed to overlap a portion of the first through step portions 417a. Thus, second pad step portions 416b, not overlapping the first pad step portions 416a, may be formed by the second photoresist patterns 420a to 420d having the sizes reduced in stages, to form pad step portions 425a having the first and second pad step portions 416a and 416b. Further, through step portions 421b may be formed to have a narrower horizontal width than the first through step portions 417a by the second photoresist patterns 420a to 420d having the sizes reduced in stages.

Figure 31A:
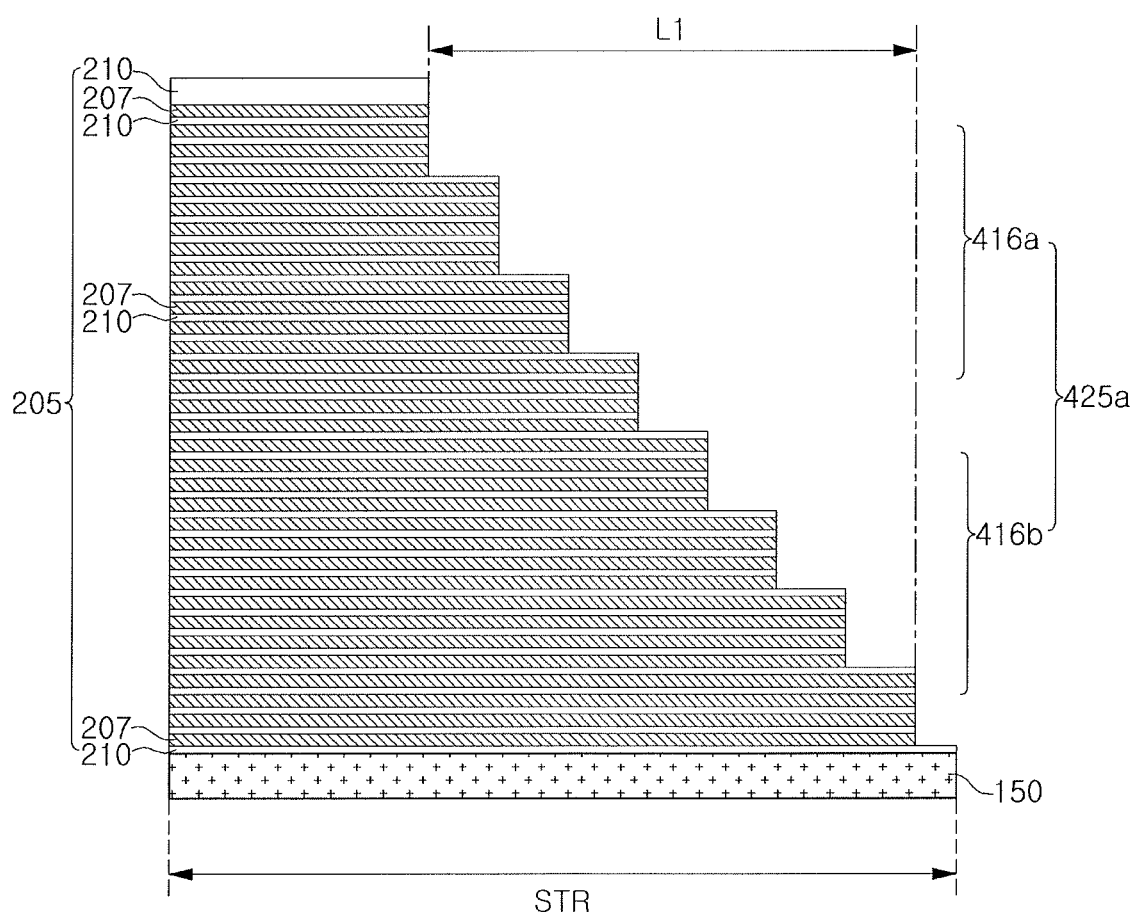
Figure 31B:
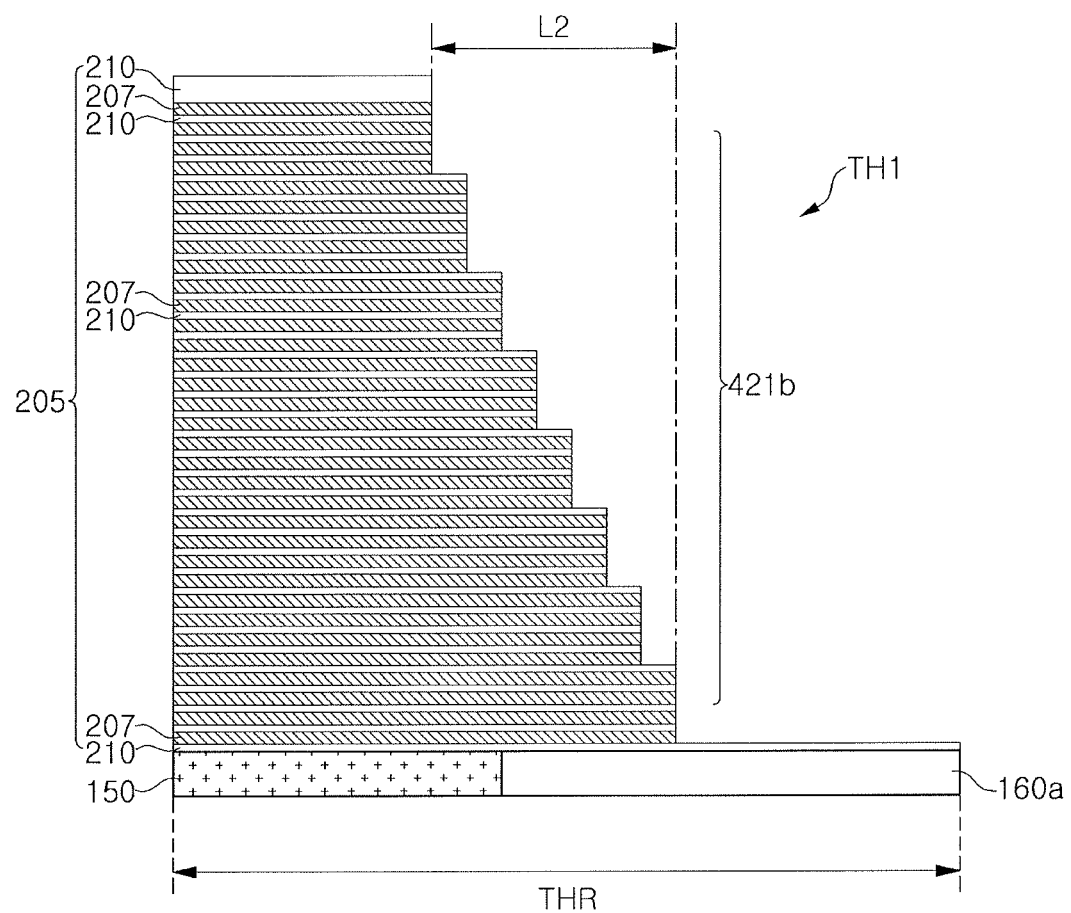

Further, referring to FIGS. 31A and 31B, a horizontal length L2 between an uppermost step and a lowermost step of the through step portions 421b may be shorter than a horizontal length L1 between an uppermost step and a lowermost step of the pad step portions 425a. It is further noted that while FIG. 31B indicates the first pad through region TH1 as formed to overlap the first gap-fill layer 160a, either one of the through regions TH1 or TH3 may be formed in a same method.

The three-dimensional semiconductor device, according to an example embodiment, may include the memory cell array region 20, the extension region 22 disposed on one or both sides of the memory cell array region 20, the main separation structures MS traversing the memory cell array region 20 and the extension regions 22, and defining the memory blocks BLK, the gate-stacked structure 270 or 370 disposed within the memory blocks BLK, and extending into the extension regions 22, the vertical channel structures VS disposed between the main separation structures MS, and passing through the gate-stacked structure 270 within the memory cell array region 20, and the at least one through region TH1 or TH3 disposed within the memory cell array region 20 or the extension regions 22, and passing through the gate-stacked structure 270. The at least one through region TH1 or TH3 may have sides including at least one step portion.

Here, the at least one step portion of the sides of the at least one through region TH1 or TH3 may also be referred to as a stepped portion. The at least one through region TH1 or TH3 may have a lower region, and an upper pad region on the lower region. Here, the upper region of the at least one through region TH1 or TH3 may have a width wider than the lower region.

In example embodiments, the at least one through region TH1 or TH3 may be formed by a process of forming the pad regions P of the gate-stacked structure 270. Thus, an additional process for forming the at least one through region TH1 or TH3 may be removed to reduce production costs, thereby increasing the productivity of the semiconductor device. Further, since a width of the at least one through region TH1 or TH3 may increase in stages in the direction perpendicular to and away from the upper substrate 150, the at least one through region TH1 or TH3 may be formed of an insulating material having no defects, such as a void.

By way of summation and review, an aspect of embodiments provides a three-dimensional semiconductor device having a high degree of integration, and a method of forming the same. That is, according to example embodiments, a three-dimensional semiconductor device may include a peripheral circuit below a gate-stacked structure. Thus, a degree of integration of semiconductor devices may be increased. Further, a through region, passing through the gate-stacked structure electrically connecting gate electrodes of the gate-stacked structure to the peripheral circuit, may be provided. Thus, even when the number of the stacked gate electrodes increases, the degree of integration of semiconductor devices may be increased. Moreover, the through region may be formed such that a width of an upper region thereof may be greater than that of a lower region thereof. Thus, void defects or the like, e.g., potentially occurring during formation of the through region, may be prevented or substantially minimized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensional semiconductor device, comprising:
   a lower substrate;
   a lower structure on the lower substrate, the lower structure including a peripheral circuit;
   an upper substrate on the lower structure;
   a gap-fill layer penetrating through the upper substrate;
   a stack structure on the upper substrate, the stack structure including interlayer insulating layers and gate layers alternately stacked in a vertical direction, the vertical direction being perpendicular to an upper surface of the upper substrate;
   a through region passing through the stack structure, at least a portion of the through region vertically overlapping the gap-fill layer;
   a vertical channel structure penetrating through the stack structure;
   a peripheral contact plug penetrating through the through region; and
   a separation structure penetrating through the stack structure,
   wherein, in a plan view, the stack structure surrounds an entire side surface of the through region,
   wherein the separation structure includes a first line portion and a second line portion,
   wherein the separation structure further includes a third line portion and a fourth line portion between the first line portion and the second line portion, and
   wherein the fourth line portion is between the through region and the third line portion, the fourth line portion being spaced apart from the third line portion.

2. The three-dimensional semiconductor device as claimed in claim 1, wherein a side of the through region includes a stepped portion.

3. The three-dimensional semiconductor device as claimed in claim 1, wherein the through region includes a lower region and an upper region on the lower region, the upper region having a width wider than the lower region.

4. The three-dimensional semiconductor device as claimed in claim 1, wherein:

the separation structure further includes a fifth line portion and a sixth line portion between the first line portion and the second line portion, and the fifth line portion is between the through region and the sixth line portion, the fifth line portion being spaced apart from the sixth line portion.

5. The three-dimensional semiconductor device as claimed in claim 4, wherein each of the first through sixth line portions extends in a first direction, the first direction being parallel to the upper surface of the upper substrate.

6. The three-dimensional semiconductor device as claimed in claim 5, wherein the third line portion, the fourth line portion, the fifth line portion, and the sixth line portion are sequentially arranged in the first direction.

7. The three-dimensional semiconductor device as claimed in claim 4, wherein the separation structure further includes a seventh line portion between the third line portion and the second line portion, and an eighth line portion between the through region and the second line portion.

8. The three-dimensional semiconductor device as claimed in claim 7, wherein the seventh line portion is spaced apart from the eighth line portion.

9. A three-dimensional semiconductor device, comprising:
a peripheral circuit region;
a stack structure on the peripheral circuit region, the stack structure including gate electrodes stacked within a memory cell array region, while being spaced apart from each other in a vertical direction, and extending into an extension region adjacent to the memory cell array region to be arranged within the extension region to have a staircase shape;
a first insulating region and a second insulating region in the extension region, the first insulating region and the second insulating region penetrating through the stack structure, and being spaced apart from each other in a first direction; and
a vertical channel structure penetrating through the stack structure within the memory cell array region;
peripheral contact plugs penetrating through the first insulating region and the second insulating region; and
a separation structure penetrating through the stack structure,
wherein, in a plan view, the stack structure surrounds an entire side surface of the first insulating region,
wherein the separation structure includes a first line portion and a second line portion,
wherein the separation structure further includes a third line portion, a fourth line portion, a fifth line portion, and a sixth line portion between the first line portion and the second line portion, and
wherein the fifth line portion and the sixth line portion are between the first insulating region and the second insulating region, the fifth line portion and the sixth line portion being spaced apart from each other in the first direction.

10. The three-dimensional semiconductor device as claimed in claim 9, wherein a side of the first insulating region includes a stepped portion.

11. The three-dimensional semiconductor device as claimed in claim 9, wherein the fourth line portion is between the first insulating region and the third line portion, the fourth line portion being spaced apart from the third line portion.

12. The three-dimensional semiconductor device as claimed in claim 11, wherein the third line portion, the fourth line portion, the fifth line portion, and the sixth line portion are sequentially arranged in the first direction.

13. The three-dimensional semiconductor device as claimed in claim 9, wherein the separation structure further includes a seventh line portion between the third line portion and the second line portion, and an eighth line portion between the first insulating region and the second line portion.

14. The three-dimensional semiconductor device as claimed in claim 13, wherein the seventh line portion is spaced apart from the eighth line portion.

15. A three-dimensional semiconductor device, comprising:
an upper substrate;
a gate-stacked structure on the upper substrate, the gate-stacked structure including gate electrodes stacked within a memory cell array region, while being spaced apart from each other in a direction perpendicular to a surface of the upper substrate, and extending into an extension region adjacent to the memory cell array region to be arranged within the extension region to have a staircase shape; and
at least one through region passing through the gate-stacked structure within the memory cell array region or the extension region, the at least one through region including a lower region and an upper region wider than the lower region, and an entire perimeter of each of the lower region and the upper region of the at least one through region being surrounded by the gate-stacked structure, as viewed in a top view.

16. The three-dimensional semiconductor device as claimed in claim 15, further comprising:
a lower substrate below the upper substrate;
a lower structure between the lower substrate and the upper substrate, the lower structure including a peripheral circuit; and
a gap-fill layer within a substrate hole passing through the upper substrate, the at least one through region overlapping the gap-fill layer.

17. The three-dimensional semiconductor device as claimed in claim 15, wherein the at least one through region has a side having a staircase shape, and a width of the at least one through region widens toward an upper portion of the upper substrate in stages, according to the staircase shape of the side.

18. The three-dimensional semiconductor device as claimed in claim 15, wherein:
the extension region includes a first step region, a second step region, and a buffer region between the first step region and the second step region, and
the at least one through region includes a first pad through region passing through the gate-stacked structure of the buffer region.

19. The three-dimensional semiconductor device as claimed in claim 15, further comprising:
main separation structures traversing the memory cell array region and the extension region, and defining respective memory blocks;
vertical channel structures between the main separation structures, within the memory cell array region, and passing through the gate-stacked structure, the at least one through region being in a region between the vertical channel structures and the staircase shape of the gate electrodes;
bit lines extending in a direction intersecting the main separation structures; and bit line contact plugs between the bit lines and the vertical channel structures, and electrically connecting the bit lines to the vertical channel structures.

20. The three-dimensional semiconductor device as claimed in claim 19, wherein the at least one through region further includes a memory through region between a pair of main separation structures adjacent to each other among the main separation structures within the memory cell array region.

\* \* \* \* \*